United States Patent
Narabu

(10) Patent No.: US 12,007,661 B2
(45) Date of Patent: Jun. 11, 2024

(54) DISPLAY APPARATUS

(71) Applicant: SONY SEMICONDUCTOR SOLUTIONS CORPORATION, Kanagawa (JP)

(72) Inventor: Tadakuni Narabu, Kanagawa (JP)

(73) Assignee: SONY SEMICONDUCTOR SOLUTIONS CORPORATION, Tokyo (JP)

( * ) Notice: Subject to any disclaimer, the term of this patent is extended or adjusted under 35 U.S.C. 154(b) by 0 days.

(21) Appl. No.: 18/000,922

(22) PCT Filed: Jun. 7, 2021

(86) PCT No.: PCT/JP2021/021535
§ 371 (c)(1),
(2) Date: Dec. 6, 2022

(87) PCT Pub. No.: WO2021/256313
PCT Pub. Date: Dec. 23, 2021

(65) Prior Publication Data
US 2023/0221614 A1 Jul. 13, 2023

(30) Foreign Application Priority Data
Jun. 15, 2020 (JP) .................. 2020-102751

(51) Int. Cl.
*G02F 1/29* (2006.01)
*H10K 59/80* (2023.01)

(52) U.S. Cl.
CPC ............ *G02F 1/29* (2013.01); *H10K 59/879* (2023.02); *G02F 2201/44* (2013.01); *G02F 2203/24* (2013.01)

(58) Field of Classification Search
CPC ...... G02F 1/29; G02F 2203/24; H10K 59/879
See application file for complete search history.

(56) References Cited

U.S. PATENT DOCUMENTS

| 2014/0043320 A1 | 2/2014 | Tosaya et al. |
| 2014/0055755 A1 | 2/2014 | Fan |

(Continued)

FOREIGN PATENT DOCUMENTS

| JP | 2002-350973 A | 12/2002 |
| JP | 2016-145956 A | 8/2016 |

OTHER PUBLICATIONS

International Search Report and Written Opinion of PCT Application No. PCT/JP2021/021535, dated Aug. 24, 2021, 09 pages of ISRWO.

*Primary Examiner* — James A Dudek
(74) *Attorney, Agent, or Firm* — CHIP LAW GROUP

(57) ABSTRACT

[Object] To provide a display apparatus that displays a projection image with an improved resolution.
[Solving Means] A display apparatus (10) includes a light-emitting device (13), a micro-lens array (5), and a scanning mechanism (54). The light-emitting device (13) includes a plurality of first light-emitting pixels and a plurality of second light-emitting pixels. The micro-lens array (5) includes a plurality of lenses (53) that projects the diffuse light rays emitted respectively from the first light-emitting pixel and the second light-emitting pixel, which have been made incident, to a first reaching position and a second reaching position located at desired different positions of a projection target object (3), respectively, the plurality of lenses being arranged at a pitch larger than a pixel pitch of the light-emitting pixels. The scanning mechanism (54) projects the diffuse light ray emitted from the first light-emitting pixel to the first reaching position via the micro-lens array (5) and then projects the diffuse light ray emitted from the second light-emitting pixel to the second reaching position via the micro-lens array (5).

10 Claims, 33 Drawing Sheets

(56) References Cited

U.S. PATENT DOCUMENTS

2017/0269353 A1 9/2017 Xu
2022/0198766 A1* 6/2022 Mihali ................. G06T 19/006

* cited by examiner

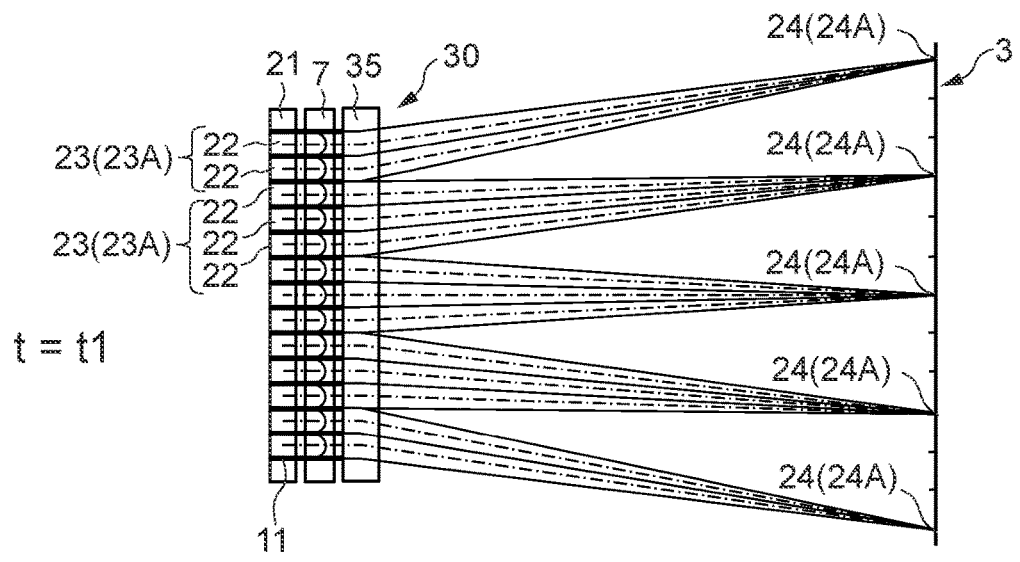
FIG. 11A t = t1
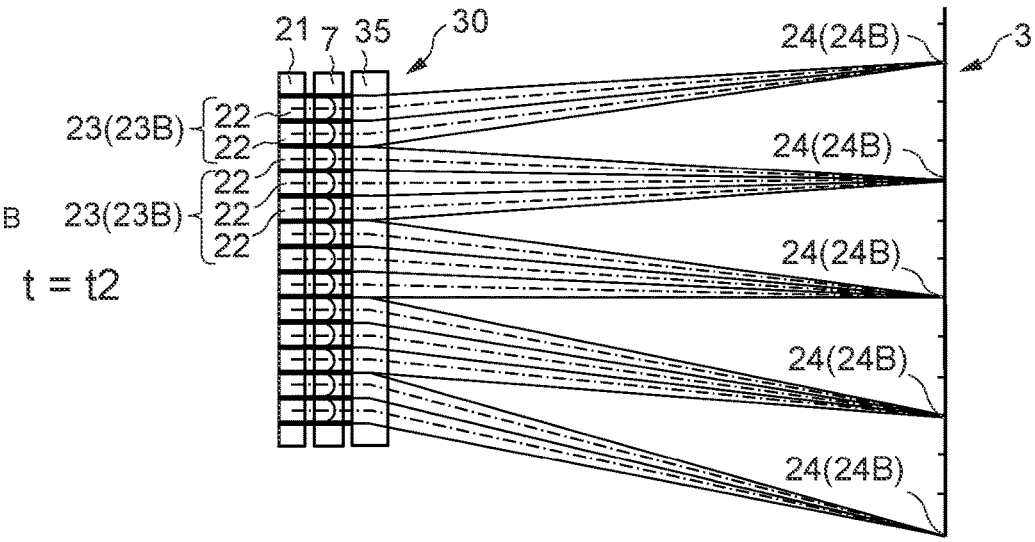
FIG. 11B t = t2
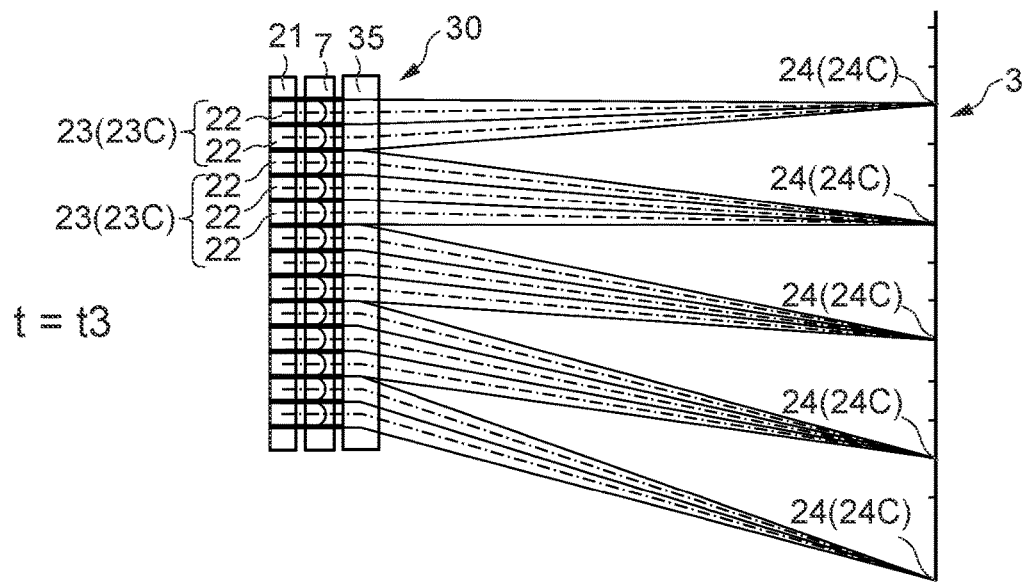
FIG. 11C t = t3

DISPLAY APPARATUS

CROSS REFERENCE TO RELATED APPLICATIONS

This application is a U.S. National Phase of International Patent Application No. PCT/JP2021/021535 filed on Jun. 7, 2021, which claims priority benefit of Japanese Patent Application No. JP 2020-102751 filed in the Japan Patent Office on Jun. 15, 2020. Each of the above-referenced applications is hereby incorporated herein by reference in its entirety.

TECHNICAL FIELD

The present technology relates to a display apparatus that displays a projection image on a projection target object.

BACKGROUND ART

A liquid-crystal projector, a digital light processing (DLP) projector, a liquid crystal on silicon (LCOS) projector, and the like are known as a projector that is a type of display apparatus that projects an image onto a projection target object such as a screen. A light source and an image output device for such a projector are separately provided, and such a projector has a large number of components and a large casing.

Moreover, a retinal direct-drawing eyewear that draws an image onto a retina of an eye that is a projection target object is known. In the retinal direct-drawing eyewear, an image is drawn onto the retina, combining light rays from a light source and a MEMS mirror. For such an eyewear, an optical system having a smaller area than a lens area has to be placed in a lens portion of an eyeglass. Since a drawing area is limited to such a small area, a viewing angle of drawing is small. Moreover, it is difficult to provide a high-quality image with a high resolution, a wide viewing angle, a high dynamic range, a wide color gamut, and a sense of depth, for example.

Moreover, a head-mounted display apparatus that displays an image based on a hologram on a transparent lens portion is known. Such a display apparatus is constituted by a micro LCOS display, a mirror, a prism, an optical waveguide substrate, a holographic optical element. The display of such a display apparatus is distant from eye positions, and the display apparatus has a small viewing angle of drawing and also has a low resolution. Moreover, it is difficult to provide a high-quality image with a high resolution, a wide viewing angle, a high dynamic range, a wide color gamut, and a sense of depth, for example.

Patent Literature 1 has described a display apparatus that makes information of light rays emitted from a display device incident on a retina directly.

CITATION LIST

Patent Literature

Patent Literature 1: U.S. Patent Application Laid-open No. 2014/0043320

DISCLOSURE OF INVENTION

Technical Problem

In a display apparatus that projects light rays from a light-emitting device including a plurality of light-emitting pixels onto a projection target object, when attempting to display an image by projecting information of a light-emitting pixel onto a projection target object such as a screen or retina directly as it is, there is a problem in that light rays expanded due to an influence of diffraction are projected onto the projection target object, which prevents an increase in image resolution.

In view of the above-mentioned circumstances, it is an object of the present technology to provide a display apparatus that displays a projection image with an improved resolution.

Solution to Problem

In order to accomplish the above-mentioned object, a display apparatus according to an embodiment of the present technology includes a light-emitting device, a micro-lens array, and a scanning mechanism.

The light-emitting device includes a plurality of first light-emitting pixels and a plurality of second light-emitting pixels.

The micro-lens array includes a plurality of lenses that projects the diffuse light rays emitted respectively from the first light-emitting pixel and the second light-emitting pixel, which have been made incident, to a first reaching position and a second reaching position located at desired different positions of a projection target object, respectively, the plurality of lenses being arranged at a pitch larger than a pixel pitch of the light-emitting pixels.

The scanning mechanism projects the diffuse light ray emitted from the first light-emitting pixel to the first reaching position via the micro-lens array and then projects the diffuse light ray emitted from the second light-emitting pixel to the second reaching position via the micro-lens array.

With such a configuration, by using the micro-lens array including the plurality of lenses arranged at the pitch larger than the pixel pitch of the light-emitting pixels, the focusing degree of light rays is increased, light rays can be projected onto the reaching positions on the projection target object, and the resolution is improved.

In addition, the use of the scanning mechanism improves the resolution of the entire image projected onto the projection target object.

In order to accomplish the above-mentioned object, a display apparatus according to an embodiment of the present technology includes a light-emitting device, a micro-lens array, and a scanning mechanism.

The light-emitting device includes a plurality of light-emitting pixels.

The micro-lens array includes a plurality of lenses that projects light rays respectively emitted from a first light-emitting pixel group and a second light-emitting pixel group constituted by a plurality of light-emitting pixels selected from the plurality of light-emitting pixels, which have been made incident, to a first reaching position and a second reaching position located at desired different positions of a projection target object, respectively, the plurality of lenses being arranged at a pitch larger than a pixel pitch of the light-emitting pixels.

The scanning mechanism projects light rays emitted from a plurality of light-emitting pixels that emits light rays of information identical to each other, which constitute the first light-emitting pixel group, to the first reaching position via the micro-lens array and projecting light rays emitted from a plurality of light-emitting pixels that emits light rays of information identical to each other, which constitute the second light-emitting pixel group, to the second reaching position via the micro-lens array.

With such a configuration, since light rays from the light-emitting pixel groups constituted by the plurality of light-emitting pixels that emits light rays of the identical information are projected onto the reaching positions on the projection target object, the resolution is improved.

In addition, the use of the scanning mechanism improves the resolution of the entire image projected onto the projection target object.

The plurality of light-emitting pixels that constitutes the first light-emitting pixel group and the plurality of light-emitting pixels that constitutes the second light-emitting pixel group may be partially different.

The micro-lens array may be a micro-lens array configured with a plurality of convex or concave lenses arrayed or a liquid-crystal micro-lens array constituted by a plurality of liquid-crystal lenses.

The micro-lens array may be the liquid-crystal micro-lens array, and the liquid-crystal micro-lens array may serve as the scanning mechanism.

The projection target object may be a screen.

The projection target object may be a retina of an eye.

The light-emitting device may emit light rays so that information of light rays to be projected is different at a region of a fovea centralis of the retina and a peripheral portion of the fovea centralis.

BRIEF DESCRIPTION OF DRAWINGS

FIGS. 11A, 11B, and 11C A configuration diagram of a display apparatus (projector) according to a third embodiment.

MODE(S) FOR CARRYING OUT THE INVENTION

Hereinafter, the present technology will be described with reference to the drawings.

The present technology can be applied to a projector that is a display apparatus that projects an image onto a screen that is a projection target object, an eyewear or head-mounted display that is a display apparatus that projects an image onto a retina that is a projection target object, and the like. Hereinafter, examples in which the present technology is applied to a projector will be described in first to fifth embodiments and examples in which the present technology is applied to an eyewear will be described in sixth to seventeenth embodiments.

Hereinafter, similar configurations will be denoted by similar reference signs and the descriptions will be omitted in some cases.

<Application Example to Projector>

First Embodiment

Figure 1:
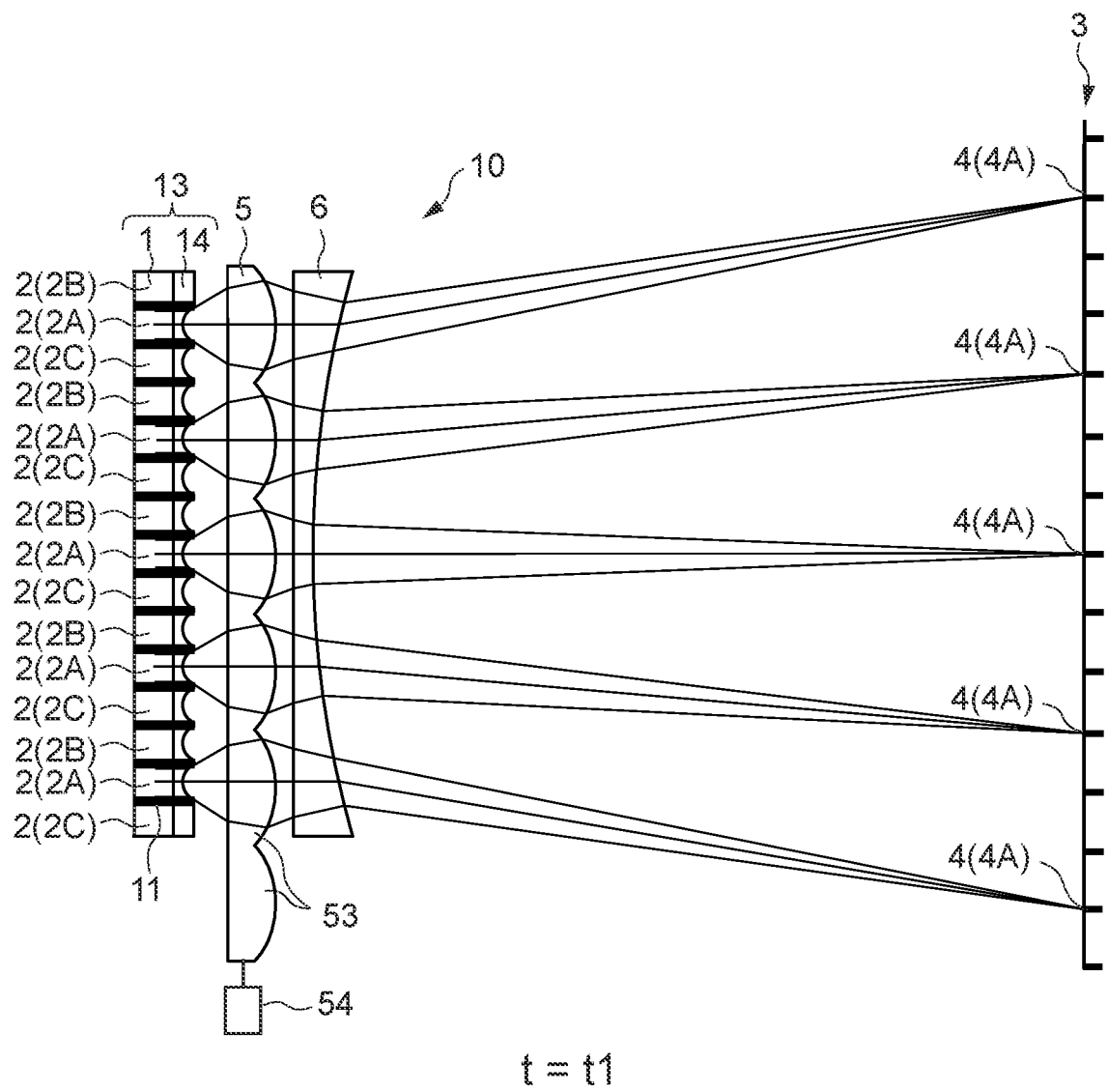
FIG. 1 A configuration diagram of a display apparatus (projector) according to a first embodiment.

FIG. 1 is a schematic configuration diagram of a display apparatus (projector) 10 according to a first embodiment.

As shown in FIG. 1, the display apparatus 10 includes a light-emitting device 13 with a diffuse optical system, a micro-lens array 5, a concave lens 6, and an actuator 54 that is a scanning mechanism. The light-emitting device 13 with the diffuse optical system is constituted by a light-emitting device 1 and a diffuse optical system 14. Light rays emitted from the display apparatus 10 are projected onto a screen 3 that is a projection target object and an image is drawn on the screen 3.

The light-emitting device 1 includes a plurality of light-emitting pixels 2. A light-emitting device including organic light-emitting diodes, inorganic light-emitting diodes, lasers, or the like, for example, as the light-emitting pixels 2, or a liquid-crystal panel including a backlight light source can be used as the light-emitting device 1. In the present embodiment, light-emitting devices including organic light-emitting diodes as the light-emitting pixel will be described as an example, and the same applies to the other embodiments below.

The light-emitting device 1 configured with the light-emitting pixels 2 arrayed two-dimensionally. A pixel pitch of the light-emitting pixels 2, i.e., a center-to-center distance between the adjacent light-emitting pixels 2 is for example 60 μm.

The light-emitting device 13 with the diffuse optical system includes shielding walls 11 provided so as to divide the respective light-emitting pixels 2. The shielding walls 11 configure waveguides that guide light rays from the respective light-emitting pixels 2. The shielding walls 11 prevent the spread of light rays from the light-emitting pixels 2. By using the shielding walls 11 and the optical system such as the micro-lens array 5 and the concave lens 6 in the display apparatus 10, light rays from the light-emitting pixels 2 are made to reach desired reaching positions on the screen 3, each having a desired projection area, with their directions determined. The shielding walls 11 may be provided only in the light-emitting device or may be provided also in an optical system different from the light-emitting device, such as the diffuse optical system, the micro-lens array, and the concave lens, and various modifications can be made. Hereinafter, in the description of the application example of the projector, the shielding walls will be referred to as the shielding walls 11 irrespective of where they are provided.

The shielding walls 11 can employ any one of a reflection structure, a light-shielding structure, and a light-absorbing structure.

Diffuse light rays emitted from the light-emitting device 13 with the diffuse optical system are made incident on the micro-lens array 5. The micro-lens array 5 emits the incident light rays toward the screen 3. More specifically, the light rays emitted from the micro-lens array 5 are projected onto the screen 3 through the concave lens 6. A two-dimensional image can be displayed on the screen 3.

The micro-lens array 5 is configured with the plurality of micro convex lenses 53 arrayed two-dimensionally. It should be noted that other than the configuration in which the plurality of convex lenses are arrayed two-dimensionally as in the present embodiment, the micro-lens array in the present technology includes an optical system having functions equivalent thereto. For example, the micro-lens array in the present technology includes the lenses that have functions equivalent to those of the configuration in which the plurality of convex lenses are arrayed two-dimensionally but are constituted by flat faces in terms of the shape, a liquid-crystal micro-lens array, a micro-lens array having a configuration in which a plurality of micro concave lenses is arrayed two-dimensionally, a micro-lens array constituted by liquid lenses, and the like. Micro-lens arrays in the other aspects will be described in other embodiments.

The plurality of micro convex lenses 53 that constitutes the micro-lens array 5 make incident diffuse light rays parallel or approximately parallel. Light rays emitted from the entire light-emitting device 1 are changed in direction by the concave lens 6 so as to spread and are projected onto the screen 3.

The micro-lens array 5 and the concave lens 6 are provided so that light rays from the respective light-emitting pixels 2 of the light-emitting device 1 are projected like spots when they reach the screen 3. Hereinafter, the light rays projected onto the screen 3 like spots will be referred to as spots in some cases.

In the present embodiment, a pitch of the adjacent micro convex lenses of the micro-lens array 5, i.e., a center-to-center distance between the adjacent convex lenses is set to be 3,400 μm, for example.

In the present embodiment, the resolution is increased by setting the pitch of the convex lenses in the micro-lens array 5 to be larger than the pitch of the light-emitting pixels 2 of the light-emitting device 1. Hereinafter, it will be described.

When a light ray is projected onto a screen located at a certain distance through a circular opening (hereinafter, referred to as pinhole), the light ray is projected in a region, which is larger than the pinhole diameter, on the screen due to the Fraunhofer diffraction. For example, in a case where the pinhole diameter is 60 μm, the diameter of the light ray projected onto the screen located at 1 m away is 2.24 cm. Since a dot pitch of a typical 21-inch television is 0.533 mm, it can be understood that a sufficient resolution cannot be provided with 2.24 cm.

On the contrary, in the present embodiment, by setting the pitch of the convex lenses 53 of the micro-lens array 5 to be larger than the pitch of the light-emitting pixels 2, a focal point is made smaller and the focusing degree is increased. Then, by setting the focal point to be on the screen, the focusing power of a spot of a light ray emitted from a single light-emitting pixel 2 on the screen 3 can be increased and the resolution can be increased. Hereinafter, the focal point may be referred to as a point image. As described above, in the present embodiment, light rays from the light-emitting pixels can be projected onto desired reaching positions on the screen in a state in which the focusing degree is increased.

In the present embodiment, the pixel pitch of the light-emitting pixels 2 is set to be 60 μm, the pitch of the convex lenses 53 of the micro-lens array 5 is set to be 3,400 μm, and the diameter of a spot emitted from a single light-emitting pixel 2 and projected onto the screen 3 at 1 m away is configured to be 400 μm.

As described above, the pitch of the convex lenses 53 of the micro-lens array 5 is set to be larger than the pixel pitch of the light-emitting pixels 2 of the light-emitting device 1. In a case where the distance between the light-emitting device 1 and the screen 3 is in a range of 1 m to 2 m, the pitch of the convex lenses 53 of the micro-lens array 5 is favorably more than 50 times and less than 120 times the pitch of the light-emitting pixels 2. By setting the pitch of the convex lenses 53 of the micro-lens array 5 to be larger than the pixel pitch of the light-emitting pixels 2 of the light-emitting device 1 in this manner, the focal point on the screen can be made sufficiently small and the focusing degree can be increased. Accordingly, the resolution can be improved. In a case where the pitch of the convex lenses 53 of the micro-lens array 5 is less than 50 times the pitch of the light-emitting pixels 2, the focal point on the screen cannot be made sufficiently small, and it is difficult to make the resolution sufficiently high. In a case where the pitch of the convex lenses 53 of the micro-lens array 5 is more than 120 times the pitch of the light-emitting pixels 2, the frequency of a scan is 400 kHz or more and technical problems in realizing it are bigger.

The actuator 54 is a scanning mechanism that mechanically scans the micro-lens array 5.

In the present embodiment, the micro-lens array 5 is mechanically scanned by the actuator 54, light rays are projected onto the screen 3, and an image is displayed on the screen 3. The scan will be described with reference to FIGS. 1 and 3.

Figure 2:
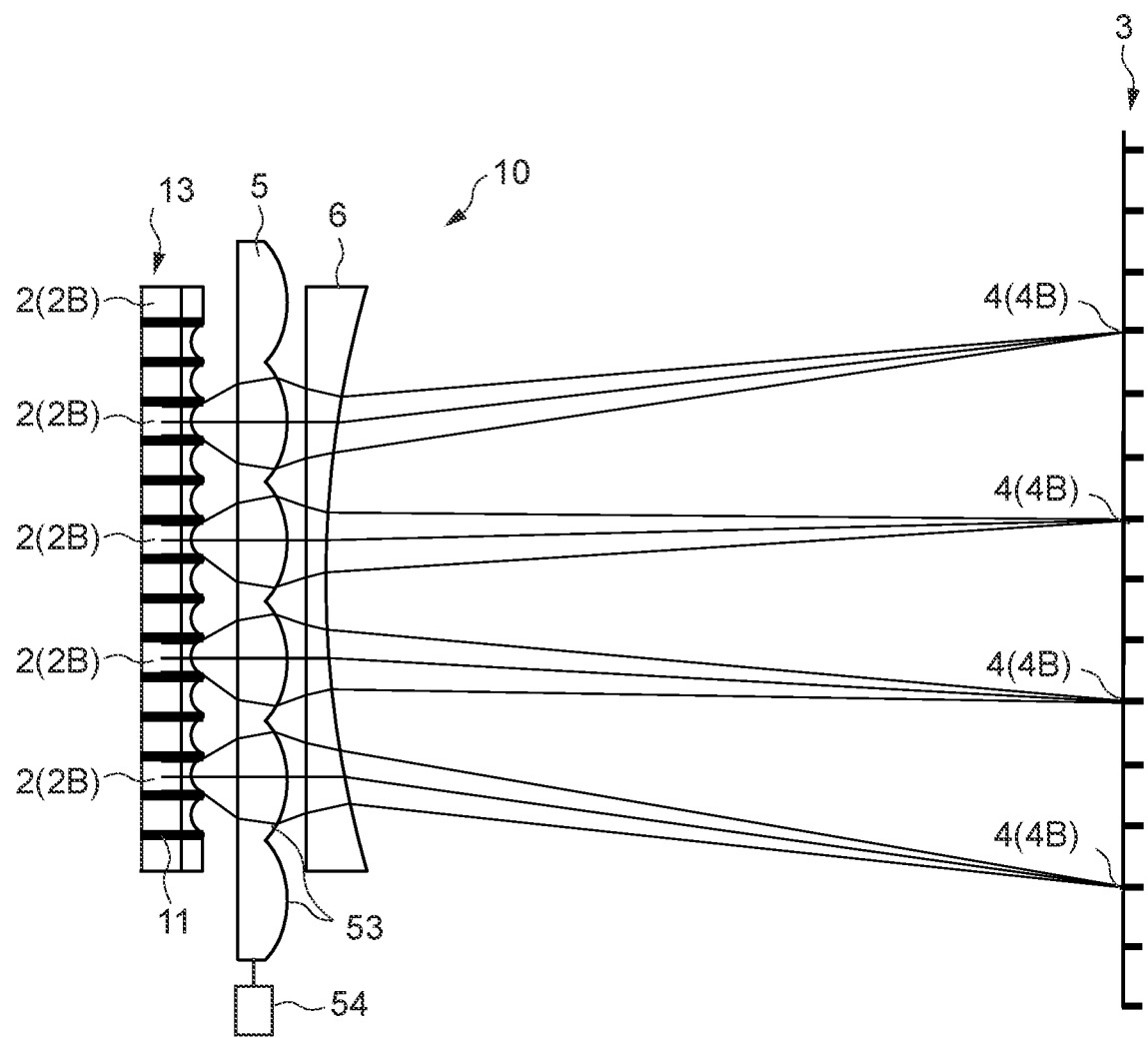
FIG. 2 A configuration diagram of the display apparatus (projector) according to the first embodiment.
Figure 3:
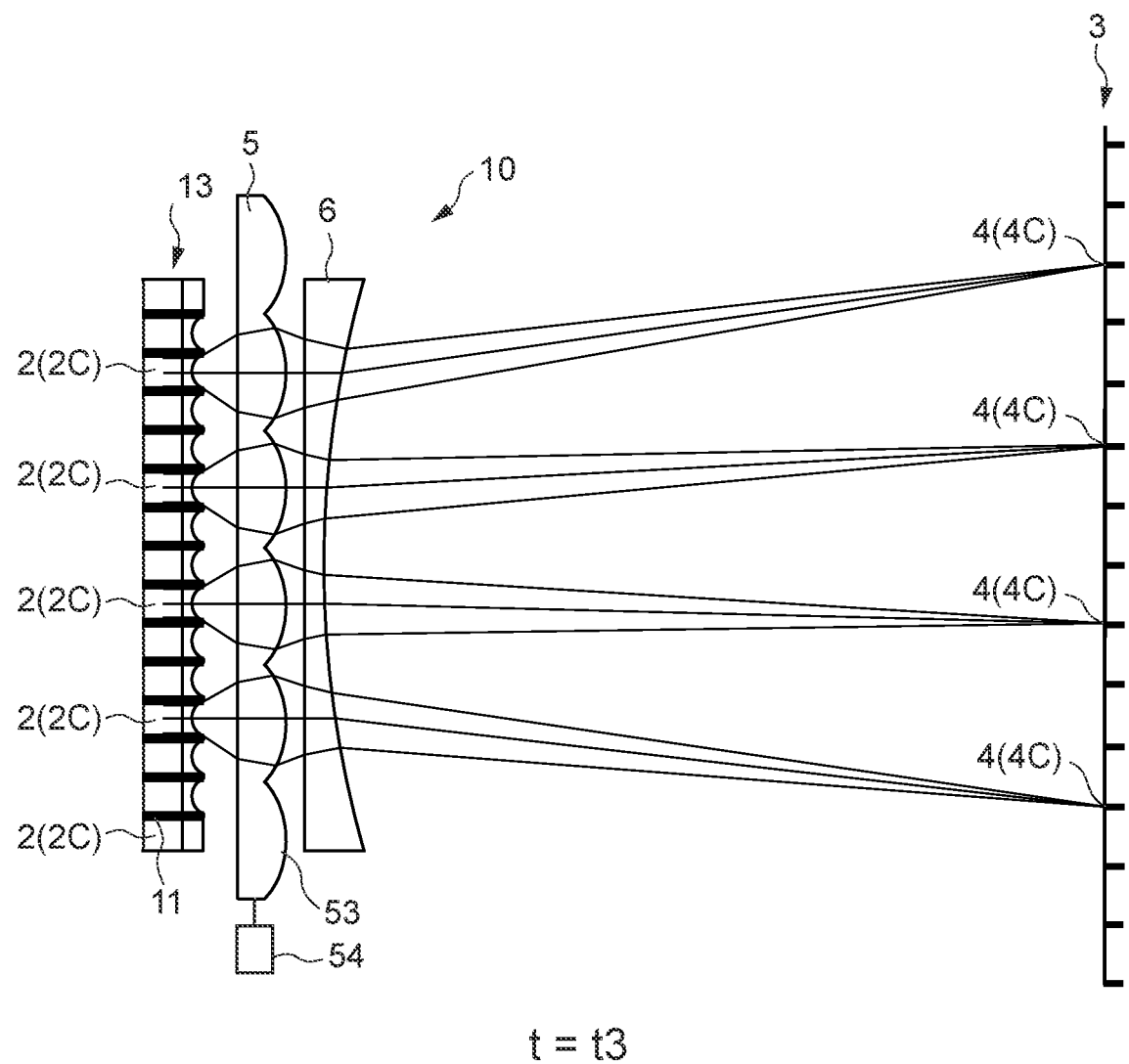
FIG. 3 A configuration diagram of the display apparatus (projector) according to the first embodiment.

FIGS. 1 and 3 are all configuration diagrams of the same display apparatus 10 and are diagrams for describing a scan. FIG. 1 shows a scan state at a time t1, FIG. 2 shows a scan state at a time t2, and FIG. 3 shows a scan state at a time t3. Assuming that the time elapses as t1, t2, and t3 in the stated order, the scan is performed in the order of FIG. 1, FIG. 2, and FIG. 3.

As shown in FIGS. 1 to 3, the light-emitting device 1 includes first light-emitting pixels 2A, second light-emitting pixels 2B, and third light-emitting pixels 2C. The first to third light-emitting pixels 2A to 2C are respectively positioned adjacent to each other. It should be noted that in a case where it is unnecessary to distinguish the light-emitting pixels 2A, 2B, and 2C, they will be referred to as light-emitting pixels 2. Moreover, hereinafter, desired light ray reaching positions on the screen 3 will be referred to as first reaching positions 4A, second reaching positions 4B, and third reaching positions 4C. The first to third reaching positions 4A to 4C are respectively at different positions and are positioned adjacent to each other. In a case where it is unnecessary to distinguish the first to third reaching positions 4A to 4C, they will be referred to as reaching positions 4.

As shown in FIG. 1, at the time t1, diffuse light rays emitted from the first light-emitting pixels 2A of the light-emitting device 1 are projected onto the first reaching positions 4A on the screen 3 via the diffuse optical system 14, the micro-lens array 5, and the concave lens 6.

Thereafter, as shown in FIG. 2, at the time t2, driving of the actuator 54 moves the micro-lens array 5 upward in the figure by an amount corresponding to the pixel pitch of the light-emitting pixels 2. In this state, diffuse light rays emitted from the second light-emitting pixels 2B of the light-emitting device 1 are projected onto the second reaching positions 4B on the screen 3 via the diffuse optical system 14, the micro-lens array 5, and the concave lens 6.

Thereafter, as shown in FIG. 3, at the time t3, driving of the actuator 54 moves the micro-lens array 5 upward in the figure by an amount corresponding to the pixel pitch of the light-emitting pixels 2. In this state, diffuse light rays emitted from the third light-emitting pixels 2C of the light-emitting device 1 are projected onto the third reaching positions 4C on the screen 3 via the diffuse optical system 14, the micro-lens array 5, and the concave lens 6.

In this manner, in the display apparatus 10, the micro-lens array 5 is mechanically scanned, the light-emitting pixels 2 that emit light rays in the light-emitting device 1 are shifted on a pixel-by-pixel basis, and the light rays are respectively projected onto the first to third reaching positions 4A to 4C located at different positions on the screen 3 in a time division manner. Accordingly, an image is displayed on the screen 3. When the scan is performed at a necessary frame rate, humans recognize a group of one-dimensional points projected and formed on the respective reaching positions as a two-dimensional image.

Accordingly, the resolution of the entire image projected onto the screen 3 can be increased.

As described above, the display apparatus 10 can display a high-resolution image on the screen 3.

Moreover, the display apparatus 10 has a small number of components and can be downsized.

It should be noted that in the present embodiment, the example in which the micro-lens array 5 is mechanically scanned has been described, but, for example, the light-emitting device 1 may be mechanically scanned, and it is sufficient to provide a configuration in which the reaching positions on the screen 3 can be changed by the scan. It should be noted that mechanically scanning the micro-lens array 5 while fixing the light-emitting device 1 improves the resolution more reliably. The same applies to embodiments of the display apparatus to be described below.

Second Embodiment

Figure 4:
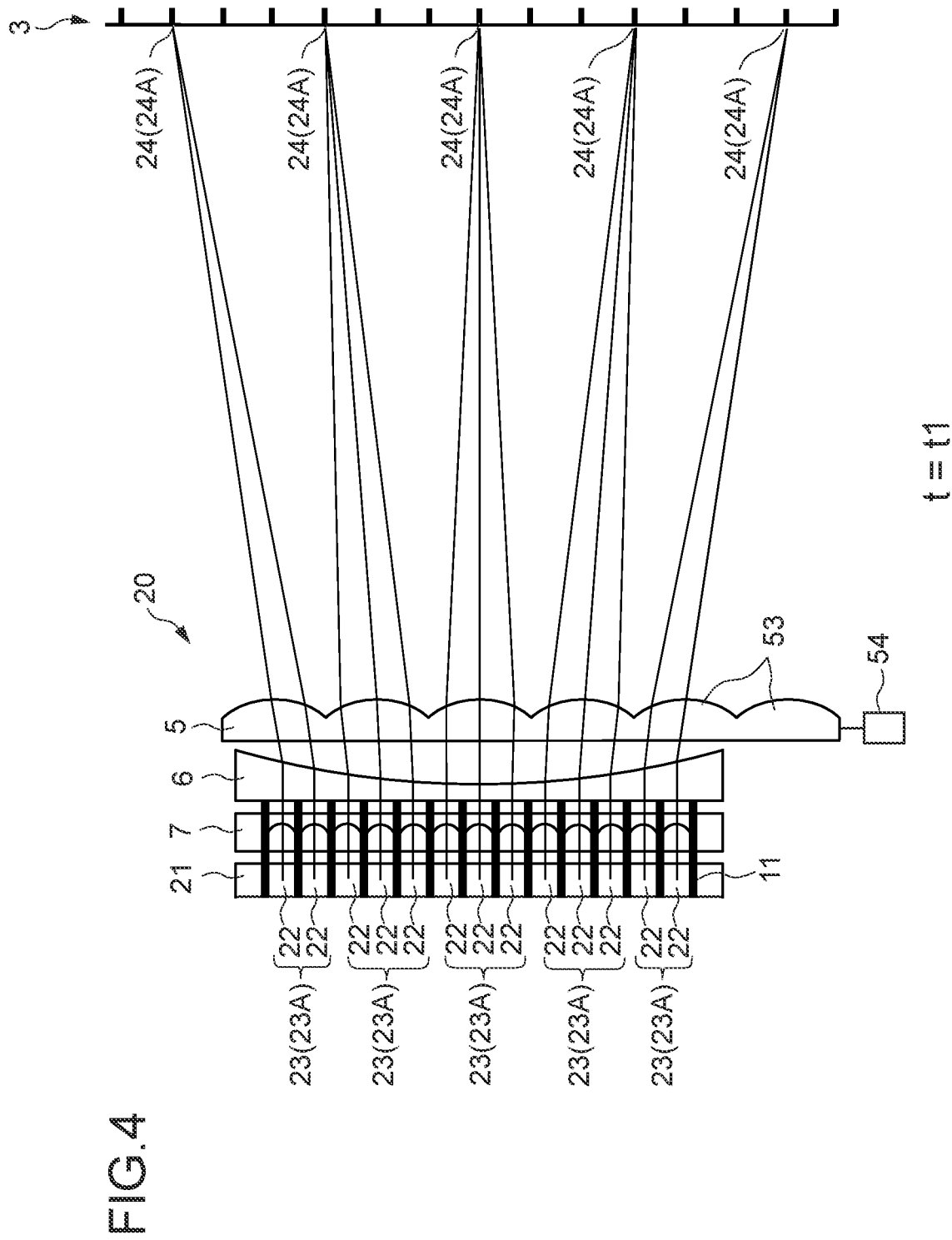
FIG. 4 A configuration diagram of a display apparatus (projector) according to a second embodiment.

FIG. 4 is a schematic configuration diagram of a display apparatus (projector) 20 according to a second embodiment.

As shown in FIG. 4, light rays emitted from the display apparatus 20 are projected onto the screen 3 and an image is displayed on the screen 3. The display apparatus 20 is configured so that a light-emitting device 21, a collimator lens 7, the concave lens 6, and the micro-lens array 5 are arranged in the stated order from a position further from the screen 3 to a position closer to the screen 3. In addition, the display apparatus 20 includes the actuator 54 that mechanically scans the micro-lens array 5.

The light-emitting device 21 includes a plurality of light-emitting pixels 22. The light-emitting device 21 is configured with the light-emitting pixels 22 arrayed two-dimensionally.

In the present embodiment, the pixel pitch of the light-emitting pixels 22 is set to be 60 μm and the pitch of the convex lenses 53 of the micro-lens array 5 is set to be 3,400 μm. Also in the present embodiment, the pitch of the convex lenses 53 of the micro-lens array 5 is set to be larger than the pixel pitch of the light-emitting pixels 22 of the light-emitting device 21. Accordingly, the focal point on the screen can be made sufficiently small, the focusing degree can be increased, and the resolution can be improved.

The collimator lens 7 makes light rays made incident from the light-emitting device 21 parallel or approximately parallel and emits them to the concave lens 6. The light rays made incident on the concave lens 6 are projected onto the screen 3 through the concave lens 6 and the micro-lens array 5.

In the present embodiment, the shielding walls 11 are provided in the light-emitting device 21 and the collimator lens 7.

Some, a plurality of light-emitting pixels 22 selected from the plurality of light-emitting pixels 22 of the light-emitting device 21 constitutes one light-emitting pixel group 23. The plurality of light-emitting pixels 22 belonging to the same light-emitting pixel group 23 simultaneously emits light rays of identical information. Light rays emitted from one light-emitting pixel group 23 are projected onto one reaching position 24 on the screen 3 like a spot. Thus, the spot projected onto the one reaching position 24 on the screen 3 is formed by the light rays from the plurality of light-emitting pixels 22. Accordingly, the focusing power of light rays on the screen 3 can be increased, and the resolution can be increased. Hereinafter, the information of the light rays emitted from the light-emitting pixels will be referred to as output information in some cases.

The number of light-emitting pixels that constitute one light-emitting pixel group 23 is for example 3,000 to 3,400. Here, a spot of light rays that are emitted from a light-emitting pixel group 23 constituted by 3,200 light-emitting pixels 22 and projected onto the screen 3 located away by 1 m is configured to be a projection area having a diameter of 400 μm.

In addition, in the present embodiment, the micro-lens array 5 is mechanically scanned by the actuator 54, light rays are projected onto the screen 3, and an image is displayed. Accordingly, the resolution of the entire image projected onto the screen 3 can be increased.

Figure 6:
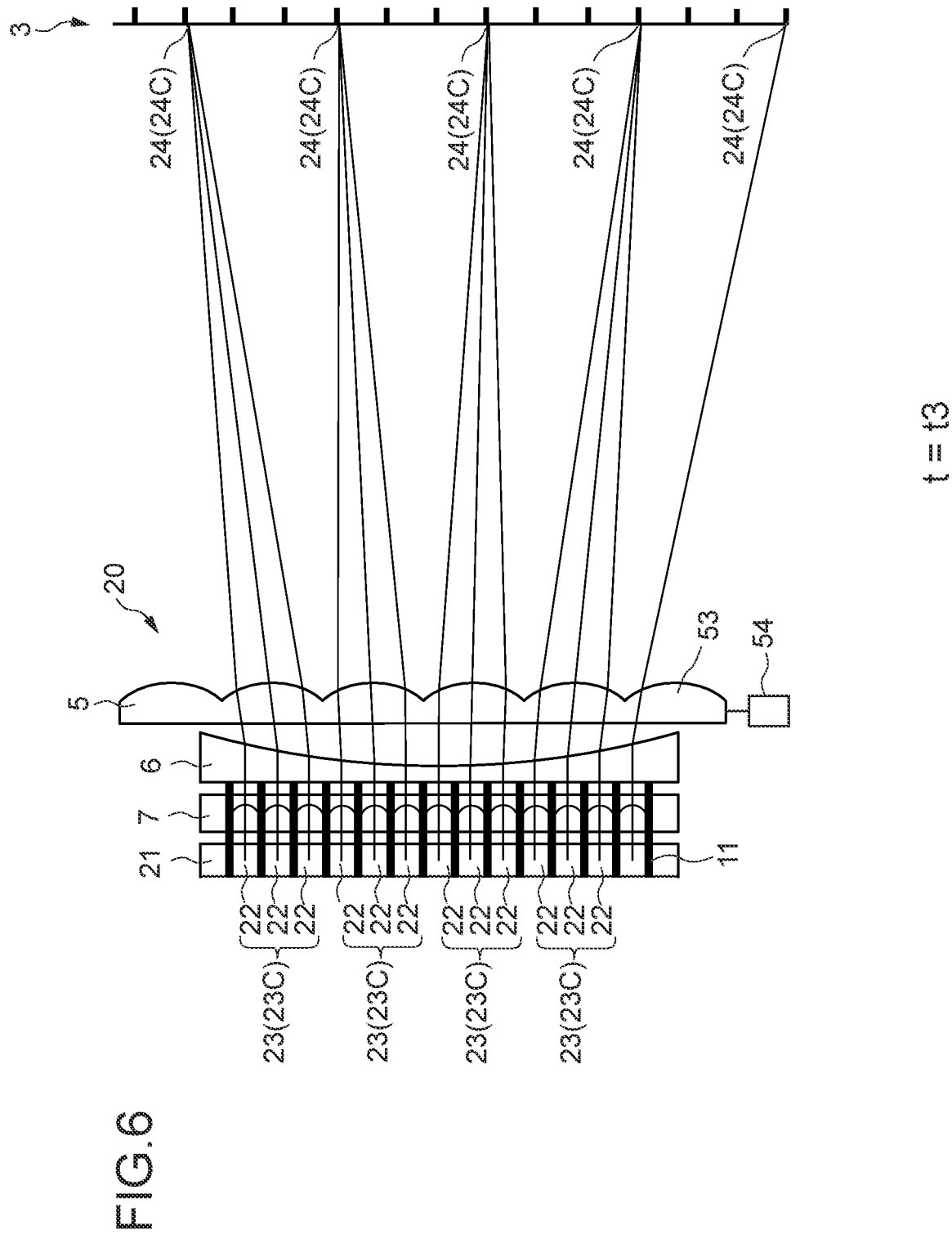
FIG. 6 A configuration diagram of the display apparatus (projector) according to the second embodiment.

FIGS. 4 and 6 are all configuration diagrams of the same display apparatus 20 and are diagrams for describing a scan.

In FIG. 4, a first light-emitting pixel group constituted by a plurality of light-emitting pixels 22 that outputs information identical to each other at the time t1 will be denoted by the reference sign 23A. In FIG. 4, a first reaching position on the screen 3 that light rays from the first light-emitting pixel group 23A reach at the time t1 will be denoted by the reference sign 24A.

Figure 5:
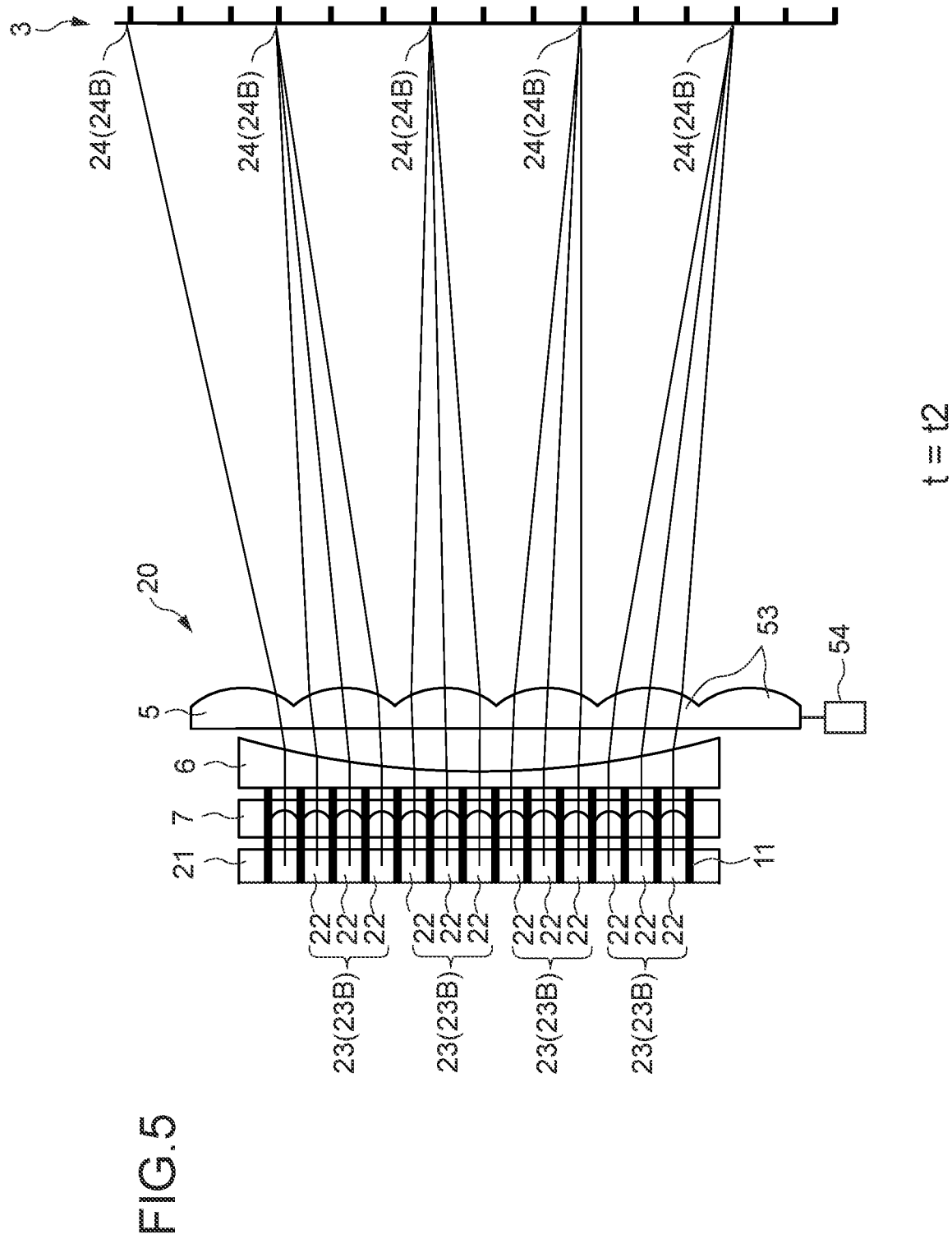
FIG. 5 A configuration diagram of the display apparatus (projector) according to the second embodiment.

In FIG. 5, a second light-emitting pixel group constituted by a plurality of light-emitting pixels 22 that outputs information identical to each other at the time t2 will be denoted by the reference sign 23B. In FIG. 5, a second reaching position on the screen 3 that light rays from the second light-emitting pixel group 23B reach at the time t2 will be denoted by the reference sign 24B.

In FIG. 6, a third light-emitting pixel group constituted by a plurality of light-emitting pixels 22 that outputs information identical to each other at the time t3 will be denoted by the reference sign 23C. In FIG. 6, a third reaching position on the screen 3 that light rays from the third light-emitting pixel group 23C reach at the time t3 will be denoted by the reference sign 24C.

Assuming that the time elapses as t1, t2, and t3 in the stated order, the scan is performed in the order of FIG. 4, FIG. 5, and FIG. 6. Unless it is particularly necessary to distinguish the first to third light-emitting pixel groups 23A to 23C, they will be referred to as light-emitting pixel groups 23. Unless it is particularly necessary to distinguish the first to third reaching positions 24A to 24C, they will be referred to as reaching positions 24. The size of a light ray emitted from one light-emitting pixel 22 is smaller than a size of a spot projected onto the reaching position 24 on the screen 3.

In FIG. 4, at the time t1, the plurality of light-emitting pixels 22 belonging to the same first light-emitting pixel group 23A simultaneously emits light rays of the identical information.

As shown in FIG. 4, at the time t1, the light rays emitted from the first light-emitting pixel group 23A are projected onto the first reaching position 24A on the screen 3 via the collimator lens 7, the concave lens 6, and the micro-lens array 5. Light rays from one first light-emitting pixel group 23A pass through one of the micro convex lenses 53 that constitute the micro-lens array 5 and form one spot on the first reaching position 24A on the screen 3. This spot is formed by light rays from the plurality of light-emitting pixels 22 that emits light rays having the identical information.

Thereafter, as shown in FIG. 5, driving of the actuator 54 moves the micro-lens array 5 upward in the figure by an amount corresponding to the pixel pitch of the light-emitting pixels 2.

In FIG. 5, at the time t2, the plurality of light-emitting pixels 22 belonging to the same second light-emitting pixel group 23B simultaneously emits light rays of the identical information.

As shown in FIG. 5, at the time t2, light rays emitted from the second light-emitting pixel group 23B are projected onto the second reaching position 24B on the screen 3 via the collimator lens 7, the concave lens 6, and the micro-lens array 5. Light rays from one second light-emitting pixel group 23B pass through one of the micro convex lenses 53 that constitute the micro-lens array 5 and form one spot on the second reaching position 24B on the screen 3. This spot is formed by light rays from the plurality of light-emitting pixels 22 that emits light rays of the identical information.

The first reaching position 24A, the second reaching position 24B, and the third reaching position 24C to be described later are different in position from each other. A positional relationship will be described later in detail.

The light-emitting pixels 22 that constitute the first light-emitting pixel group 23A, the second light-emitting pixel group 23B, and the third light-emitting pixel group 23C to be described later, respectively, are not completely identical between the light-emitting pixel groups. The details will be described later.

Thereafter, as shown in FIG. 6, driving of the actuator 54 moves the micro-lens array 5 upward in the figure by an amount corresponding to the pixel pitch of the light-emitting pixels 2.

In FIG. 6, at the time t3, the plurality of light-emitting pixels 22 belonging to the same third light-emitting pixel group 23C simultaneously emits light rays of the identical information.

As shown in FIG. 6, at the time t3, the light rays emitted from the third light-emitting pixel group 23C are projected onto the third reaching position 24C on the screen 3 via the collimator lens 7, the concave lens 6, and the micro-lens array 5. Light rays from one third light-emitting pixel group 23C pass through one of the micro convex lenses 53 that constitute the micro-lens array 5 and form one spot on the third reaching position 24C on the screen 3. This spot is formed by light rays from the plurality of light-emitting pixels 22 that emits light rays of the identical information.

In this manner, the micro-lens array 5 is scanned, and an image is drawn and displayed on the screen 3.

In the display apparatus 20, the micro-lens array 5 is mechanically scanned, the plurality of light-emitting pixels 22 that constitutes the light-emitting pixel groups 23 that emit light rays is shifted on a pixel-by-pixel basis in the light-emitting device 21, and light rays are respectively projected onto the first to third reaching positions 24A to 24C that are different positions on the screen 3 in a time division manner. Accordingly, an image is drawn on the screen 3, and the resolution of the entire image projected onto the screen 3 can be increased.

Here, a case where a spot having a diameter of 400 μm is formed on the screen 3 at 1 m away by using the light-emitting device 21, for example, will be described as an example. Here, it is assumed that a light-emitting device of SVGA (800×600), whose effective display area is 48 mm×36 mm, is used as the light-emitting device 21. One pixel including a red (R) element, a green (G) element, and a blue (B) element in the light-emitting device 21 is a square of vertically 60 μm and horizontally 60 μm, that is, a pixel pitch of the light-emitting device 21 is 60 μm. Moreover, the wavelength of a light ray is set to 550 m.

In order to obtain a spot whose airy disc formed by the Fraunhofer diffraction on the screen 3 (a length from the center of an airy pattern (brightest portion) to a first dark ring) has a radius of 200 μm, it is necessary to perform display by using light-emitting pixels 22 located in a region having a diameter of 55 mm in the light-emitting device 21. The region having a diameter of 3.355 mm in the light-emitting device 21 corresponds to 3,200 pixels. That is, using the light-emitting pixels corresponding to 3,200 pixels, a spot having a diameter of about 400 μm can be drawn on the screen 3 at 1 m away.

Figure 7:
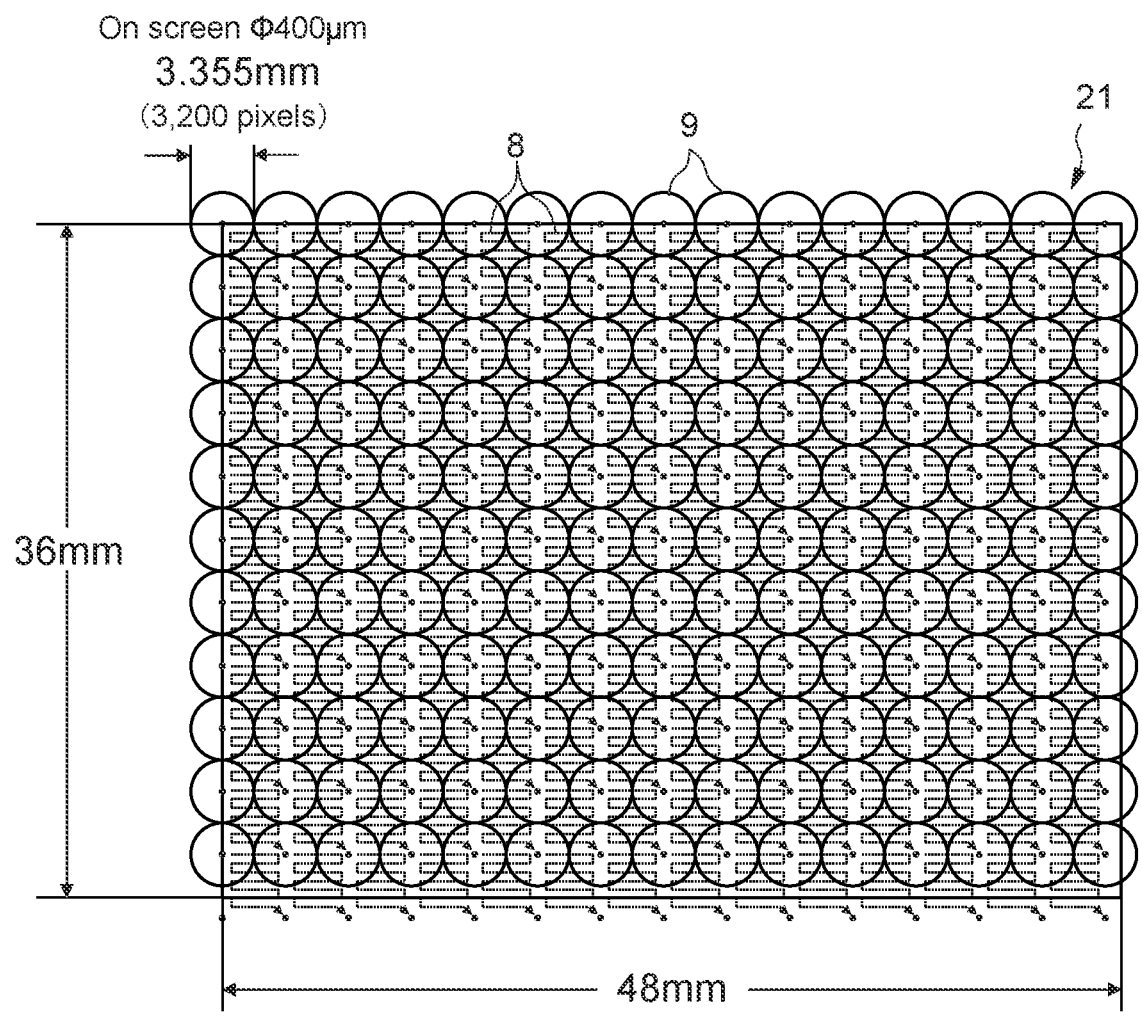
FIG. 7 A diagram for describing a scan in the display apparatus (projector) according to the second embodiment.

As described above, the micro-lens array 5 is mechanically scanned. Referring to FIG. 7, a scan of the micro-lens array 5 will be described. In FIG. 7, the rectangle of 36 mm×48 mm denotes the light-emitting device 21. The plurality of small circles denotes regions 9 equivalent to light-emitting pixels required in a case where one spot having a diameter of 400 μm is formed on the screen 3. In FIG. 7, the rectangular winding lines each extending rightward, downward, leftward, downward, and so on denote scanning trajectories 8 of the micro-lens array 5. The trajectories 8 denote relative movement of the micro-lens array 5 in relation to the light-emitting device 21. The trajectories 8 correspond to trajectories of center points of the regions 9. In the present embodiment, a scan is performed at a driving frequency of 192 kHz, for example. It should be noted that the shape of the trajectories 8 is not limited thereto, and can be a variety of shapes.

A mutual positional relationship between the first to third light-emitting pixel groups, a mutual positional relationship between the first to third reaching positions, and a scan method will be described in more detail with reference to FIGS. 8A, 8B, 9A, 9B, 10A, and 10B.

Figure 8A:
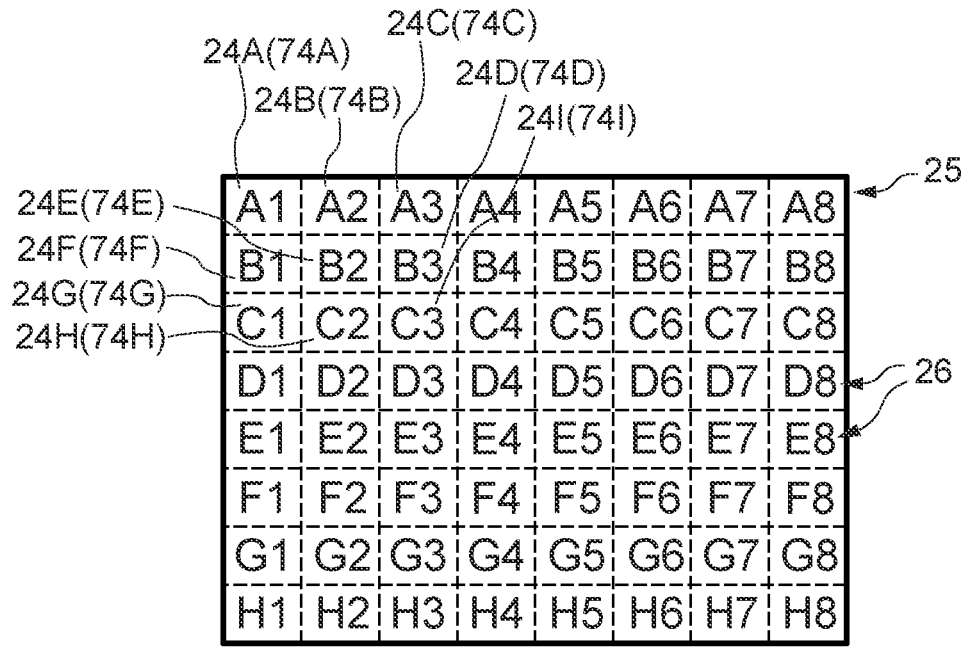
FIGS. 8A and 8B A diagram describing an example of an image projected onto a screen (or retina) by the display apparatus according to the second (or seventh) embodiment and a scanning trajectory.

FIG. 8A is a schematic view of an image 25 drawn on the screen 3. The image 25 is constituted by a plurality of reaching positions 24 arrayed virtually two-dimensionally. The respective reaching positions 24 are different positions. In FIG. 8A, for the sake of convenience, an example in which eight (vertical) and eight (horizontal), a total of 64 reaching positions 24 will be described. Output information A1 to A8, B1 to B8, C1 to C8, D1 to D8, E1 to E8, F1 to F8, G1 to G8, and H1 to H8 output from the light-emitting pixel groups 23 are projected onto the respective reaching positions 24. In order to display the image 25, the micro-lens array 5 is scanned. The size of a light ray emitted from one light-emitting pixel 22 is smaller than a size of a spot projected onto the reaching position 24 on the screen 3.

Figure 8B:
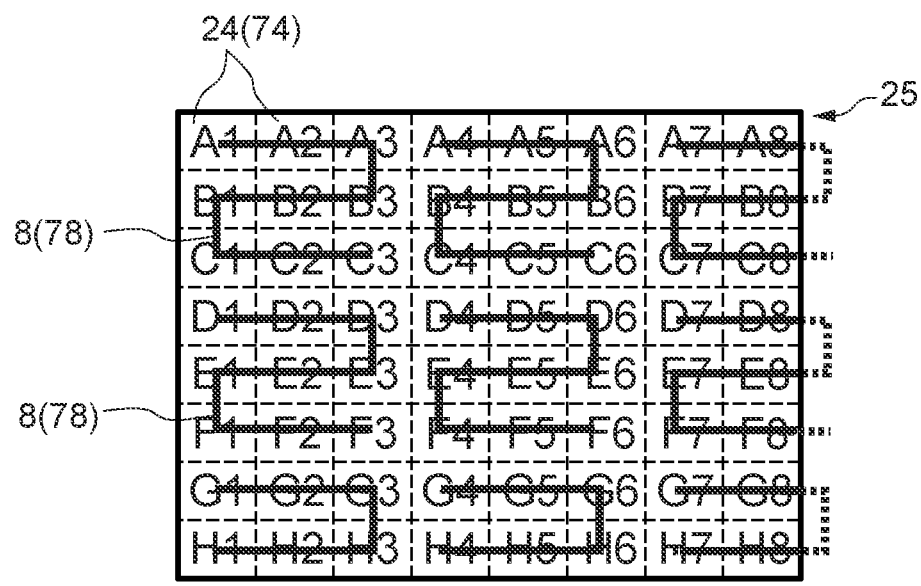

FIG. 8B is illustrated with the trajectories 8 of the micro-lens array 5 shown as the thick lines superimposed on the image 25 shown in FIG. 8A. In FIG. 8B, for the sake of convenience, the trajectories 8 are illustrated, simplified as compared to the trajectories 8 shown in FIG. 7.

Hereinafter, a time sequential change of the output information from the light-emitting device 21 for drawing the image 25 will be described with reference to FIGS. 9A 9B, 10A and 10B. It should be noted that here, for the sake of convenience, the description will be given assuming that the number of light-emitting pixels that constitute one light-emitting pixel group is 9. Actually, the one light-emitting pixel group is constituted by 3,000 to 3,400 light-emitting pixels. The number of light-emitting pixels that constitute one light-emitting pixel group may be fixed or may be configured to be variable.

Figure 9A:
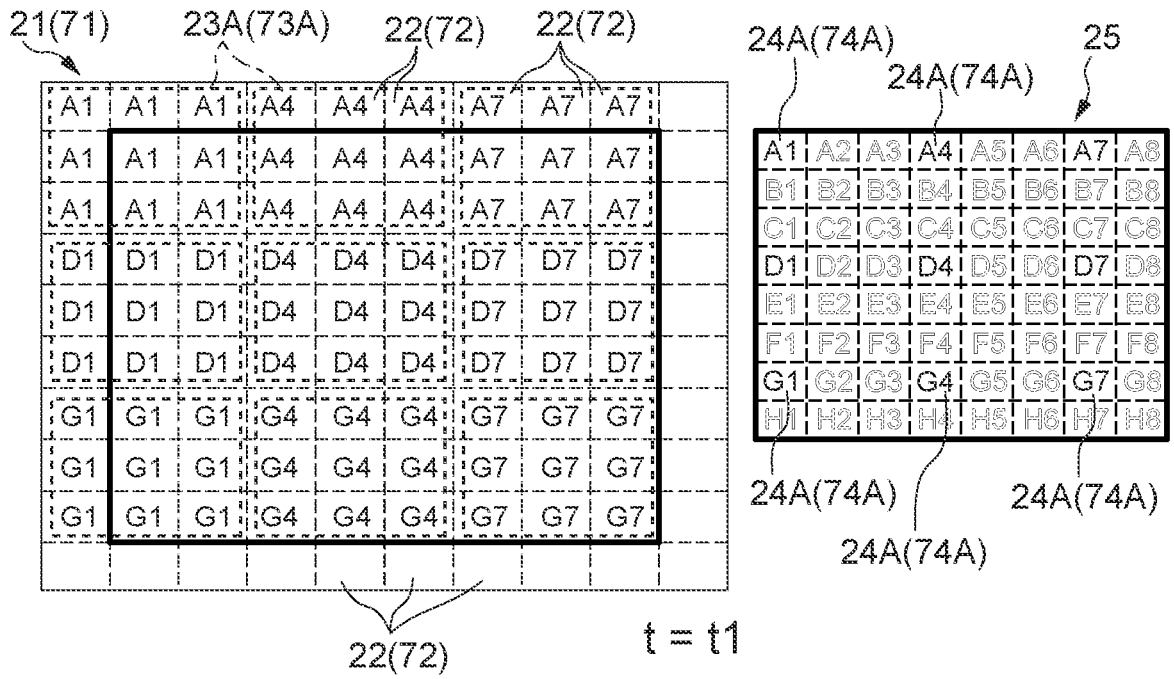
FIGS. 9A and 9B A diagram describing a scan method in the display apparatus for displaying the image shown FIGS. 8A and 8B, which shows output information from a light-emitting device and an image example projected onto the screen (or retina) at a time t1 (FIG. 9A) and at a time t2 (FIG. 9B).
Figure 9B:
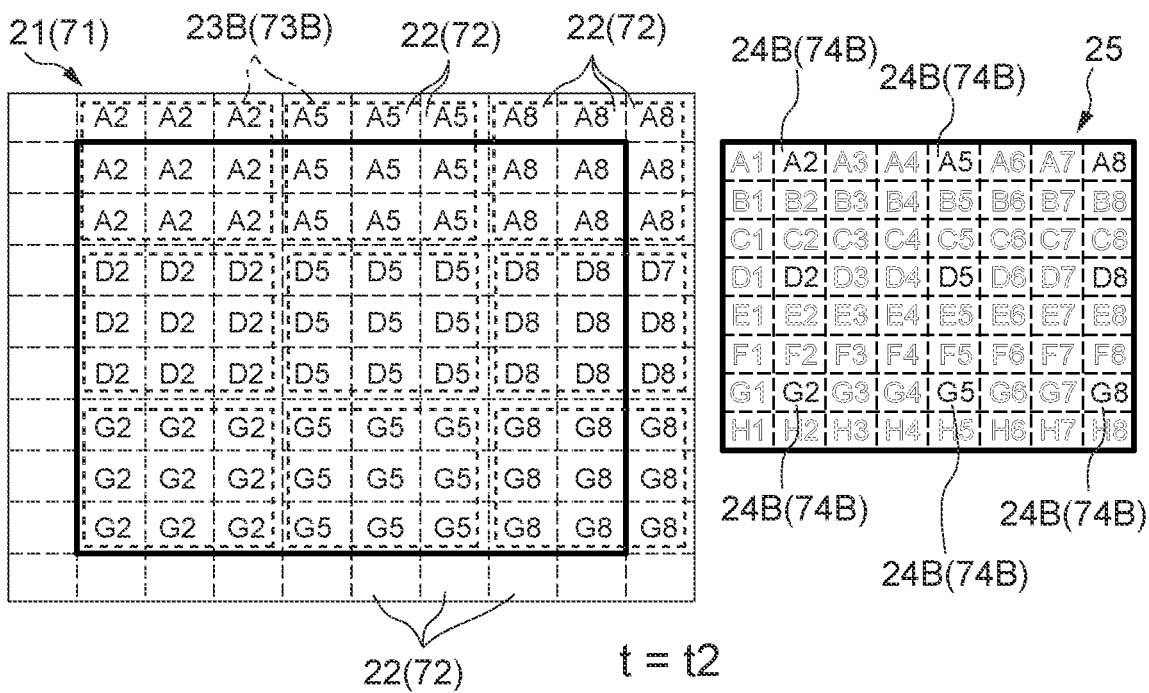
Figure 10A:
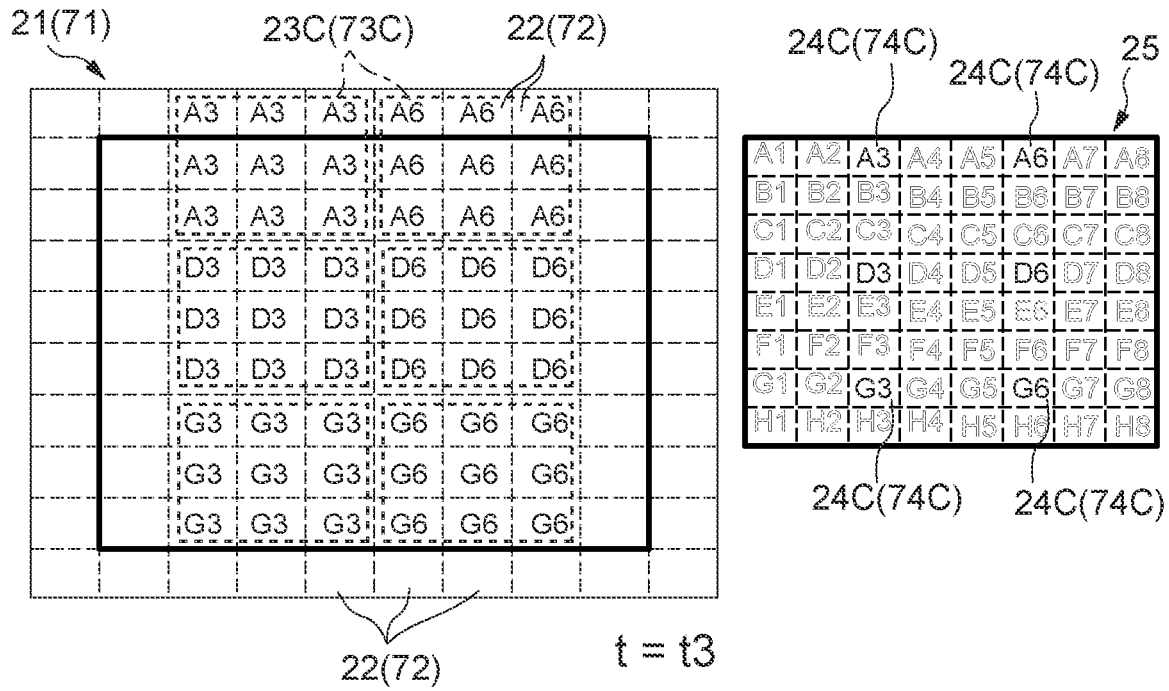
FIGS. 10A and 10B A diagram describing a scan method in the display apparatus for displaying the image shown FIGS. 8A and 8B, which shows output information from the light-emitting device and an image example projected onto the screen (or retina) at a time t3 (FIG. 10A) and at a time t4 (FIG. 10B).
Figure 10B:
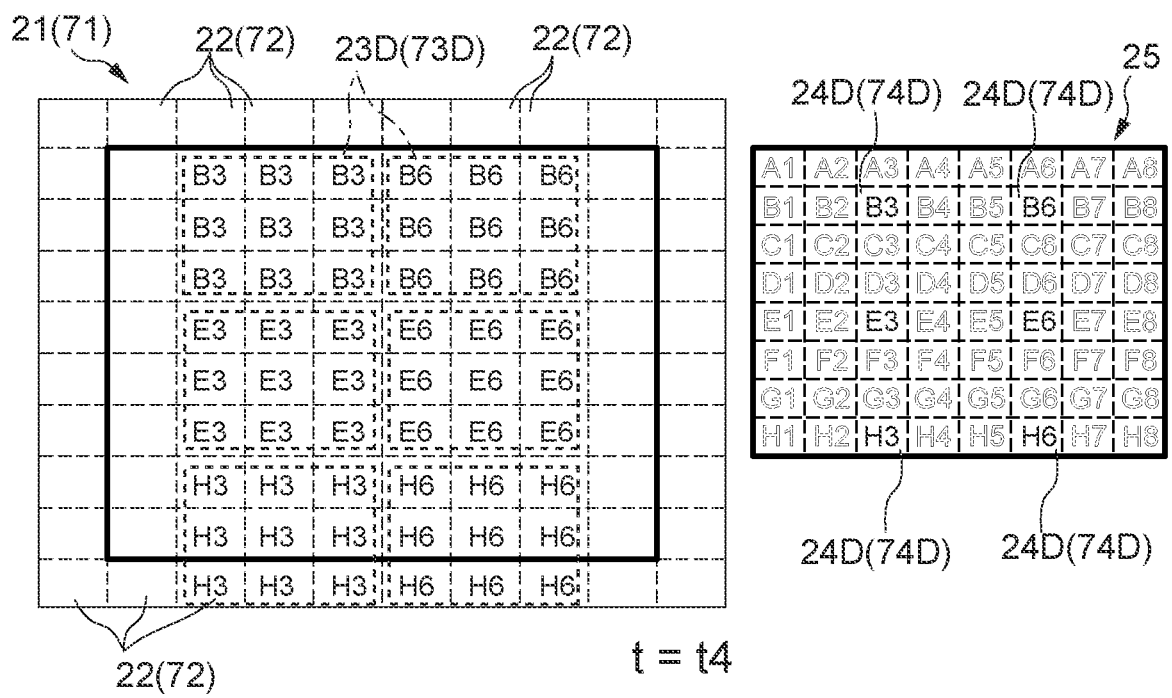

FIG. 9A shows an output information example from the light-emitting pixels 2 at the time t1 and FIG. 9B shows an output information example from the light-emitting pixels 2 at the time t2. FIG. 10A shows an output information example from the light-emitting pixels 2 at the time t3 and FIG. 10B shows an output information example from the light-emitting pixels 2 at the time t4. It is assumed that the time elapses as t1, t2, t3, and t4 in the stated order.

In each of the diagrams of FIGS. 9A, 9B, 10A, and FIG. 10B, the light-emitting device 21 is shown on the left-hand side and the image 25 drawn on the screen 3 is shown on the right-hand side. In FIGS. 9A, 9B, 10A, and 10B, one light-emitting pixel group 23 is shown, surrounded with the rectangular broken line. In FIGS. 9A, 9B, 10A, and 10B, the light-emitting device 21 is shown as the rectangle, and the respective light-emitting pixels 22 are shown, divided by a plurality of vertical broken lines and horizontal broken lines drawn in the light-emitting device 21. In the light-emitting device 21 of each of the respective diagrams of FIGS. 9A, 9B, 10A, and FIG. 10B, the letter such as A1 to A8, B1 to B8 . . . shown inside each of the light-emitting pixel 22s denotes output information that the light-emitting pixel 22 outputs. The light-emitting pixels 22 in which such letters denoting output information are not shown indicate that they are light-emitting pixels 22 that do not output information, i.e., that do not contribute to the display on the screen 3. In the image 25 displayed on the screen 3 in each of the respective diagrams of FIGS. 9A, 9B, 10A, and 10B, at that time, letters denoting the output information of the reaching positions 24 onto which the output information is projected are shown as the solid letters and letters denoting the output information of the reaching positions 24 onto which the output information is not projected are shown as the hollow letters.

In the present embodiment, the light-emitting pixels 22 used for the display on the screen 3 are changed over time, the micro-lens array 5 is mechanically scanned, and the reaching positions of the light rays on the screen 3 are changed.

As shown in the trajectories 8 shown in FIGS. 8B and 9A, at the time t1, output information A1, A4, A7, D1, D4, D7, G1, G4, G7 is projected onto each of the plurality of first reaching positions 24A on the screen 3. Light rays from one first light-emitting pixel group 23A, i.e., output information is projected onto one first reaching position 24A. A plurality of light-emitting pixels 22 belonging to the same one first light-emitting pixel group 23A outputs identical information. That is, light rays corresponding to nine light-emitting pixels 22 in the light-emitting device 21 are projected onto one first reaching position 24A on the screen 3.

As shown in FIG. 9A, the plurality of first reaching positions 24A onto which respective light rays from the plurality of first light-emitting pixels group 23A are projected is spaced apart from each other.

Subsequently, as shown in the trajectories 8 shown in FIGS. 8B and 9B, at the time t2, driving of the actuator 54 moves the micro-lens array 5, and output information A2, A5, A8, D2, D5, D8, G2, G5, G8 is projected onto each of the plurality of second reaching positions 24B on the screen 3. Light rays from one second light-emitting pixel group 23B, i.e., output information is projected onto one second reaching position 24B. A plurality of light-emitting pixels 22 belonging to the same one second light-emitting pixel group 23B outputs identical information. That is, light rays corresponding to nine light-emitting pixels 22 in the light-emitting device 21 are projected onto one second reaching position 24B on the screen 3.

As shown in FIG. 9B, the plurality of second reaching positions 24B onto which respective light rays from the plurality of second light-emitting pixels group 23B are projected is spaced apart from each other. The second reaching position 24B is adjacent to the first reaching position 24A and the third reaching position 24C to be described later.

Moreover, as shown in FIGS. 9A and 9B, in the light-emitting device 21, the second light-emitting pixel group 23B is constituted by the light-emitting pixels 22 obtained when the first light-emitting pixel group 23A is shift rightward in the figure by an amount corresponding to one pixel as a whole. That is, the plurality of light-emitting pixels 22 that constitutes the first light-emitting pixel group 23A and the plurality of light-emitting pixels 22 that constitutes the second light-emitting pixel group 23B are partially the same while the other portions are different. In short, they are not completely identical.

Subsequently, as shown in the trajectories 8 shown in FIGS. 8B and 10A, at the time t3, driving of the actuator 54 moves the micro-lens array 5, and output information A3, A6, D3, D6, G3, G8 is projected onto each of the plurality of third reaching positions 24C on the screen 3. Light rays from one third light-emitting pixel group 23C, i.e., output information is projected onto one third reaching position 24C. A plurality of light-emitting pixels 22 belonging to the same one third light-emitting pixel group 23C outputs identical information. That is, light rays corresponding to nine light-emitting pixels 22 in the light-emitting device 21 are projected onto one third reaching position 24C on the screen 3.

As shown in FIG. 10A, the plurality of third reaching positions 24C is spaced apart from each other.

Moreover, as shown in FIGS. 9B and 10A, in the light-emitting device 21, the third light-emitting pixel group 23C is constituted by the light-emitting pixels 22 obtained when the second light-emitting pixel group 23B is shift rightward in the figure by an amount corresponding to one pixel as a whole. That is, the plurality of light-emitting pixels 22 that constitutes the second light-emitting pixel group 23B and the plurality of light-emitting pixels 22 that constitutes the third light-emitting pixel group 23C are partially the same while the other portions are different. In short, they are not completely identical. Moreover, the plurality of light-emitting pixels 22 that constitutes the third light-emitting pixel group 23C and the plurality of light-emitting pixels 22 that constitutes the first light-emitting pixel group 23A are partially the same while the other portions are different. In short, they are not completely identical.

Subsequently, as shown in the trajectories 8 shown in FIGS. 8B and 10B, at the time t4, driving of the actuator 54 moves the micro-lens array 5, and output information B3, B6, E3, E6, H3, H6 is projected onto each of a plurality of fourth reaching positions 24D on the screen 3. A case where those that have been scanned rightward are scanned downward as in the trajectories 8 shown in FIG. 8B is shown. Light rays from one fourth light-emitting pixel group 23D, i.e., output information is projected onto one fourth reaching position 24D. The plurality of light-emitting pixels 22 belonging to the same one fourth light-emitting pixel group 23D outputs identical information. That is, light rays corresponding to nine light-emitting pixels 22 in the light-emitting device 21 are projected onto one fourth reaching position 24D on the screen 3.

As shown in FIG. 10B, the plurality of fourth reaching positions 24D is spaced apart from each other.

As shown in FIGS. 10A and 10B, in the light-emitting device 21, the fourth light-emitting pixel group 23D is constituted by the light-emitting pixels 22 obtained when the third light-emitting pixel group 23C is shift downward in the figure by an amount corresponding to one pixel as a whole. That is, the plurality of light-emitting pixels 22 that constitutes the third light-emitting pixel group 23C and the plurality of light-emitting pixels 22 that constitutes the fourth light-emitting pixel group 23D are partially the same while the other portions are different. In short, they are not completely identical. Moreover, the plurality of light-emitting pixels 22 that constitutes the fourth light-emitting pixel group 23D and the light-emitting pixels 22 of each of the first to third light-emitting pixel groups 23A to 23C are partially the same while the other portions are different. In short, they are not completely identical.

Next, although the illustrations of the output information examples as shown in FIGS. 9A, 9B, 10A, and 10B will be omitted, as shown in the trajectories 8 of FIG. 8B, at the time t5, driving of the actuator 54 moves the micro-lens array 5, and output information B2, B5, B8, E2, E5, E8, H2, H5, H8 is projected onto each of a plurality of fifth reaching positions 24E on the screen 3.

Subsequently, as shown in the trajectories 8 of FIG. 8B, at the time t6, driving of the actuator 54 moves the micro-lens array 5, and output information B1, B4, B7, E1, E4, E7, H1, H4, H7 is projected onto each of a plurality of sixth reaching positions 24F on the screen 3.

Subsequently, as shown in the trajectories 8 of FIG. 8B, at the time t7, driving of the actuator 54 moves the micro-lens array 5, and output information C1, C4, C7, F1, F4, F7 is projected onto each of a plurality of seventh reaching positions 24G on the screen 3.

Subsequently, as shown in the trajectories 8 of FIG. 8B, at the time t8, driving of the actuator 54 moves the micro-lens array 5, and output information C2, C5, C8, F2, F5, F8 is projected onto each of a plurality of eighth reaching positions 24H on the screen 3.

Subsequently, as shown in the trajectories 8 of FIG. 8B, at the time t9, driving of the actuator 54 moves the micro-lens array 5, and output information C3, C6, F3, F6 is projected onto each of a plurality of ninth reaching positions 24I on the screen 3.

Also at those times t5 to t9, as at the above-mentioned times t1 to t4, information (light rays) is projected onto one reaching position 24 on the screen 3 from one light-emitting pixel group 23 constituted by the plurality of light-emitting pixels 22 that emits light rays of the identical information.

In this manner, the reaching positions 24 of the light rays on the screen 3 change over time. A scan is performed in the display apparatus 20 so that the reaching positions 24 sequentially move to the next positions in accordance with an elapsed time.

As described above, since the display apparatus 20 projects light rays of the identical information emitted from the plurality of light-emitting pixels 22 onto one reaching position 24 on the screen 3, the resolution of a displayed image can be increased.

In addition, in the display apparatus 20, the micro-lens array 5 is mechanically scanned. In the light-emitting device 21, the light-emitting pixels 22 that constitute the light-emitting pixel groups 23 change to be shifted on a pixel-by-pixel basis, and the light-emitting pixel group is configured. Then, light rays from one light-emitting pixel group are respectively projected onto the respective reaching positions 24 that are different positions on the screen 3 in a time division manner. Accordingly, the image 25 is displayed on the screen 3. Humans recognize a group of one-dimensional points formed on the screen 3 by being projected onto respective reaching positions as a two-dimensional image.

By mechanically scanning of the micro-lens array 5 as described above, the resolution of the entire image projected onto the screen 3 can be increased. Moreover, since the light-emitting pixel group is configured in such a manner that the light-emitting pixels 22 that constitute the light-emitting pixel groups 23 are shifted on a pixel-by-pixel basis in accordance with an elapsed time, information corresponding to the number of light-emitting pixels 22 of the light-emitting device 21 can be projected and the information corresponding to the number of light-emitting pixels 22 can be reflected on the screen 3. The resolution of the entire image can be thus increased.

As described above, the display apparatus 20 can display a high-resolution image on the screen 3.

Moreover, the display apparatus 20 has a small number of components and can be downsized.

Third Embodiment

In the above-mentioned first and second embodiments, the example in which the micro-lens array 5 having the plurality of micro convex lenses is used and the micro-lens array 5 is mechanically scanned has been described, though not limited thereto. For example, a liquid-crystal micro-lens array can be used as the micro-lens array. The use of the liquid-crystal micro-lens array can provide a function equivalent to the above-mentioned mechanical scan of the micro-lens array 5 without physical movement. That is, the liquid-crystal micro-lens functions as the scanning mechanism and can be said to be a variable optical system.

Hereinafter, a display apparatus 30 using a liquid-crystal micro-lens array, having an aspect in which light rays of identical information simultaneously emitted from a plurality of light-emitting pixels 22 are projected onto one reaching position 24 on a screen 3 as in the second embodiment will be described with reference to FIGS. 11A, 11B, and 11C.

FIGS. 11A, 11B, and 11C are all configuration diagrams of the same display apparatus 30, and are schematic configuration diagrams of the display apparatus (projector) 30 according to the third embodiment. FIGS. 11A, 11B, and 11C are diagrams for describing a scan, and in the display apparatus 30, a scan is performed in the order of FIGS. 11A (time t1), 11B (time t2), and 11C (time t3).

As shown in FIGS. 11A, 11B, and 11C, light rays emitted from the display apparatus 30 are projected onto the screen 3, and an image is displayed on the screen 3. The display apparatus 30 is configured so that a light-emitting device 21, a collimator lens 7, and a liquid-crystal micro-lens array 35 are arranged in the stated order from a position further from the screen 3 to a position closer to the screen 3.

The light-emitting device 21 includes a plurality of light-emitting pixels 22.

The liquid-crystal micro-lens array 35 has both the functions of the micro-lens array 5 and the concave lens 6 in the second embodiment. That is, the liquid-crystal micro-lens array 35 has a function of the optical system that functions to make light rays from the light-emitting pixel groups 23 constituted by the plurality of light-emitting pixels 22 parallel or approximately parallel and a function of refraction to the screen 3. In addition, the liquid-crystal micro-lens array 35 includes a scanning mechanism. The liquid-crystal micro-lens array 35 includes a plurality of liquid-crystal lenses to be described later. The liquid-crystal micro-lens array 35 makes incident light rays, which have been emitted from the light-emitting pixels 22 and passed through the collimator lens 7, parallel or approximately parallel with the respective liquid-crystal lenses, emits the light rays emitted from the entire light-emitting device 21 to have a wider range, and projects them onto the screen 3.

In the present embodiment, the shielding walls 11 are provided in the light-emitting device 21 and the collimator lens 7.

The liquid-crystal micro-lens array 35 is configured, for example, in such a manner that a pair of electrode substrates sandwiches a liquid-crystal layer therebetween. A transparent electrode is formed as a solid film on a surface of one electrode substrate, which is on a side of the liquid-crystal layer. A plurality of circular transparent electrodes is formed on a surface of the other electrode substrate, which is on a side of the liquid-crystal layer. The plurality of circular transparent electrodes corresponds to the plurality of micro liquid-crystal lenses that constitutes the micro-lens array. By applying a voltage to the liquid-crystal layer between the transparent electrode of the one electrode substrate and the transparent electrodes of the other electrode substrate, the liquid-crystal layer is put in a liquid-crystal orientation that provides lens characteristics. The liquid-crystal layer having the lens characteristics in this manner will be referred to as a liquid-crystal lens. The liquid-crystal lens corresponds to the micro convex lenses of the micro-lens array 5 and the liquid-crystal micro-lens array 35 includes a plurality of liquid-crystal lenses. In the liquid-crystal micro-lens array 35, the optical axis and focal distance of each of the liquid-crystal lenses is variable by changing the liquid-crystal orientation of the liquid-crystal layer.

Electrically controlling the respective liquid-crystal lenses of the liquid-crystal micro-lens array 35 can provide the liquid-crystal micro-lens array 35 with the scan function without physically moving the liquid-crystal micro-lens array 35.

In the present embodiment, the pixel pitch of the light-emitting pixels 22 is set to be 60 μm, the liquid-crystal lens pitch in the liquid-crystal micro-lens array 35 is set to be 3,400 μm, and the diameter of a spot emitted from a single light-emitting pixel 2 and projected onto the screen 3 at 1 m away is configured to be 400 μm.

In the display apparatus 30, light rays emitted from the plurality of light-emitting pixels 22 that emits light rays of the identical information pass through one of the liquid-crystal lenses that constitute the liquid-crystal micro-lens array 35 and are projected onto a reaching position 24 on the screen 3, and one spot is formed.

In addition, as described above, since electrically controlling the liquid-crystal micro-lens array 35 can provide the scan function, the liquid-crystal micro-lens array 35 can be fixedly placed. Accordingly, a scanning mechanism that mechanically scans an actuator becomes unnecessary, and the configuration of the entire display apparatus is simplified and downsizing can be achieved.

FIGS. 11A, 11B, and 11C are all configuration diagrams of the same display apparatus 30 and are diagrams for describing a scan. In FIG. 11A, a first light-emitting pixel group constituted by the plurality of light-emitting pixels 22 that outputs information identical to each other at the time t1 will be denoted by the reference sign 23A. In FIG. 11B, a second light-emitting pixel group constituted by a plurality of light-emitting pixels 22 that outputs information identical to each other at the time t2 will be denoted by the reference sign 23B. In FIG. 11C, a third light-emitting pixel group constituted by a plurality of light-emitting pixels 22 that outputs information identical to each other at the time t3 will be denoted by the reference sign 23C. Assuming that the time elapses as t1, t2, and t3 in the stated order, the scan is performed in the order of FIGS. 11A, 11B, and 11C. Unless it is particularly necessary to distinguish the light-emitting pixel groups 23A to 23C, they will be referred to as light-emitting pixel groups 23.

As shown in FIG. 11A, at the time t1, the light rays emitted from the first light-emitting pixel group 23A are projected onto the first reaching position 24A on the screen 3 via the collimator lens 7 and the liquid-crystal micro-lens array 35. Light rays from one first light-emitting pixel group 23A pass through one of the liquid-crystal lenses that constitute the liquid-crystal micro-lens array 35 and form one spot on the first reaching position 24A on the screen 3. This spot is formed by light rays from the plurality of light-emitting pixels 22 that emits light rays of the identical information.

Thereafter, the liquid-crystal micro-lens array 35 is driven so that the optical axis of each of the liquid-crystal lenses of the liquid-crystal micro-lens array 35 changes.

As shown in FIG. 11B, at the time t2, light rays emitted from the second light-emitting pixel group 23B are projected onto the second reaching position 24B on the screen 3 via the collimator lens 7 and the liquid-crystal micro-lens array 35. Light rays from one first light-emitting pixel group 23A pass through one of the liquid-crystal lenses that constitute the liquid-crystal micro-lens array 35 and form one spot on the second reaching position 24B on the screen 3. This spot is formed by light rays from the plurality of light-emitting pixels 22 that emits light rays of the identical information.

Thereafter, the liquid-crystal micro-lens array 35 is driven so that the optical axis of each of the liquid-crystal lenses of the liquid-crystal micro-lens array 35 changes.

As shown in FIG. 11C, at the time t3, the light rays emitted from the third light-emitting pixel group 23C are projected onto the third reaching position 24C on the screen 3 via the collimator lens 7 and the liquid-crystal micro-lens array 35. Light rays from one first light-emitting pixel group 23A pass through one of the liquid-crystal lenses that constitute the liquid-crystal micro-lens array 35 and form one spot on the third reaching position 24C on the screen 3. This spot is formed by light rays from the plurality of light-emitting pixels 22 that emits light rays of the identical information.

In this manner, the scan is performed by electrically controlling the liquid-crystal micro-lens array 35, and the image 25 is drawn and displayed on the screen 3.

Also in the display apparatus 30, the scan is performed in a manner similar to the scan described with reference to FIGS. 7, 10A, and 10B in the second embodiment.

As described above, since also in the display apparatus 30, as in the second embodiment, light rays of the identical information, which have been emitted from the plurality of light-emitting pixels 22, are projected onto one reaching position 24 on the screen 3, the resolution can be increased.

In addition, in the display apparatus 30, the optical axis of each of the liquid-crystal lenses is changed by driving the liquid-crystal micro-lens array 35 and a scan is performed. Then, light rays from one light-emitting pixel group are respectively projected onto the respective reaching positions 24 that are different positions on the screen 3 in a time division manner. In this manner, also in the display apparatus 30, as in the second embodiment, although the scanning mechanism is different, a scan is performed so that the reaching positions 24 sequentially move to the next positions in accordance with an elapsed time. Accordingly, the resolution of the entire image projected onto the screen 3 can be increased.

It should be noted that in the scan shown in FIGS. 11A, 11B, and 11C, the light-emitting pixels 22 that constitute the light-emitting pixel groups 23 constituted by the plurality of light-emitting pixels 22 that emits light rays of the identical information at each of the times t1 to t3 are the same in physical structure and spatial position, the information emitted from the light-emitting pixels 22 in accordance with each of the times t1 to t3 is changed over time to be shifted on a pixel-by-pixel basis.

By changing the information output from the pixel groups 23 over time, i.e., performing an electronic scan as described above, the same effects as the second embodiment can be provided without a mechanical scan. Specifically, information corresponding to the number of light-emitting pixels 22 of the light-emitting device 21 can be projected and the information corresponding to the number of light-emitting pixels 22 can be reflected on the screen 3. The resolution of the entire image can be thus increased.

As described above, the display apparatus 30 can display a high-resolution image on the screen 3.

Moreover, since in the display apparatus 30, a scanning mechanism that physically scans the micro-lens array 5 as in the second embodiment is unnecessary and the liquid-crystal micro-lens array 35 is configured to function as the micro-lens array 5 and the concave lens 6, the number of components is small and further downsizing can be achieved. Moreover, since the mechanical scan is not performed, the positional relationship between the optical system including the liquid-crystal micro-lens array 35 and the light-emitting pixels can be fixed by, for example, integrating the optical system including the liquid-crystal micro-lens array 35 with the light-emitting pixels. Therefore, it is effective for retaining the position accuracy between the optical system and the light-emitting pixels.

It should be noted that a configuration in which the liquid-crystal micro-lens array has only a collimate function and a scan function and a concave lens 6 is additionally provided may be employed. Also in this case, since a mechanical scanning mechanism is unnecessary, downsizing can be achieved.

In the present embodiment, the example in which the liquid-crystal micro-lens array also serves as the scanning mechanism by electrically controlling the liquid-crystal micro-lens array to change the optical axis of each of the liquid-crystal lenses has been described. However, it is also possible to physically move the liquid-crystal micro-lens array through a scanning mechanism such as an actuator as in the second embodiment. The same applies to a display apparatus using the following liquid-crystal micro-lens array.

Fourth Embodiment

A display apparatus 40 according to a fourth embodiment will be described with reference to FIG. 12.

Figure 12:
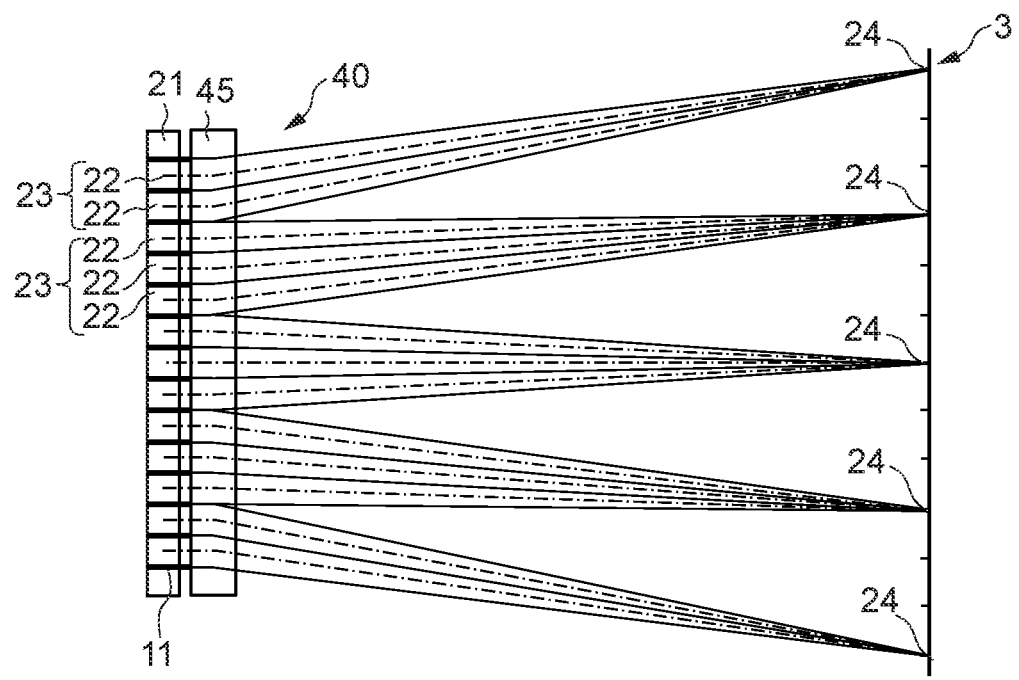
FIG. 12 A configuration diagram of a display apparatus (projector) according to a fourth embodiment.

FIG. 12 is a schematic configuration diagram of the display apparatus (projector) 40.

The display apparatus 40 according to the present embodiment has a configuration in which the liquid-crystal micro-lens array according to the third embodiment also has a function of the collimator lens.

As shown in FIG. 12, the display apparatus 40 includes a light-emitting device 21 and a liquid-crystal micro-lens array 45. The liquid-crystal micro-lens array 45 includes a plurality of liquid-crystal lenses.

The liquid-crystal micro-lens array 45 has a function of the optical system that functions to make light rays from the light-emitting pixel groups 23 constituted by the plurality of light-emitting pixels 22 parallel or approximately parallel, a function of refraction in a pupil direction, and a scan function. The liquid-crystal micro-lens array 45 makes light rays made incident from the light-emitting pixels 22 parallel or approximately parallel, further makes them parallel or approximately parallel at the respective liquid-crystal lenses, emits the light rays emitted from the entire light-emitting device 21 to have a wider range, and projects them onto the screen 3.

In the present embodiment, the shielding walls 11 are provided in the light-emitting device 21.

Like the liquid-crystal micro-lens array 35, in the liquid-crystal micro-lens array 45, the optical axis and focal distance of each of the liquid-crystal lenses is variable by changing the liquid-crystal orientation of the liquid-crystal layer.

The pitch of the light-emitting pixels 22 and the liquid-crystal lens pitch in the liquid-crystal micro-lens array 45 are similar to those of the above-mentioned third embodiment.

Also in the display apparatus 40, light rays emitted from the plurality of light-emitting pixels 22 that emits light rays of the identical information pass through one of the liquid-crystal lenses that constitute the liquid-crystal micro-lens array 45 and are projected onto the reaching positions 24 on the screen 3 and form one spot.

Also in the display apparatus 40, the scan can be performed in a manner similar to the display apparatus 30 according to the third embodiment.

As described above, the display apparatus 40 can display a high-resolution image on the screen 3.

Moreover, in the display apparatus 40, since it is unnecessary to place the collimator lens 7 unlike the third embodiment, the number of components is further reduced and further downsizing can be achieved.

[Modified Example of Projector (Display Apparatus)]

In each of the above-mentioned embodiments, the example in which the scan is performed, light rays are projected onto different reaching positions on the screen 3 in a time division manner, and an image is displayed has been described. However, a configuration in which a scan is not performed may be employed.

In the above-mentioned first embodiment, by using the configuration in which the micro-lens array having the pitch larger than the pixel pitch of the light-emitting pixels is used, a light ray from a single light-emitting pixel is projected with the focusing degree on the screen increased, and the resolution is improved. Moreover, in the above-mentioned second to fourth embodiments, the resolution is improved by using configuration in which light rays of the identical information emitted from the plurality of light-emitting pixels are projected onto the screen as one spot.

In each of the above-mentioned embodiments, the resolution of the entire image projected onto the screen is increased by performing a scan in addition to these configurations.

On the contrary, in a case where the scan is not performed, in the image projected onto the screen, adjacent spots are spaced away from each other. Therefore, the resolution of the entire image is not increased. However, necessary word information and image information can be configured to be readable to humans from a projected image for some applications or purposes where a high resolution is not required for the entire image. Therefore, it is also effective in the configuration in which the scan is not performed.

Fifth Embodiment

Two other examples associated with the display apparatus (projector) will be described with reference to FIGS. 13 and 14.

Figure 13:
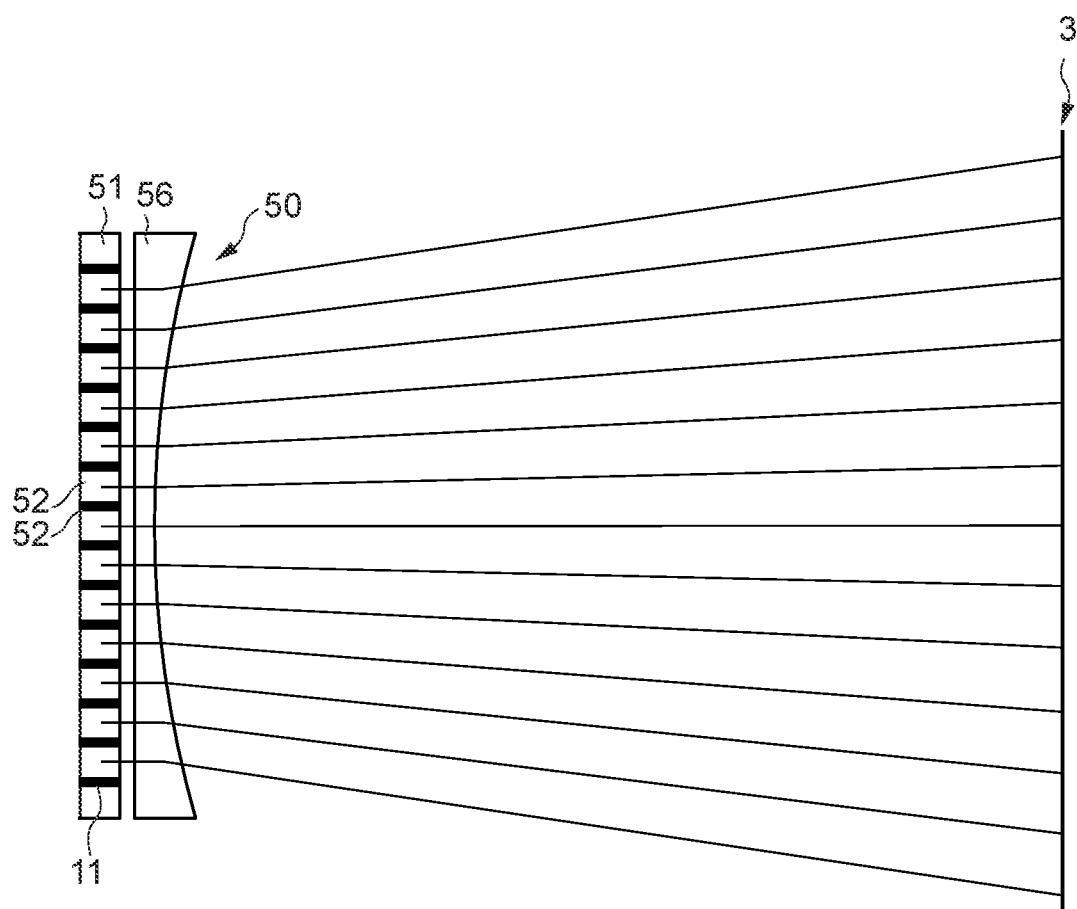
FIG. 13 A configuration diagram of a display apparatus (projector) according to a fifth embodiment.
Figure 14:
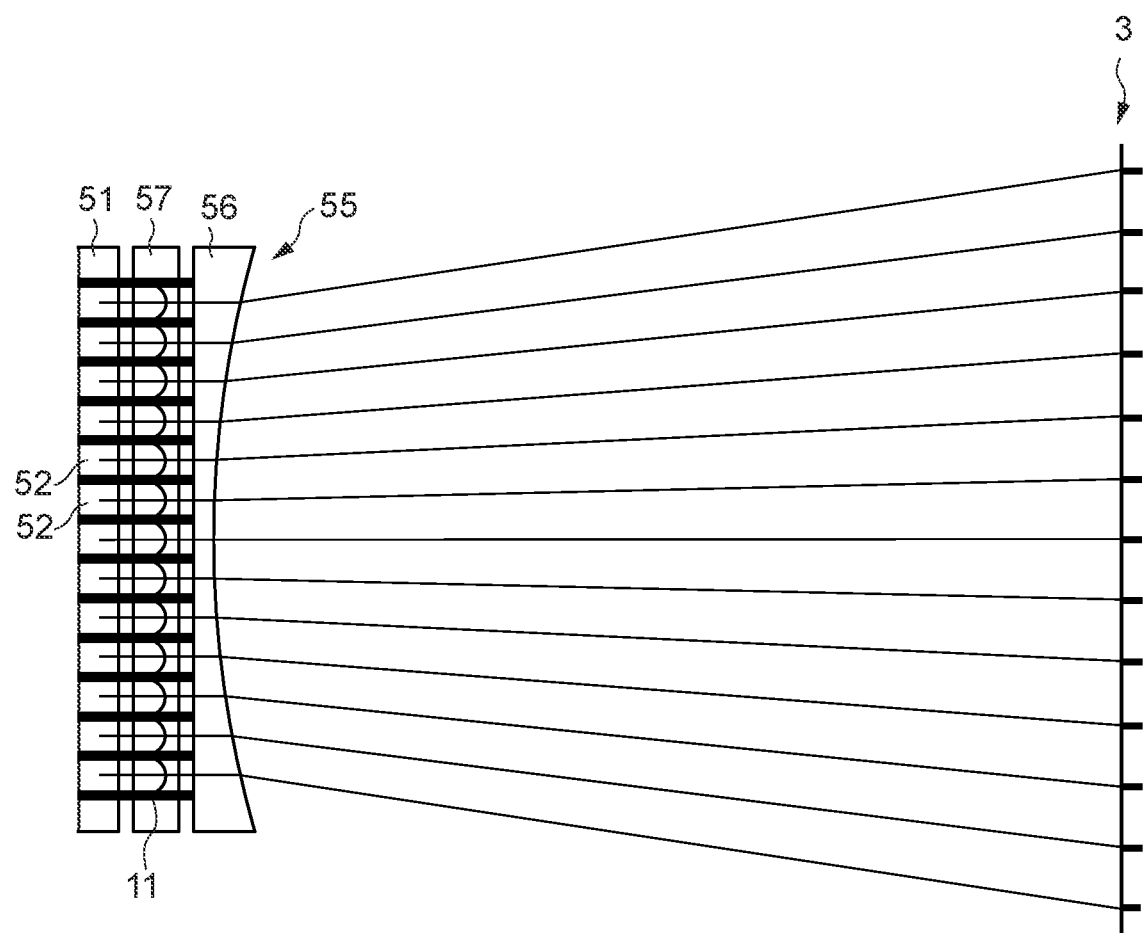
FIG. 14 A configuration diagram of the display apparatus (projector) according to the fifth embodiment.

A display apparatus 50 shown FIG. 13 and a display apparatus 55 shown FIG. 14 both include a light-emitting device 51 and an optical system. Diffuse light rays emitted from the light-emitting device 51 are projected onto the screen 3 via the optical system.

In the display apparatus 50 shown FIG. 13, a concave lens 56 is used as the optical system. In the display apparatus 60 shown FIG. 14, a collimator lens 57 and a concave lens 56 are used as the optical system.

The light-emitting device 51 includes a plurality of light-emitting pixels 52 arrayed two-dimensionally. Like the light-emitting device 1 described in the first embodiment, a light-emitting device including organic light-emitting diodes, inorganic light-emitting diodes, lasers, or the like, or a liquid-crystal panel including a backlight light source can be used as the light-emitting device 51.

In the display apparatus 50 in FIG. 13, light rays emitted from the respective light-emitting pixels 52 of the light-emitting device 51 are projected onto the screen 3 via the concave lens 56. Light rays emitted from the entire light-emitting device 51 are projected onto the screen 3 to have a range widened by the concave lens 56.

In the display apparatus 55 in FIG. 14, light rays emitted from the respective light-emitting pixels 52 of the light-emitting device 51 are projected onto the screen 3 via the collimator lens 57 and the concave lens 56. Light rays emitted from the entire light-emitting device 51 are made parallel or approximately parallel by the collimator lens 57 and are projected onto the screen 3 to have a range widened by the concave lens 56.

As described above, in the display apparatuses 50 and 55 applied to the projector according to the fifth embodiment, it is unnecessary to form a real image of a display image generated by the light-emitting device on the screen. Therefore, the number of components can be reduced as compared to generally-used liquid-crystal projector, DLP projector, LCOS projector, and the like, and downsizing as a whole can be achieved.

<Application Example to Eyewear>

Sixth Embodiment

Figure 15:
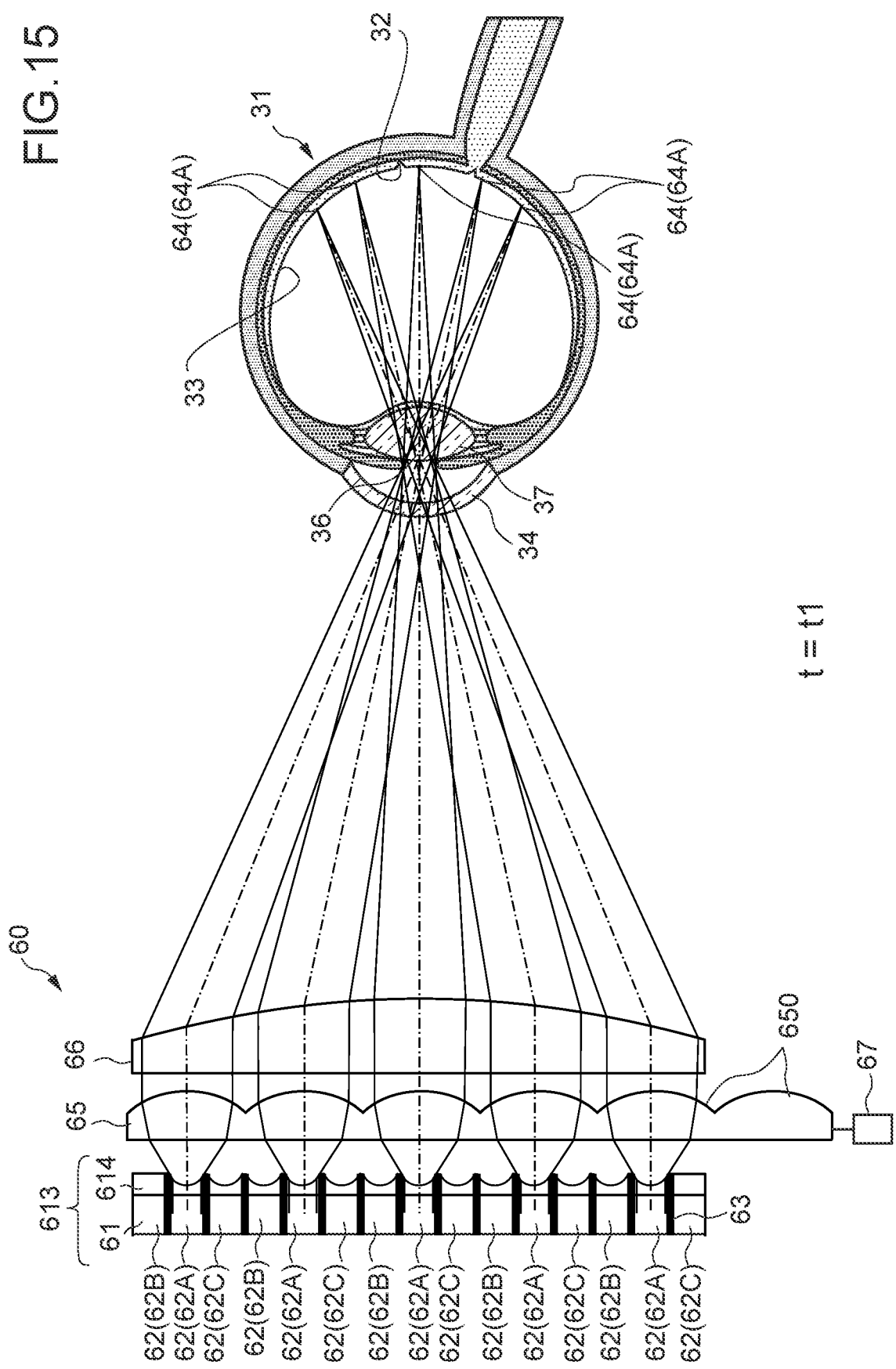
FIG. 15 A configuration diagram of a display apparatus (eyewear) according to a sixth embodiment.

FIG. 15 is a schematic configuration diagram of a display apparatus 60 applied to an eyewear according to a sixth embodiment.

As shown in FIG. 15, the display apparatus 60 includes a light-emitting device 613 with a diffuse optical system, a micro-lens array 65, a plano-convex lens 66, and an actuator 67 that is a scanning mechanism. The light-emitting device 613 with the collimator lens is constituted by a light-emitting device 61 and a diffuse optical system 614.

Although the illustration is omitted for an appearance diagram of the eyewear, the eyewear has an eyeglass-type shape, for example. When a user wears the eyeglass-type eyewear, light rays emitted from the display apparatus 60 are projected onto a retina 33 of an eye 31 of the user and an image is drawn and displayed on the retina 33.

Figure 35:
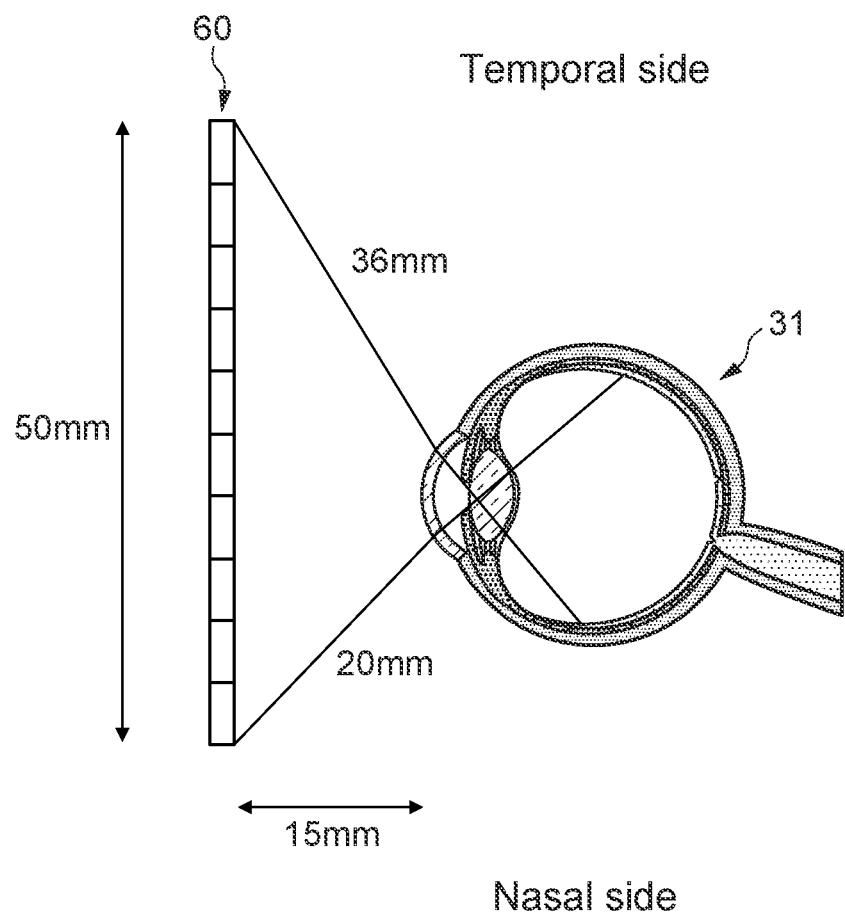
FIG. 35 A schematic diagram describing a positional relationship between a display apparatus applied to an eyewear and an eye.

One display apparatus 60 is provided for each of left and right lenses of the eyeglass-type eyewear. FIG. 35 is a schematic diagram showing an example of a positional relationship between the display apparatus 60 applied to the eyewear and the eye 31. FIG. 35 corresponds to a diagram of the user wearing the eyewear from above. A horizontal direction of the display apparatus 60 (corresponding to upper and lower directions in FIG. 35) when the user wears the eyewear is positioned substantially in parallel with a line connecting both ears of the user. A dimension in the horizontal direction of the display apparatus 60 is 50 mm. A distance between the display apparatus 60 and the eye 31 is about 15 mm. When the user wearing the eyeglass-type eyewear is viewed from the front, the center in the horizontal direction of the display apparatus 60 is not identical to the center in a horizontal direction of the eye 31. Regarding each of the display apparatuses 60 provided for the left and right eyes respectively, its center in the horizontal direction is positioned closer to the ear than the center in the horizontal direction of the eye 31. A distance between an end portion on the nasal side in the horizontal direction of the display apparatus 60 to the eye 31 is 20 mm and a distance between an end portion on the temporal side in the horizontal direction of the display apparatus 60 to the eye 31 is 36 mm.

As shown in FIG. 15, the light-emitting device 61 includes a plurality of light-emitting pixels 62. A light-emitting device similar to that of the first embodiment can be used as the light-emitting device 61.

The light-emitting device 61 is configured with the light-emitting pixels 62 arrayed two-dimensionally. A pixel pitch of the light-emitting pixels 62, i.e., a center-to-center distance between the adjacent light-emitting pixels 62 is for example 10 µm.

Moreover, the light-emitting device 61 includes shielding walls 63 provided so as to divide the respective light-emitting pixels 62. The shielding walls 63 configure waveguides that guide light rays from the respective light-emitting pixels 62. The shielding walls 63 prevent the spread of light rays from the light-emitting pixels 62. By using the shielding walls 63 and the optical system such as the micro-lens array and the plano-convex lens in the display apparatus 60, light rays from the light-emitting pixels 62 are made to reach desired reaching positions on the retina 33, each having a desired projection area, with their directions determined. The shielding walls 63 may be provided only in the light-emitting device or may be provided also in an optical system different from the light-emitting device, such as the micro-lens array and the plano-convex lens, and various modifications can be made. Hereinafter, in the description of the application example of the eyewear, the shielding walls will be referred to as the shielding walls 63 irrespective of where they are provided.

The shielding walls 63 can employ any one of a reflection structure, a light-shielding structure, and a light-absorbing structure.

Light rays emitted from the light-emitting device 613 with the diffuse optical system are made incident on the micro-lens array 65. The micro-lens array 65 emits the incident light rays toward the retina 33 that is a projection target object, and projects them onto the retina 33. More specifically, the light rays emitted from the micro-lens array 65 are projected onto the retina 33 through the plano-convex lens 66. A two-dimensional image can be displayed on the retina 33.

The micro-lens array 65 is configured with a plurality of micro convex lenses 650 arrayed two-dimensionally. It should be noted that other than the configuration in which the plurality of convex lenses are arrayed two-dimensionally as in the present embodiment, the micro-lens array in the present technology includes an optical system having functions equivalent thereto. For example, the micro-lens array in the present technology includes the lenses that have functions equivalent to those of the configuration in which the plurality of convex lenses are arrayed two-dimensionally but are constituted by flat faces in terms of the shape, a liquid-crystal micro-lens array, a micro-lens array having a configuration in which a plurality of micro concave lenses is arrayed two-dimensionally, a micro-lens array constituted by liquid lenses, and the like.

The plurality of micro convex lenses 650 that constitutes the micro-lens array 65 makes incident light rays parallel or approximately parallel. Light rays emitted from the entire light-emitting device 61 are bent in the direction of the pupil by the plano-convex lens 66 and are projected onto the retina 33. Moreover, the micro-lens array 65 and the plano-convex lens 66 are provided so that light rays from the respective light-emitting pixels 62 of the light-emitting device 61 are projected like spots when they reach the retina 33.

In the present embodiment, a pitch of the adjacent micro convex lenses 650 of the micro-lens array 65, i.e., a center-to-center distance between the adjacent convex lenses is set to be 2,700 µm, for example.

Here, a structure of the eye 31 will be described with reference to FIG. 15.

The human eye 31 is a spherical shape having a diameter of about 24 mm. In the eye 31, light rays incident from a cornea portion 34 enters a crystalline lens 37 through a pupil 36. By adjusting the thickness of the crystalline lens 37, an inverted real image is constantly formed on the retina 33. A fovea centralis 32 is located at a center portion of the retina 33.

The retina 33 has two kinds of photoreceptors, cone cells and rod cells. The cone cells can recognize colors in a bright place but the function is deteriorated in the dark. The cone cells can perceive red, green, and blue light rays. The rod cells cannot distinguish colors but they can sense even a small amount of light and principally functions in a dark place. Thus, the image resolution that the eyes recognize is deeply associated with the cone cells.

Figure 22:
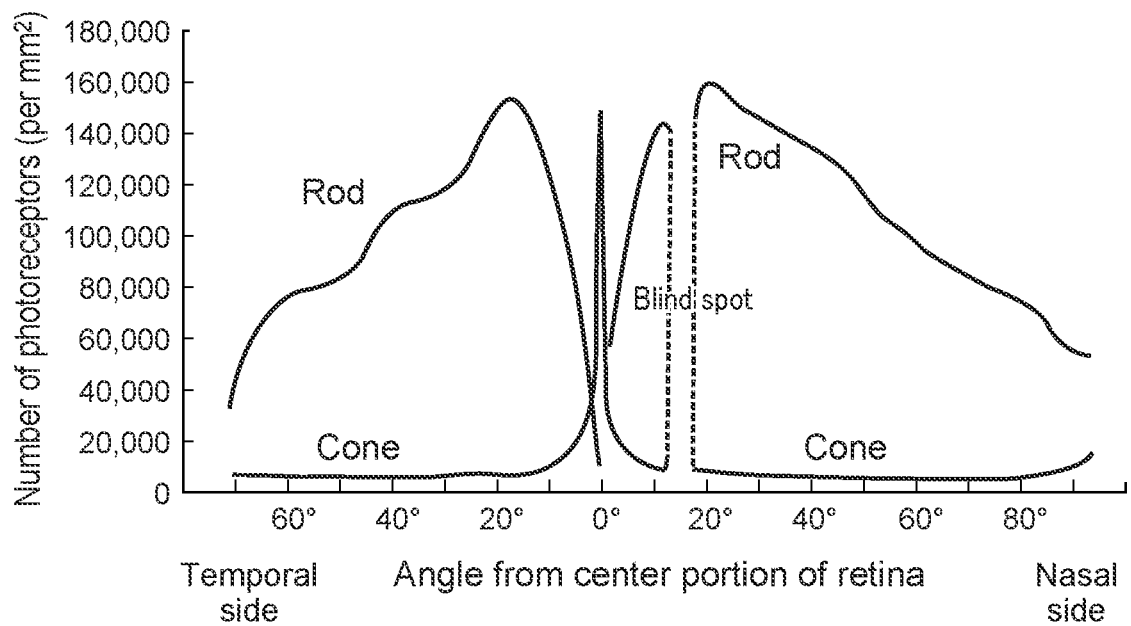
FIG. 22 A diagram for describing characteristics of a retina.

FIG. 22 shows a distribution of the photoreceptors in the retina. At a center portion of the retina 33, there is a portion called fovea centralis 32 in which the cells are distributed densely. The size of the fovea centralis 32 is a diameter of about 400 µm and a distance between photoreceptors is about 2 µm. The largest number of cone cells are distributed at the fovea centralis 32 and cone cells are hardly distributed around the fovea centralis 32. Rods are hardly distributed at the fovea centralis 32 and many rods are distributed at a peripheral portion of the fovea centralis 32. Moreover, the diameter of a cone positioned at the fovea centralis 32 is about 2.5 µm and the diameter of a cone positioned at the peripheral portion of the fovea centralis 32 is about 10 µm.

In the present embodiment, the resolution is increased by setting the pitch of the convex lenses 650 in the micro-lens array 65 to be larger than the pitch of the light-emitting pixels 62 of the light-emitting device 61. Hereinafter, it will be described.

When a light ray is projected onto the retina located at a certain distance through the pinhole, the light ray is projected onto a region on the retina, which is larger than the pinhole diameter due to the Fraunhofer diffraction. For example, in a case where the pinhole has a diameter of 9.9 µm, the diameter of the light ray projected onto the retina located at 34 mm away is 4.6 mm. In this state, it is difficult to draw an image with a sufficient resolution on the retina.

On the contrary, in the present embodiment, the focal point is made smaller and the focusing degree is increased by setting the pitch of the convex lenses 650 in the micro-lens array 65 to be larger than the pitch of the light-emitting pixels 62. Then, by setting the focal point to be on the retina, the focusing power of a spot of a light ray emitted from a single light-emitting pixel 62 on the retina 33 can be increased and the resolution can be increased. Thus, in the present embodiment, light rays from the light-emitting pixels can be projected onto desired reaching positions on the retina in a state in which the focusing degree is increased.

It should be noted that since the diameter of an eyeball is typically about 24 mm, assuming that a distance between the eye surface and the display apparatus provided in a frame of the eyeglass-type eyewear is 10 mm, a distance between the pinhole and the retina is 34 mm in the above description. Such numerical values can be set as appropriate depending on a shape of an eyewear in which the display apparatus is installed.

The present embodiment employs a configuration in which the pixel pitch of the light-emitting pixels 62 is 9.9 μm, the pitch of the convex lenses 650 of the micro-lens array 65 is 2,700 μm, and the diameter of a spot emitted from one light-emitting pixel 62 and projected onto the retina 33 located at 34 mm away is 12.6 μm.

As described above, the pitch of the convex lenses 650 in the micro-lens array 65 is set to be larger than the pixel pitch of the light-emitting pixels 62 of the light-emitting device 61. In a case where the distance between the light-emitting device 61 and the retina 33 in a range of 30 mm to 40 mm, the pitch of the convex lenses 650 in the micro-lens array 65 is favorably more than 240 times the pitch of the light-emitting pixels 62 and less than 322 times the pitch of the light-emitting pixels 62. By setting the pitch of the convex lenses 650 in the micro-lens array 65 to be larger than the pixel pitch of the light-emitting pixels 62 of the light-emitting device 61 in this manner, the focal point on the retina can be made sufficiently small and the focusing degree can be increased. Accordingly, the resolution can be improved. In a case where the pitch of the convex lenses 650 in the micro-lens array 65 is less than 240 times the pitch of the light-emitting pixels 62, the focal point on the screen cannot be made sufficiently small, and it is difficult to make the resolution sufficiently high. In a case where the pitch of the convex lenses 650 in the micro-lens array 65 is more than 322 times the pitch of the light-emitting pixels 62, the frequency of a scan is 5 MHz or more, and technical problems in realizing it are bigger.

The actuator 67 is a scanning mechanism that mechanically scans the micro-lens array 65.

In the present embodiment, the actuator 67 mechanically scans the micro-lens array 65 and light rays are projected and drawn on the retina 33. The scan will be described with reference to FIGS. 15 and 17.

Figure 16:
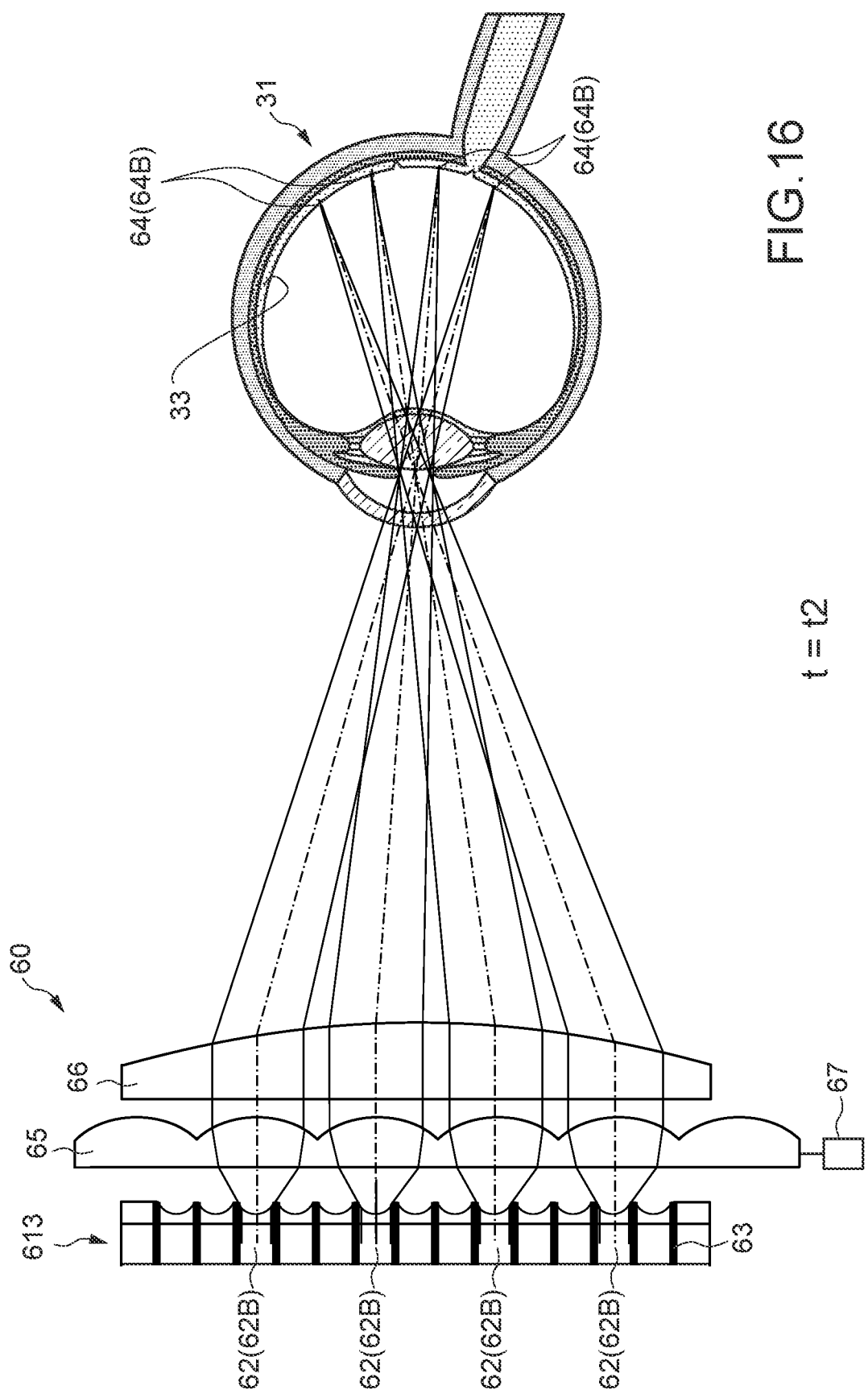
FIG. 16 A configuration diagram of the display apparatus (eyewear) according to the sixth embodiment.
Figure 17:
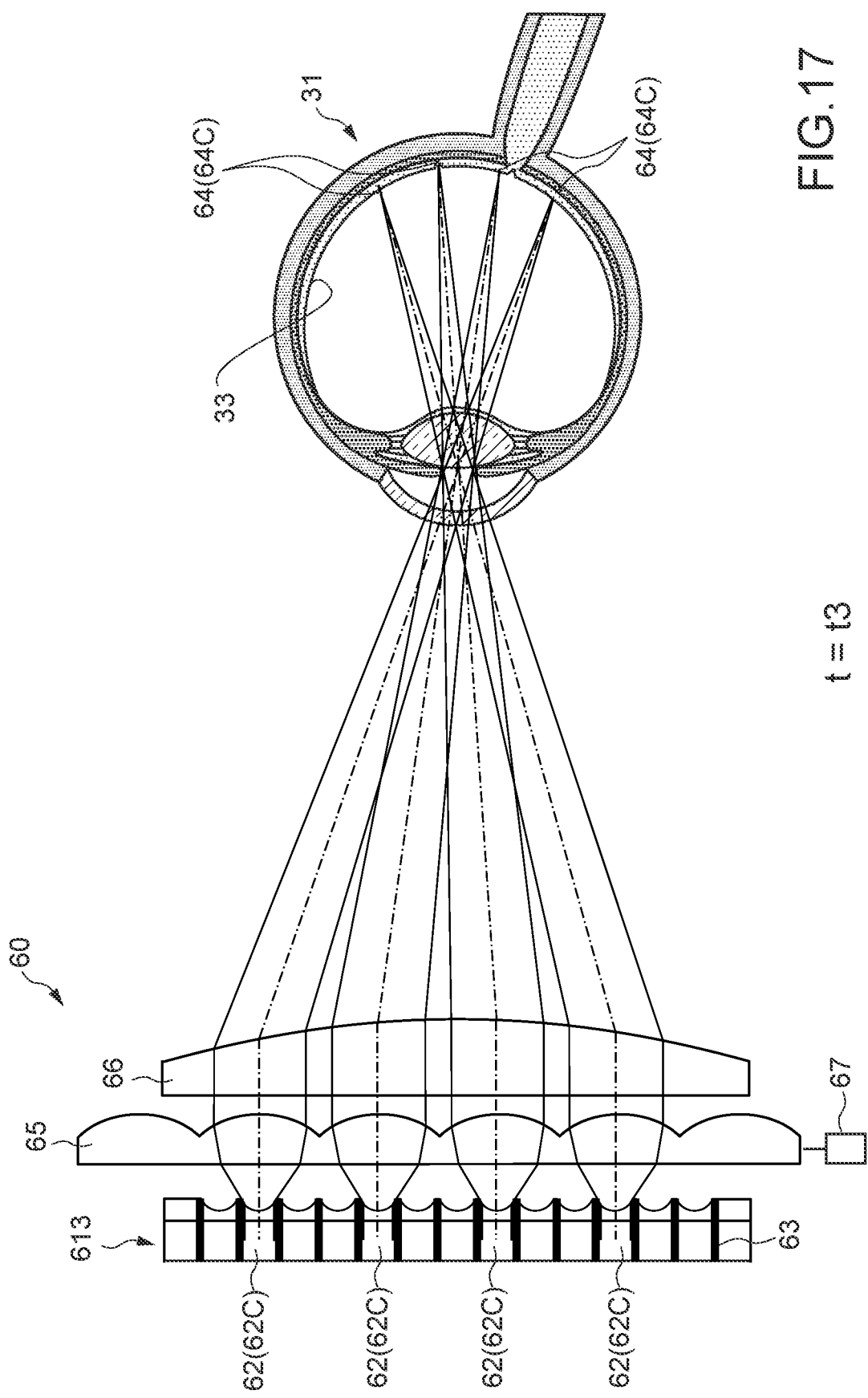
FIG. 17 A configuration diagram of the display apparatus (eyewear) according to the sixth embodiment.

FIGS. 15 and 17 are all configuration diagrams of the same display apparatus 60 and are diagrams for describing a scan. FIG. 15 shows a scan state at the time t1, FIG. 16 shows a scan state at the time t2, and FIG. 17 shows a scan state at the time t3. Assuming that the time elapses as t1, t2, and t3 in the stated order, the scan is performed in the order of FIG. 15, FIG. 16, and FIG. 17.

As shown in FIGS. 15 to 17, the light-emitting device 61 includes first light-emitting pixels 62A, second light-emitting pixels 62B, and third light-emitting pixels 62C. The first to third light-emitting pixels 62A to 62C are respectively at different positions and are positioned adjacent to each other. It should be noted that in a case where it is unnecessary to distinguish the first to third light-emitting pixels 62A to 62C, they will be referred to as light-emitting pixels 62. Moreover, hereinafter, desired light ray reaching positions on the retina 33 will be referred to as first reaching positions 64A, second reaching positions 64B, and third reaching positions 64C. In the example shown in the figure, the first to third reaching positions 64A to 64C are respectively positioned adjacent to each other. In a case where it is unnecessary to distinguish the first to third reaching positions 64A to 64C, they will be referred to as the reaching position 64.

As shown in FIG. 15, at the time t1, light rays emitted from the first light-emitting pixels 62A of the light-emitting device 61 are projected onto the first reaching positions 64A on the retina 33 of the eye 31 via the micro-lens array 65 and the plano-convex lens 66.

Thereafter, as shown in FIG. 16, at the time t2, driving of the actuator 67 moves the micro-lens array 65 upward in the figure by an amount corresponding to the pitch of the light-emitting pixels 62. In this state, light rays emitted from the second light-emitting pixels 62B of the light-emitting device 61 are projected onto the second reaching positions 64B on the retina 33 of the eye 31 via the micro-lens array 65 and the plano-convex lens 66.

Thereafter, as shown in FIG. 17, at the time t3, driving of the actuator 67 moves the micro-lens array 65 upward in the figure by an amount corresponding to the pitch of the light-emitting pixels 62. In this state, light rays emitted from the third light-emitting pixels 62C of the light-emitting device 61 are projected onto the third reaching positions 64C on the retina 33 via the micro-lens array 65 and the plano-convex lens 66.

In this manner, in the display apparatus 60, the micro-lens array 65 is mechanically scanned, the light-emitting pixels 62 that emit light rays in the light-emitting device 61 are shifted on a pixel-by-pixel basis, and the light rays are respectively projected onto the first to third reaching positions 64A to 64C that are different positions on the retina 33 in a time division manner. Accordingly, an image is displayed on the retina 33. When the scan is performed at a necessary frame rate, humans recognize a group of one-dimensional points projected and formed on the respective reaching positions as a two-dimensional image.

Accordingly, the resolution of the entire image projected onto the retina 33 can be increased.

As described above, the display apparatus 60 can display a high-resolution image on the retina 33.

Moreover, the display apparatus 60 has a small number of components and can be downsized.

Seventh Embodiment

Figure 18:
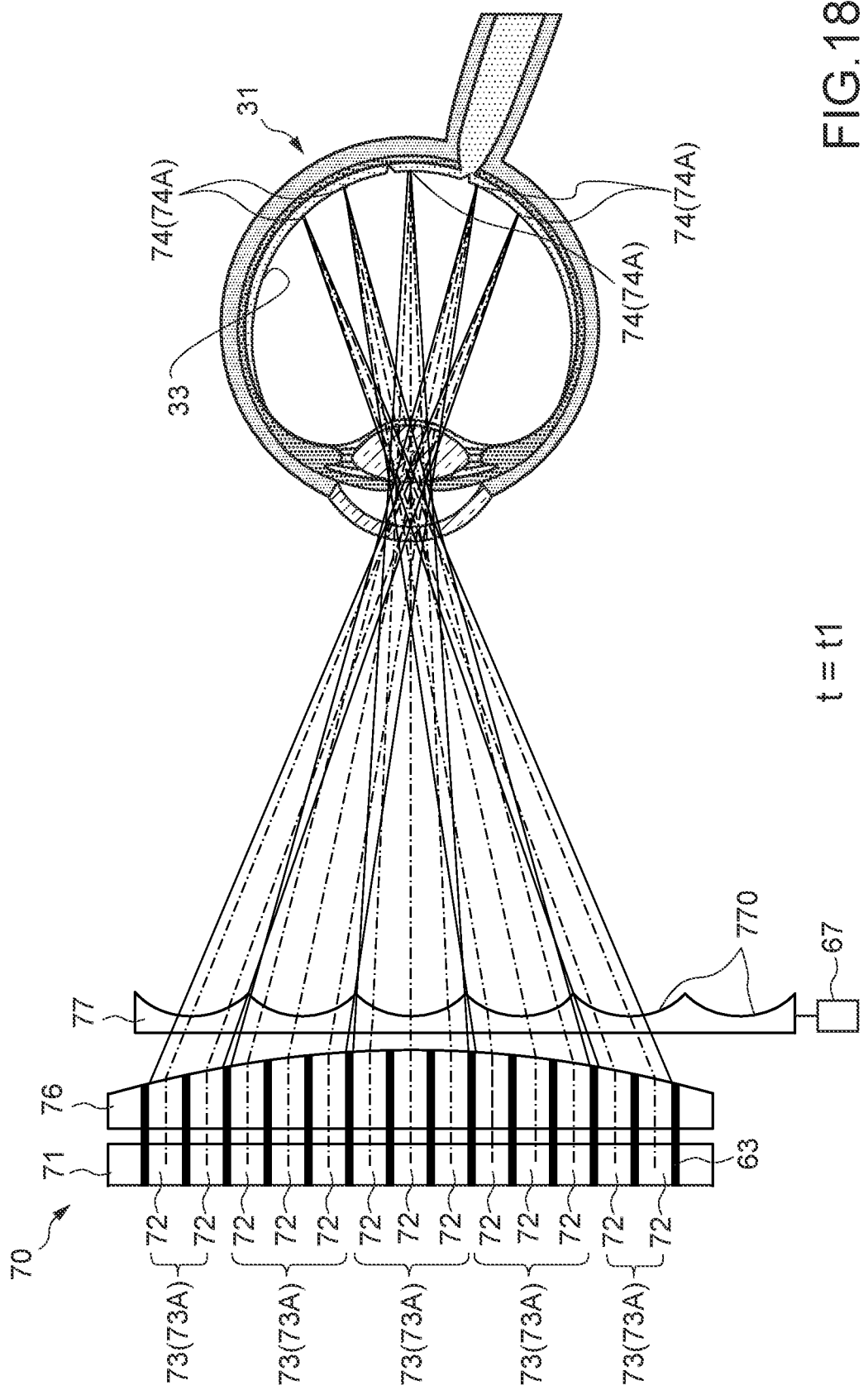
FIG. 18 A configuration diagram of a display apparatus (eyewear) according to a seventh embodiment.

FIG. 18 is a schematic configuration diagram of a display apparatus 70 applied to an eyewear according to a seventh embodiment.

As shown in FIG. 18, light rays emitted from the display apparatus 70 are projected onto the retina 33 of the eye 31, and an image is displayed on the retina 33. The display apparatus 70 is configured so that a light-emitting device 71, a plano-convex lens 76, and a micro-lens array 77 constituted by a plurality of micro concave lenses 770 are arranged in the stated order from a position further from the retina 33 to a position closer to the retina 33. In addition, the display apparatus 70 includes an actuator 67 that mechanically scans the micro-lens array 77.

The light-emitting device 71 includes a plurality of light-emitting pixels 72. Like the light-emitting device 1 described in the first embodiment, a light-emitting device including organic light-emitting diodes, inorganic light-emitting diodes, lasers, or the like, or a liquid-crystal panel including a backlight light source can be used as the light-emitting device 71.

The light-emitting device 71 is configured with the light-emitting pixels 72 arrayed two-dimensionally.

The plano-convex lens 76 is an optical system having a function of bending light rays made incident from the light-emitting device 71 in the direction of the pupil.

The micro-lens array 77 has a function of making incident light rays from the light-emitting pixel group 73 constituted by the plurality of light-emitting pixels 72, which have identical information, parallel or approximately parallel. Moreover, in the present embodiment, the micro-lens array 77 is configured to be physically movable by the actuator 67. Light rays made incident on the micro-lens array 77 are projected onto the retina 33 through the micro-lens array 77. The micro-lens array 77 includes the plurality of micro concave lenses 770 arrayed two-dimensionally.

In the present embodiment, the shielding walls 63 are provided in the light-emitting device 71 and the plano-convex lens 76, the light-emitting device 71 and the plano-convex lens 76 are fixed, and the micro-lens array 77 is configured to be movable.

In the present embodiment, the pixel pitch of the light-emitting pixels 72 is set to 9.9 μm and the pitch of the concave lenses 770 that constitute the micro-lens array 77 is set to 2,700 μm.

The pitch of the concave lenses 770 of the micro-lens array 77 is set to be larger than the pitch of the light-emitting pixels 72 of the light-emitting device 71. In a case where a distance between the light-emitting device 71 and the retina 33 is in a range of 30 mm to 40 mm, the pitch of the concave lenses 770 in the micro-lens array 77 is favorably more than 240 times the pitch of the light-emitting pixels 72 and less than 322 times the pitch of the light-emitting pixels 72. By setting the pitch of the concave lenses 770 in the micro-lens array 77 to be larger than the pixel pitch of the light-emitting pixels 72 of the light-emitting device 71 in this manner, the focal point on the retina can be made sufficiently small and the focusing degree can be increased. Accordingly, the resolution can be improved. In a case where the pitch of the concave lenses 770 in the micro-lens array 77 is more than 322 times the pitch of the light-emitting pixels 72, the frequency of a scan is 5 MHz or more, and technical problems in realizing it are bigger.

Some, a plurality of light-emitting pixels 72 selected from the plurality of light-emitting pixels 72 of the light-emitting device 71 constitutes one light-emitting pixel group 73. The plurality of light-emitting pixels 72 that constitutes the same light-emitting pixel group 73 simultaneously emits light rays having identical information. Light rays emitted from one light-emitting pixel group 73 are projected onto one reaching position 74 on the retina 33 like a spot. Thus, the spot projected onto the one reaching position 74 on the retina 33 is formed by the light rays from the plurality of light-emitting pixels 72. Accordingly, the effective area of light rays on the retina 33 can be increased and the resolution can be increased.

In addition, in the present embodiment, the micro-lens array 77 is mechanically scanned by the actuator 67, light rays are projected onto the retina 33, and an image is displayed. Accordingly, the resolution of the entire image projected onto the retina 33 can be increased.

Figure 20:
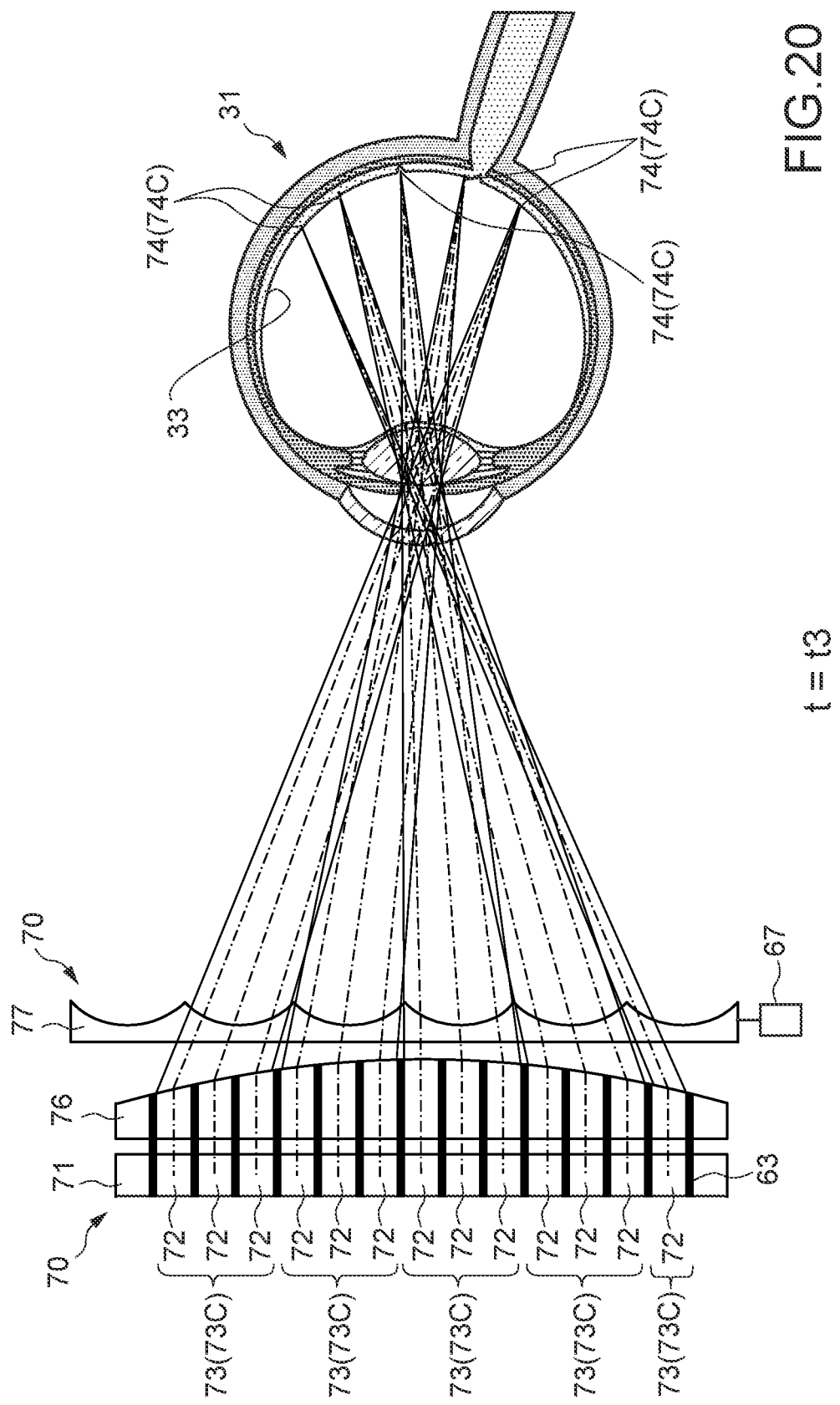
FIG. 20 A configuration diagram of the display apparatus (eyewear) according to the seventh embodiment.

FIGS. 18 and 20 are all configuration diagrams of the same display apparatus 70 and are diagrams for describing a scan.

In FIG. 18, a first light-emitting pixel group constituted by a plurality of light-emitting pixels 72 that outputs information identical to each other at the time t1 will be denoted by the reference sign 73A. In FIG. 18, the first reaching position on the retina 33 that light rays from the first light-emitting pixel group 73A reach at the time t1 will be denoted by the reference sign 74A.

Figure 19:
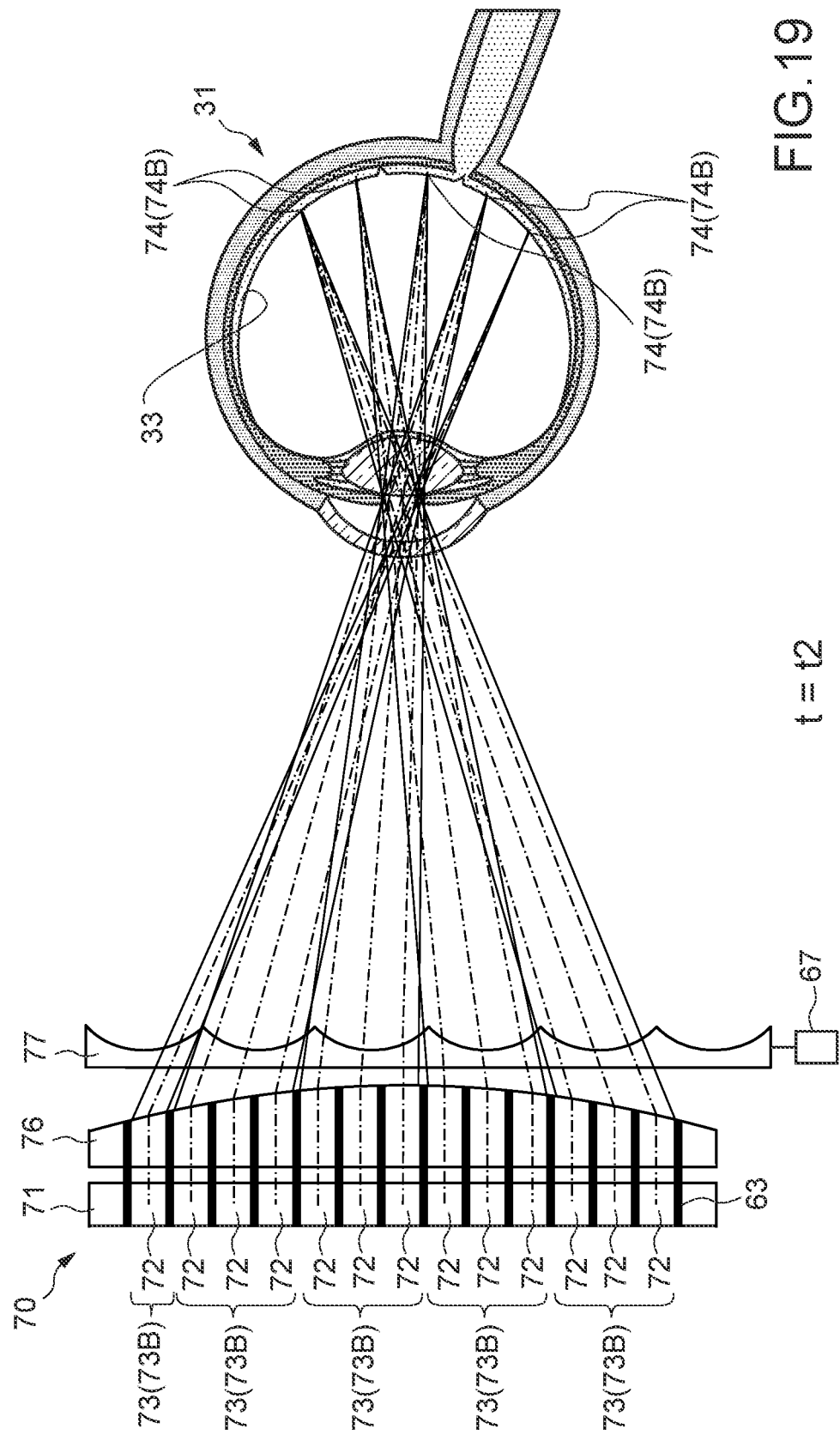
FIG. 19 A configuration diagram of the display apparatus (eyewear) according to the seventh embodiment.

In FIG. 19, a second light-emitting pixel group constituted by a plurality of light-emitting pixels 72 that outputs information identical to each other at the time t2 will be denoted by the reference sign 73B. In FIG. 19, the second reaching position on the retina 33 that light rays from the second light-emitting pixel group 73B reach at the time t2 will be denoted by the reference sign 74B.

In FIG. 20, a third light-emitting pixel group constituted by a plurality of light-emitting pixels 72 that outputs information identical to each other at the time t3 will be denoted by the reference sign 73C. In FIG. 20, the third reaching position on the retina 33 that light rays from the third light-emitting pixel group 73C reach at the time t3 will be denoted by the reference sign 74C.

Assuming that the time elapses as t1, t2, and t3 in the stated order, the scan is performed in the order of FIG. 18, FIG. 19, and FIG. 20. Unless it is particularly necessary to distinguish the first to third light-emitting pixel groups 73A to 73C, they will be referred to as light-emitting pixel groups 73. Unless it is particularly necessary to distinguish the first to third reaching positions 74A to 74C, they will be referred to as reaching positions 74. The size of a light ray emitted from one light-emitting pixel 72 is smaller than a size of a spot projected onto the reaching position 24 on the retina 33.

In FIG. 18, at the time t1, the plurality of light-emitting pixels 72 belonging to the same first light-emitting pixel group 73A simultaneously emits light rays of the identical information.

As shown in FIG. 18, at the time t1, the light rays emitted from the first light-emitting pixel group 73A are projected onto the first reaching position 74A on the retina 33 via the plano-convex lens 76 and the micro-lens array 77. Light rays from one first light-emitting pixel group 73A pass through one of the micro concave lenses 770 that constitute the micro-lens array 77 and form one spot on the first reaching position 74A on the retina 33. This spot is formed by light rays from the plurality of light-emitting pixels 72 that emits light rays having the identical information.

Thereafter, as shown in FIG. 19, driving of the actuator 67 moves the micro-lens array 77 upward in the figure by an amount corresponding to the pitch of the light-emitting pixels 72.

As shown in FIG. 19, at the time t2, the light rays emitted from the second light-emitting pixel group 73B are projected onto the second reaching position 74B on the retina 33 via the plano-convex lens 76 and the micro-lens array 77. Light rays from one second light-emitting pixel group 73B pass through one of the micro concave lenses 770 that constitute the micro-lens array 77 and form one spot on the second reaching position 74B on the retina 33. This spot is formed by light rays from the plurality of light-emitting pixels 72 that emits light rays having the identical information.

The first reaching position 74A, the second reaching position 74B, and the third reaching position 74C to be described later are, as in the second embodiment, different positions and are positioned adjacent to each other.

The light-emitting pixels 72 that constitute the first light-emitting pixel group 73A, the second light-emitting pixel group 73B, and the third light-emitting pixel group 73C to be described later, respectively, are not completely identical between the light-emitting pixel groups as in the second embodiment.

Thereafter, as shown in FIG. 20, driving of the actuator 67 moves the micro-lens array 77 upward in the figure by an amount corresponding to the pitch of the light-emitting pixels 72.

As shown in FIG. 20, at the time t3, light rays emitted from the third light-emitting pixel group 73C are projected onto the third reaching position 74C on the retina 33 via the plano-convex lens 76 and the micro-lens array 77. Light rays from one third light-emitting pixel group 73C pass through one of the micro concave lenses 770 that constitute the micro-lens array 77 and form one spot on the third reaching position 74C on the retina 33. This spot is formed by light rays from the plurality of light-emitting pixels 72 that emits light rays having the identical information.

In this manner, the micro-lens array 5 is scanned, and an image is displayed on the retina 33.

In the present embodiment, OLED Microdisplay (product number: WCX335B) in M-OLED series manufactured by Sony Group Corporation will be taken as an example of the light-emitting device 71. The light-emitting device 71 includes light-emitting pixels 72 with a size of 0.7 inches, 1920×RGB×1080 pixels. An estimated pixel size is 8.07 μm×8.07 μm.

Here, when light rays from the light-emitting device are projected onto a portion located at 34 mm away through a pinhole having a diameter of 213.32 μm, a spot of the light rays projected has a radius of 106.68 μm. A region of the pinhole diameter of 213.32 μm corresponds to 460 pixels in the light-emitting device.

A case where the light-emitting device 71 is used and a spot having a diameter of 12.6 μm is formed on the retina 33 at 34 mm away by using the micro-lens array 77 in which the pitch of the concave lenses 770 is 213.32 μm will be described as an example. The numerical value of 12.6 μm is set on the basis of a diameter of a photoreceptors and a distance between photoreceptors.

In order to obtain a spot whose airy disc formed by the Fraunhofer diffraction on the retina 33 (a length from the center of an airy pattern (brightest portion) to a first dark ring) has a radius of 6.3 μm, it is necessary to draw a region having a diameter of 2.7 mm in the light-emitting device 71. The region having a diameter of 2.7 mm in the light-emitting device 71 corresponds to 70,000 pixels. That is, using the 70,000 light-emitting pixels, a region having a diameter of about 12.6 μm can be drawn on the retina 33.

Figure 21:
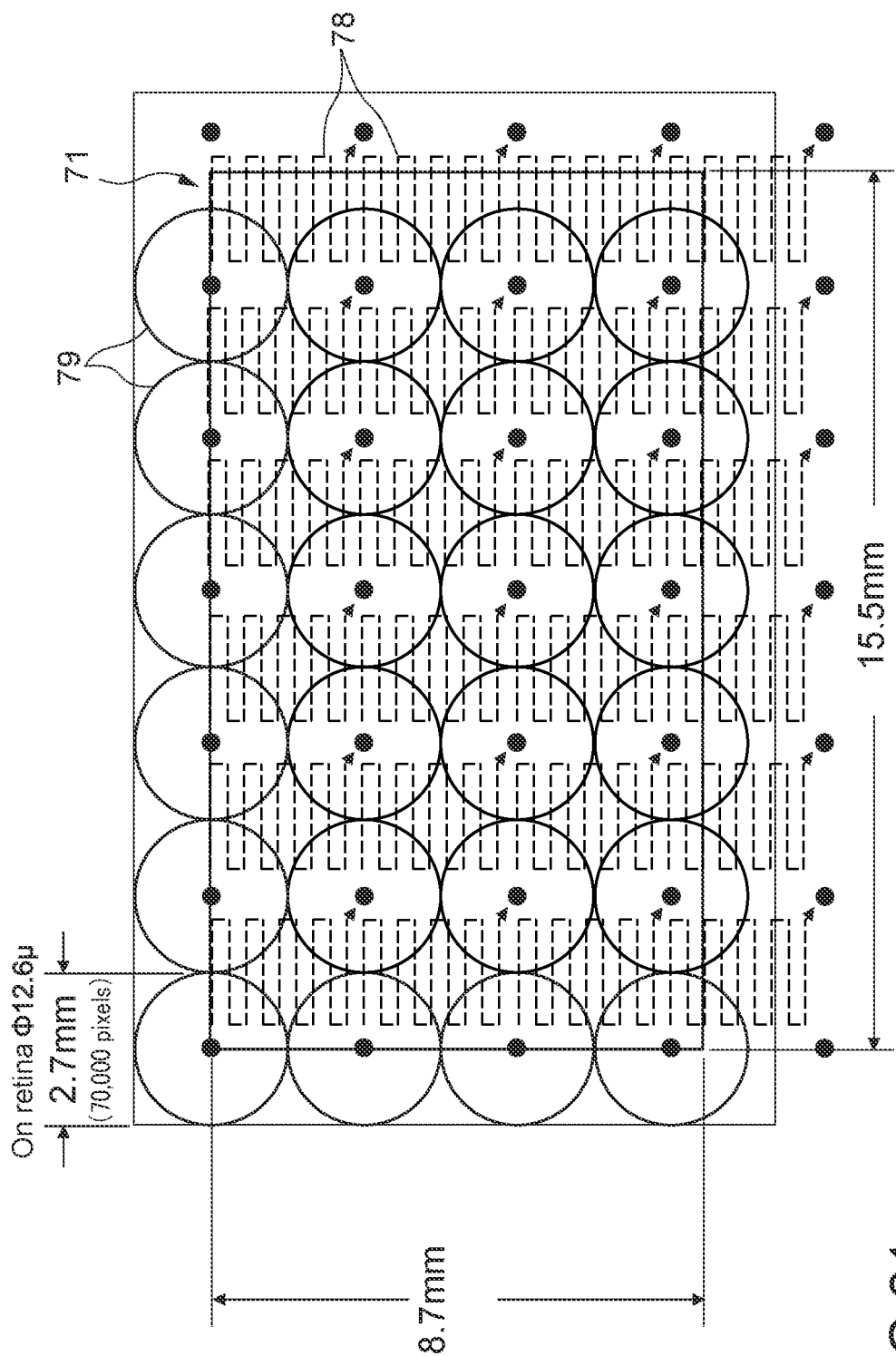
FIG. 21 A diagram for describing a scan in the display apparatus (eyewear) according to the seventh embodiment.

As described above, the micro-lens array 77 is mechanically scanned. Referring to FIG. 21, a scan of the micro-lens array 77 will be described. In FIG. 21, the rectangle of 8.7 mm×15.5 mm denotes the light-emitting device 71. The plurality of small circles denotes regions 79 equivalent to light-emitting pixels required in a case where one spot having a diameter of 12.6 μm is formed on the retina 33. In FIG. 21, the rectangular winding broken lines each extending rightward, downward, leftward, downward, and so on denote scanning trajectories 78 of the micro-lens array 77. The trajectories 78 denote relative movement of the micro-lens array 77 in relation to the light-emitting device 71. The trajectories 78 correspond to trajectories of center points of the regions 9. In the present embodiment, a scan is performed at a driving frequency of 3.6 MHz, for example. It should be noted that the shape of the trajectories 78 is not limited thereto, and can be a variety of shapes.

Next, a mutual positional relationship between the first to third light-emitting pixel groups, a mutual positional relationship between the first to third reaching positions, and a scan method will be described in more detail with reference to FIGS. 8A, 8B, 9A, 9B, 10A, and 10B.

FIG. 8A is a schematic view of an image 25 drawn on the retina 33. The image 25 is constituted by a plurality of reaching positions 24 arrayed virtually two-dimensionally. In FIG. 8A, an example in which eight (vertical) and eight (horizontal), a total of 64 reaching positions 74 will be described. Output information A1 to A8, B1 to B8, C1 to C8, D1 to D8, E1 to E8, F1 to F8, G1 to G8, and H1 to H8 output from the light-emitting pixel groups 73 are projected onto the respective reaching positions 74. In order to draw the image 25, the micro-lens array 77 is scanned.

FIG. 8B is illustrated with the trajectories 78 of the micro-lens array 77 shown as the thick lines superimposed on the image 25 shown in FIG. 8A. In FIG. 8B, for the sake of convenience, the trajectories 78 are illustrated, simplified as compared to the trajectories 78 shown in FIG. 21.

Hereinafter, a time sequential change of the output information from the light-emitting device 71 for drawing the image 25 will be described with reference to FIGS. 9A, 9B, 10A, and 10B. It should be noted that here, for the sake of convenience, the description will be given assuming that the number of light-emitting pixels that constitute one light-emitting pixel group is 9. Actually, the one light-emitting pixel group is constituted by 10,000 to 80,000 light-emitting pixels. The number of light-emitting pixels that constitute one light-emitting pixel group may be fixed or may be configured to be variable.

FIG. 9A shows an output information example from the light-emitting pixels 72 at the time t1 and FIG. 9B shows an output information example from the light-emitting pixels 72 at the time t2. FIG. 10A shows an output information example from the light-emitting pixels 72 at the time t3 and FIG. 10B shows an output information example from the light-emitting pixels 72 at the time t4. It is assumed that the time elapses as t1, t2, t3, and t4 in the stated order.

In each of the diagrams of FIGS. 9A, 9B, 10A, and 10B, the light-emitting device 71 is shown on the left-hand side and the image 25 drawn on the retina 33 is shown on the right-hand side. In FIGS. 9A, 9B, 10A, and 10B, one light-emitting pixel group 73 is shown, surrounded with the broken line. In FIGS. 9A, 9B, 10A, and 10B, the light-emitting device 71 is shown as the rectangle, and the respective light-emitting pixels 72 are shown, divided by a plurality of vertical broken lines and horizontal broken lines drawn in the light-emitting device 71. In the light-emitting device 71 of each of the respective diagrams of FIGS. 9A, 9B, 10A, and 10B, the letter such as A1 to A8, B1 to B8 . . . shown inside each of the light-emitting pixel 22s denotes output information that the light-emitting pixels 72 outputs. The light-emitting pixels 72 in which such letters denoting output information are not shown indicate that they are light-emitting pixels 72 that do not output information, i.e., that do not contribute to the display on the retina 33. In the image 25 drawn on the retina 33 in each of the respective diagrams of FIGS. 9A, 9B, 10A, and 10B, at that time, letters denoting the output information of the reaching positions 74 onto which the output information is projected are shown as the solid letters and letters denoting the output information of the reaching positions 74 onto which the output information is not projected are shown as the hollow letters.

In the present embodiment, the light-emitting pixels 72 used for drawing on the retina 33 are changed over time, the micro-lens array 77 is mechanically scanned, and the reaching positions of the light rays on the retina 33 are changed.

As shown in the trajectories 78 shown in FIGS. 8B and 9A, at the time t1, output information A1, A4, A7, D1, D4, D7, G1, G4, G7 is projected onto each of the plurality of first reaching positions 74A on the retina 33. Light rays (output information) from one first light-emitting pixel group 73A is projected onto one first reaching position 74A. Light-emitting pixels 72 belonging to the same one first light-emitting pixel group 73A output identical information. That is, light rays corresponding to nine light-emitting pixels 72 in the light-emitting device 71 are projected onto one first reaching position 74A on the retina 33.

As shown in FIG. 9A, the plurality of first reaching positions 74A is spaced apart from each other.

Subsequently, as shown in the trajectories 78 shown in FIGS. 8B and 9B, at the time t2, driving of the actuator 67 moves the micro-lens array 77, and output information A2, A5, A8, D2, D5, D8, G2, G5, G8 is projected onto each of the plurality of second reaching positions 74B on the retina 33. Light rays from one second light-emitting pixel group 73B are projected onto one second reaching position 74B. Light-emitting pixels 72 belonging to the same one second light-emitting pixel group 73B output identical information. That is, light rays corresponding to nine light-emitting pixels 72 in the light-emitting device 71 are projected onto one second reaching position 74B on the retina 33.

As shown in FIG. 9B, the plurality of second reaching positions 74B is spaced apart from each other. The second reaching position 74B is adjacent to the first reaching position 74A and the third reaching position 74C to be described later.

Moreover, as shown in FIGS. 9A and 9B, in the light-emitting device 71, the second light-emitting pixel group 73B is constituted by the light-emitting pixels 72 obtained when the first light-emitting pixel group 73A is shift rightward in the figure by an amount corresponding to one pixel as a whole. That is, the plurality of light-emitting pixels 72 that constitutes the first light-emitting pixel group 73A and the plurality of light-emitting pixels 72 that constitutes the second light-emitting pixel group 73B are partially the same while the other portions are different. In short, they are not completely identical.

Subsequently, as shown in the trajectories 78 shown in FIGS. 8B and 10A, at the time t3, driving of the actuator 67 moves the micro-lens array 77, and output information A3, A6, D3, D6, G3, G8 is projected onto each of the plurality of third reaching positions 74C on the retina 33. Light rays from one third light-emitting pixel group 73C are projected onto one third reaching position 74C. Light-emitting pixels 72 belonging to the same one third light-emitting pixel group 73C output identical information. That is, light rays corresponding to nine light-emitting pixels 72 in the light-emitting device 71 are projected onto one third reaching position 74C on the retina 33.

As shown in FIG. 10A, the plurality of third reaching positions 74C is spaced apart from each other.

Moreover, as shown in FIGS. 9B and 10A, in the light-emitting device 71, the third light-emitting pixel group 73C is constituted by the light-emitting pixels 72 obtained when the second light-emitting pixel group 73B is shift rightward in the figure by an amount corresponding to one pixel as a whole. That is, the plurality of light-emitting pixels 72 that constitutes the second light-emitting pixel group 73B and the plurality of light-emitting pixels 72 that constitutes the third light-emitting pixel group 73C are partially the same while the other portions are different. In short, they are not completely identical. Moreover, the plurality of light-emitting pixels 72 that constitutes the third light-emitting pixel group 73C and the plurality of light-emitting pixels 72 that constitutes the first light-emitting pixel group 73A are partially the same while the other portions are different. In short, they are not completely identical.

Subsequently, as shown in the trajectories 78 shown in FIGS. 8B and 10B, at the time t4, driving of the actuator 67 moves the micro-lens array 77, and output information B3, B6, E3, E6, H3, H6 is projected onto each of a plurality of fourth reaching positions 74D on the retina 33. A case where those that have been scanned rightward are here scanned downward as in the trajectories 78 shown in FIG. 8B is shown. Light rays from one fourth light-emitting pixel group 73D are projected onto one fourth reaching position 74D. The light-emitting pixels 72 belonging to the same one fourth light-emitting pixel group 73D output identical information. That is, light rays corresponding to nine light-emitting pixels 72 in the light-emitting device 71 are projected onto one fourth reaching position 74D on the retina 33.

As shown in FIG. 10B, the plurality of fourth reaching positions 74D is spaced apart from each other.

As shown in FIGS. 10A and 10B, in the light-emitting device 71, the fourth light-emitting pixel group 73D is constituted by the light-emitting pixels 72 obtained when the third light-emitting pixel group 73C is shift downward in the figure by an amount corresponding to one pixel as a whole. That is, the plurality of light-emitting pixels 72 that constitutes the third light-emitting pixel group 73C and the plurality of light-emitting pixels 72 that constitutes the fourth light-emitting pixel group 73D are partially the same while the other portions are different. In short, they are not completely identical. Moreover, the plurality of light-emitting pixels 72 that constitutes the fourth light-emitting pixel group 73D and the light-emitting pixels 72 of each of the first to third light-emitting pixel groups 73A to 73C are partially the same while the other portions are different. In short, they are not completely identical.

Next, although the illustrations of the output information examples as shown in FIGS. 9A, 9B, 10A, and 10B will be omitted, as shown in the trajectories 78 of FIG. 8B, at the time t5, driving of the actuator 67 moves the micro-lens array 77, and output information B2, B5, B8, E2, E5, E8, H2, H5, H8 is projected onto each of a plurality of fifth reaching positions 74E on the retina 33.

Subsequently, as shown in the trajectories 78 of FIG. 8B, at the time t6, driving of the actuator 67 moves the micro-lens array 77, and output information B1, B4, B7, E1, E4, E7, H1, H4, H7 is projected onto each of a plurality of sixth reaching positions 74F on the retina 33.

Subsequently, as shown in the trajectories 78 of FIG. 8B, at the time t7, driving of the actuator 67 moves the micro-lens array 77, and output information C1, C4, C7, F1, F4, F7 is projected onto each of a plurality of seventh reaching positions 74G on the retina 33.

Subsequently, as shown in the trajectories 78 of FIG. 8B, at the time t8, driving of the actuator 67 moves the micro-lens array 77, and output information C2, C5, C8, F2, F5, F8 is projected onto each of a plurality of eighth reaching positions 74H on the retina 33.

Subsequently, as shown in the trajectories 78 of FIG. 8B, at the time t9, driving of the actuator 67 moves the micro-lens array 77, and output information C3, C6, F3, F6 is projected onto each of a plurality of ninth reaching positions 24I on the retina 33.

Also at those times t5 to t9, as at the above-mentioned times t1 to t4, information (light rays) is projected onto one reaching position 74 on the retina 33 from one light-emitting pixel group 73 constituted by the plurality of light-emitting pixels 72 that emits light rays of the identical information.

In this manner, the reaching positions 74 of the light rays on the retina 33 change over time. A scan is performed in the display apparatus 70 so that the reaching positions 74 sequentially move to the next positions in accordance with an elapsed time.

As described above, since the display apparatus 70 projects light rays having the identical information emitted from the plurality of light-emitting pixels 72 onto one reaching position 74 on the retina 33, the resolution of a displayed image can be increased.

In addition, in the display apparatus 70, the micro-lens array 77 is mechanically scanned. In the light-emitting device 71, the light-emitting pixels 72 that constitute the light-emitting pixel groups 73 change to be shifted on a pixel-by-pixel basis in accordance with an elapsed time, and the light-emitting pixel group is configured. Then, light rays from one light-emitting pixel group are respectively projected onto the respective reaching positions 74 that are different positions on the retina 33 in a time division manner. Accordingly, the image 25 is displayed on the retina 33. Humans recognize a group of one-dimensional points projected and formed on the respective reaching positions as a two-dimensional image.

By mechanically scanning the micro-lens array 77 as described above, the resolution of the entire image projected onto the retina 33 can be increased. Moreover, since the light-emitting pixel group is configured in such a manner that the light-emitting pixels 72 that constitute the light-emitting pixel groups 73 are shifted on a pixel-by-pixel basis in accordance with an elapsed time, information corresponding to the number of light-emitting pixels 72 of the light-emitting device 71 can be projected and the information corresponding to the number of light-emitting pixels 72 can be reflected on the retina 33. The resolution of the entire image can be thus increased.

It should be noted that in the present embodiment, the example in which the plurality of light-emitting pixels 72 that constitutes the light-emitting pixel group 73 constituted by the plurality of light-emitting pixels 72 that outputs identical information at each of the times t1 to t3 are changed has been described, but the plurality of light-emitting pixels that constitutes the light-emitting pixel group may be configured not to be changed over time.

As described above, the display apparatus 70 can display a high-resolution image on the retina 33.

Moreover, the display apparatus 70 has a small number of components and can be downsized.

Moreover, in the eyewear that displays an image on the retina, output information from the light-emitting device 71 may be controlled considering characteristics of the retina 33 of the eye 31. Accordingly, the driving frequency can be lowered and a high frame rate can be provided. Hereinafter, it will be described with reference to FIGS. 23 and 25.

Since the diameter of a fovea centralis is about 400 μm, a distance between photoreceptors is about 2 μm, and the fovea centralis mainly has cone cells, about 20,106 cone cells exist in the fovea centralis on the basis of calculation. Associating one cone cell with one pixel, 20,106 cone cells are expressed as about 142 pixels×about 142 pixels. Provided that the pixel size in the light-emitting device is 9.9 μm×9.9 μm, about 20,000 cone cells, i.e., a fovea centralis region corresponds to a region of 1.4 mm×1.4 mm in the light-emitting device.

Figure 23:
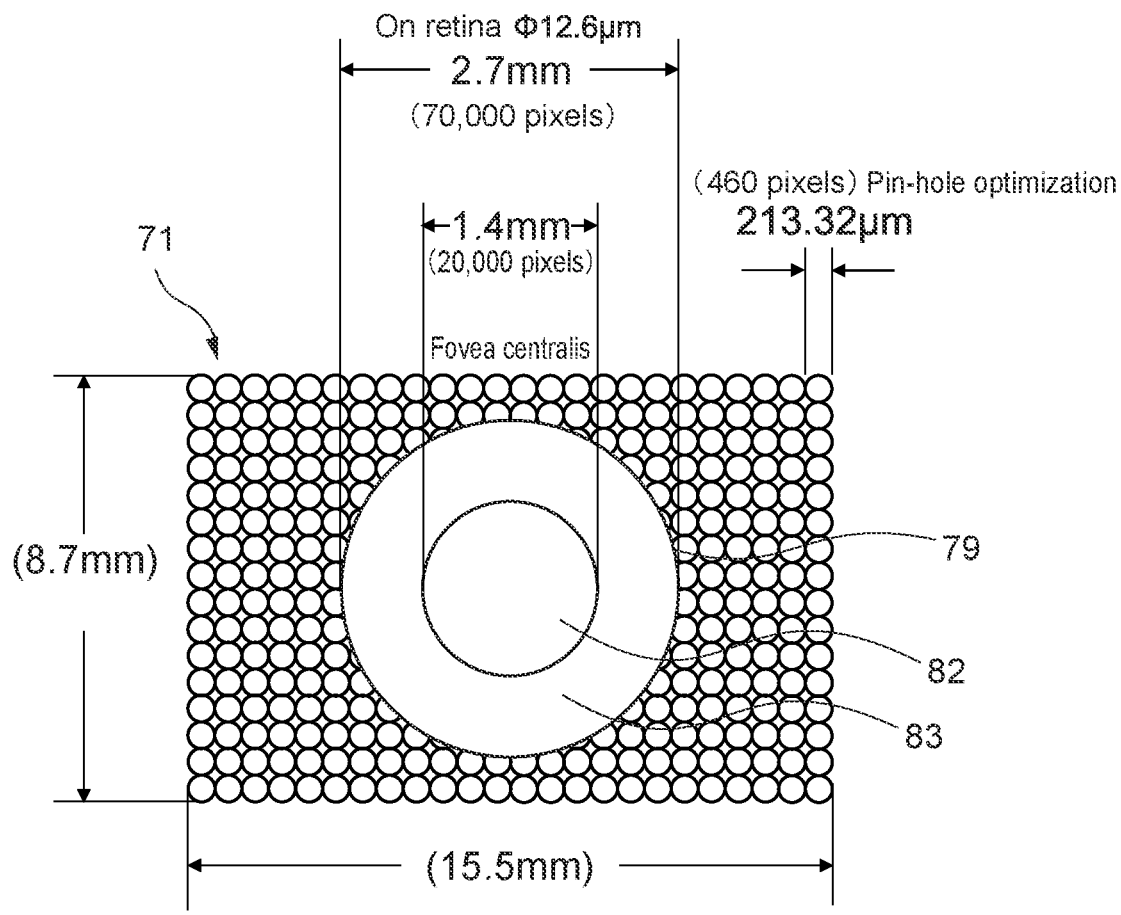
FIG. 23 A schematic view for describing a correspondence between light-emitting pixels that constitute the display apparatus (eyewear) according to the seventh embodiment and a fovea centralis.
Figure 24:
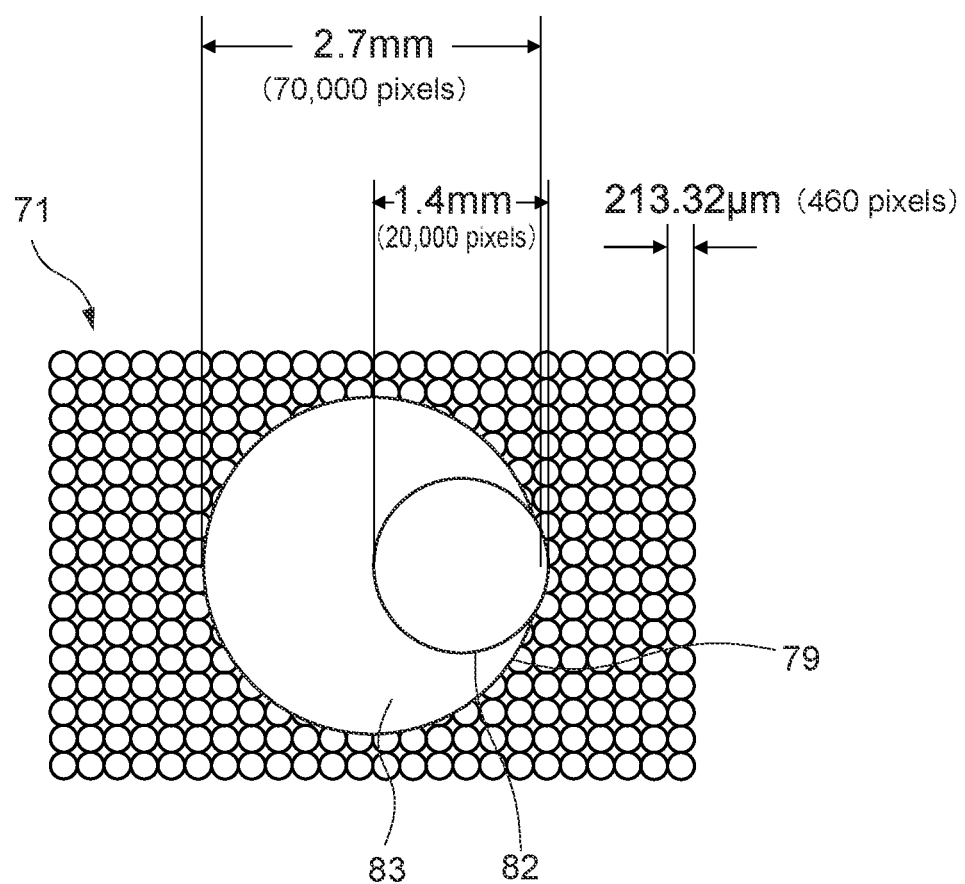
FIG. 24 A schematic view for describing a correspondence between light-emitting pixels that constitute the display apparatus (eyewear) according to the seventh embodiment and a fovea centralis.

FIGS. 23 and 24 are diagrams schematically showing a correspondence between the light-emitting pixels 72 of the light-emitting device 71 and the fovea centralis 32. In FIGS. 23 and 24, the large circle denotes a region 79 corresponding to a spot having a diameter of 12.6 μm on the retina 33. It is assumed that the region 79 has a region corresponding to the fovea centralis 32. The medium circle positioned in the region 79 denotes a fovea centralis corresponding region 82 corresponding to the fovea centralis.

The region 79 has a diameter of 2.7 mm and the region 79 corresponds to light-emitting pixels 72 corresponding to about 70,000 pixels in the light-emitting device 71.

The fovea centralis corresponding region 82 has a diameter of 1.4 mm and the fovea centralis corresponding region 82 corresponds to light-emitting pixels 72 corresponding to about 20,000 pixels in the light-emitting device 71.

The region 79 includes the fovea centralis corresponding region 82 and a peripheral region 83 corresponding to a peripheral portion of the fovea centralis corresponding region 82. The peripheral region 83 corresponds to light-emitting pixels 72 corresponding to about 50,000 pixels in the light-emitting device 71.

In the figure, each of the small circles arrayed two-dimensionally denotes a size of an optimal pinhole. One pinhole corresponds to light-emitting pixels 72 corresponding to about 460 pixels.

FIG. 23 shows a case where the pupil 36 is located at the center of the eye as the eye 31 is viewed from the front. FIG. 24 shows a case where the pupil 36 is located at the edge of the eye as the eye 31 is viewed from the front.

As described above, the image resolution that the eye 31 recognizes is deeply associated with the cone cells. In view of this, the light-emitting device 71 controls to densely output information at the fovea centralis corresponding region 82 of the image drawn in the retina 33, which corresponds to the fovea centralis 32 having many cone cells, and to sparsely output information at the peripheral region 83 of the image drawn in the retina 33, which corresponds to the peripheral portion of the fovea centralis 32 hardly having cone cells. Accordingly, the driving frequency can be lowered while maintaining the quality of the image that the eye recognizes.

Specifically, for example, as for the light-emitting pixels 72 corresponding to about 20,000 pixels of the fovea centralis corresponding region 82, all of them are caused to output information. In a case where about 20,000 pixels of the fovea centralis corresponding region 82 are driven at a 30-frame rate, the driving frequency is 605 kHz. On the other hand, as for the light-emitting pixels 72 corresponding to about 50,000 pixels of the peripheral region 83, they are caused to output information smaller in amount than the number of existing pixels by thinning without using all the pixels or averaging a plurality of pixels, for example.

Accordingly, as compared to a case where the information is uniformly and densely output in the entire region 79 having a diameter of 2.7 mm, the driving frequency can be lowered while maintaining the quality of the image that the eye recognizes. Accordingly, a high frame rate can be provided and a moving image more natural to human eyes can be presented. Moreover, the power consumption can be reduced.

Here, for example, in a case where 70,000 pixels of the region 79 having a diameter of 2.7 mm are driven at a 30-frame rate, the driving frequency is 3.6 MHz. Also in this case, although a moving image natural to human eyes can be presented, a moving image more natural to human eyes can be presented by changing the way of outputting an image between the fovea centralis corresponding region 82 and the peripheral region 83 as described above.

As described above, in accordance with characteristics of cones and rods located in the retina, a drawing method can be changed between the fovea centralis 32 and its peripheral portion, and the resolution and motion of image or information projected onto the retina can be changed. Accordingly, resolution recognition, moving-object recognition, smooth-motion recognition can be realized by output of an adequate amount of information. As a result, the power consumption of the light-emitting device can be reduced.

Moreover, besides the display apparatus 70, a sensing device such as an image pickup device that senses the motion of the pupil 36 of the eye 31 of the user may be installed. On the basis of a change in pupil motion acquired by the sensing device, the information output from the light-emitting device 71 or the driving of the micro-lens array 77 may be controlled so that light rays from the light-emitting device 71 are reliably projected onto the pupil 36 also when the relative position, relative direction, and the like between the pupil 36 and the light-emitting device 71 change. Accordingly, the user can continue to view the image even when the pupil position changes.

Moreover, a sensing device may be installed in the display apparatus 70 for sensing a tilt of the display apparatus 70 itself. On the basis of a change in position of the display apparatus 70 acquired by the sensing device, the information output from the light-emitting device 71 or the driving of the micro-lens array 77 may be controlled so that light rays from the light-emitting device 71 are reliably projected onto the pupil also when the relative position, relative direction, and the like between the pupil and the light-emitting device 71 change.

Either one of the sensing device that senses a pupil motion and the sensing device that senses a tilt of the display apparatus 70 may be used or both may be used.

Figure 25:
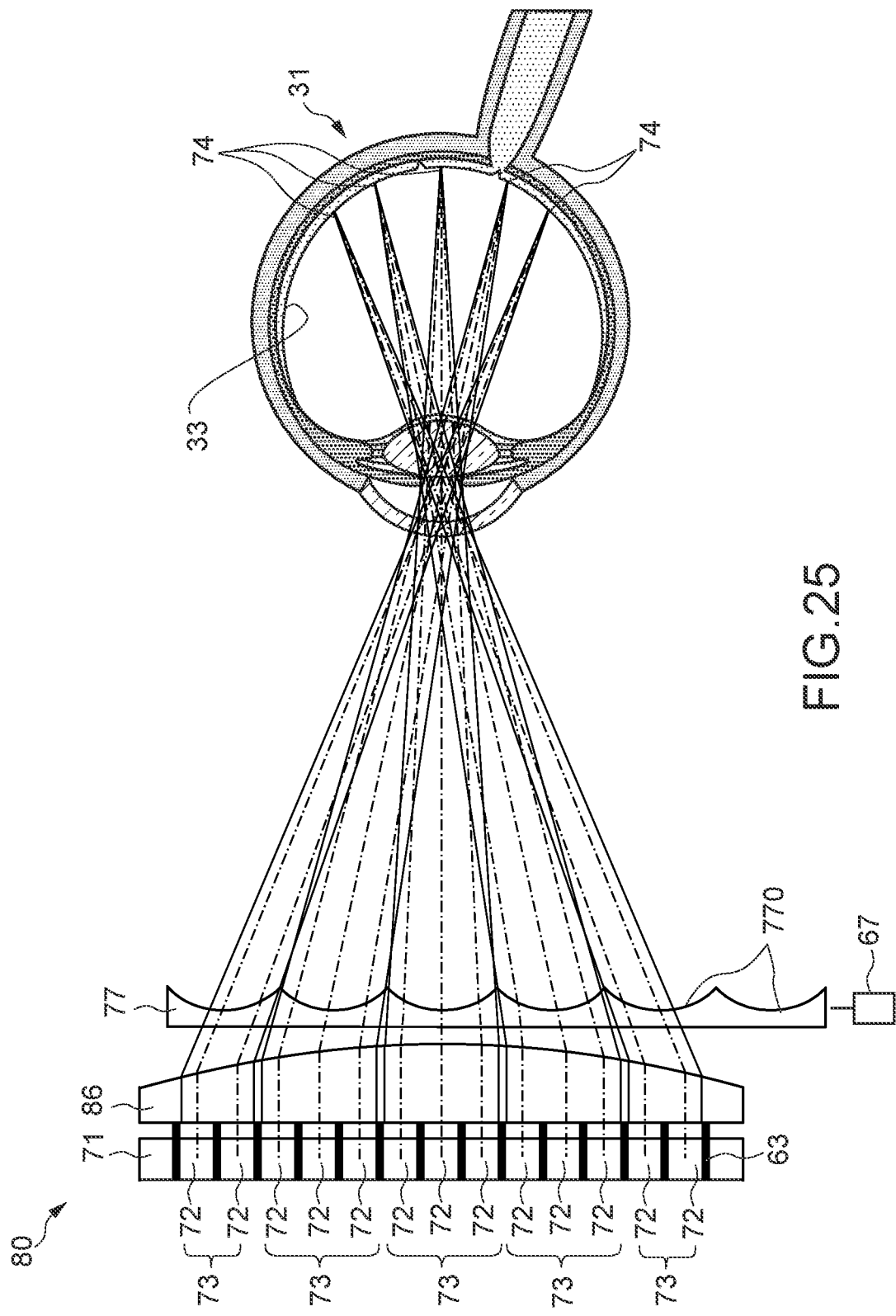
FIG. 25 A configuration diagram of a display apparatus (eyewear) according to an eighth embodiment.

Moreover, when the user moves the line of sight and the pupil 36 moves to the edge of the eye 31 as viewed from the front, the position of the fovea centralis corresponding region 82 in the light-emitting device 71 changes as shown in FIG. 25. In such a case, in accordance with the position of the fovea centralis corresponding region 82, the light-emitting device 71 may be controlled to cause the light-emitting pixels 72 of the fovea centralis corresponding region 82 to densely output information and to cause the light-emitting pixels 72 corresponds to the peripheral region 83 to sparsely output information. Accordingly, also when the relative position, relative direction, and the like between the pupil 36 and the light-emitting device 71 change, the driving frequency can be lowered while maintaining the quality of the image that the eye recognizes.

Next, other display apparatuses applied to the eyewear will be described as eighth to seventeenth embodiments. Like the above-mentioned seventh embodiment, these embodiments all have an aspect in which light rays emitted from the light-emitting pixel group 73 (or 153) constituted by the plurality of light-emitting pixels 72 (or 152) of the light-emitting device 71 (or 151), which outputs identical information, are projected onto one reaching position 74 on the retina 33. A scan in each of the following embodiments is similar to that of the light-emitting device according to the seventh embodiment. Therefore, the descriptions will be omitted.

Eighth Embodiment

FIG. 25 is a schematic configuration diagram of a display apparatus 80 applied to an eyewear according to an eighth embodiment.

As shown in FIG. 25, light rays emitted from the display apparatus 80 are projected onto the retina 33 of the eye 31, and an image is displayed on the retina 33. The display apparatus 80 is configured so that a light-emitting device 71, a plano-convex lens 86, and a micro-lens array 77 constituted by a plurality of micro concave lenses 770 are arranged in the stated order from a position further from the retina 33 to a position closer to the retina 33. In addition, the display apparatus 80 includes an actuator 67 that mechanically scans the micro-lens array 77.

In the present embodiment, the shielding walls 63 are provided in the light-emitting device 71. The light-emitting device 71 and the plano-convex lens 86 are fixed and the micro-lens array 77 is configured to be movable.

Ninth Embodiment

Figure 26:
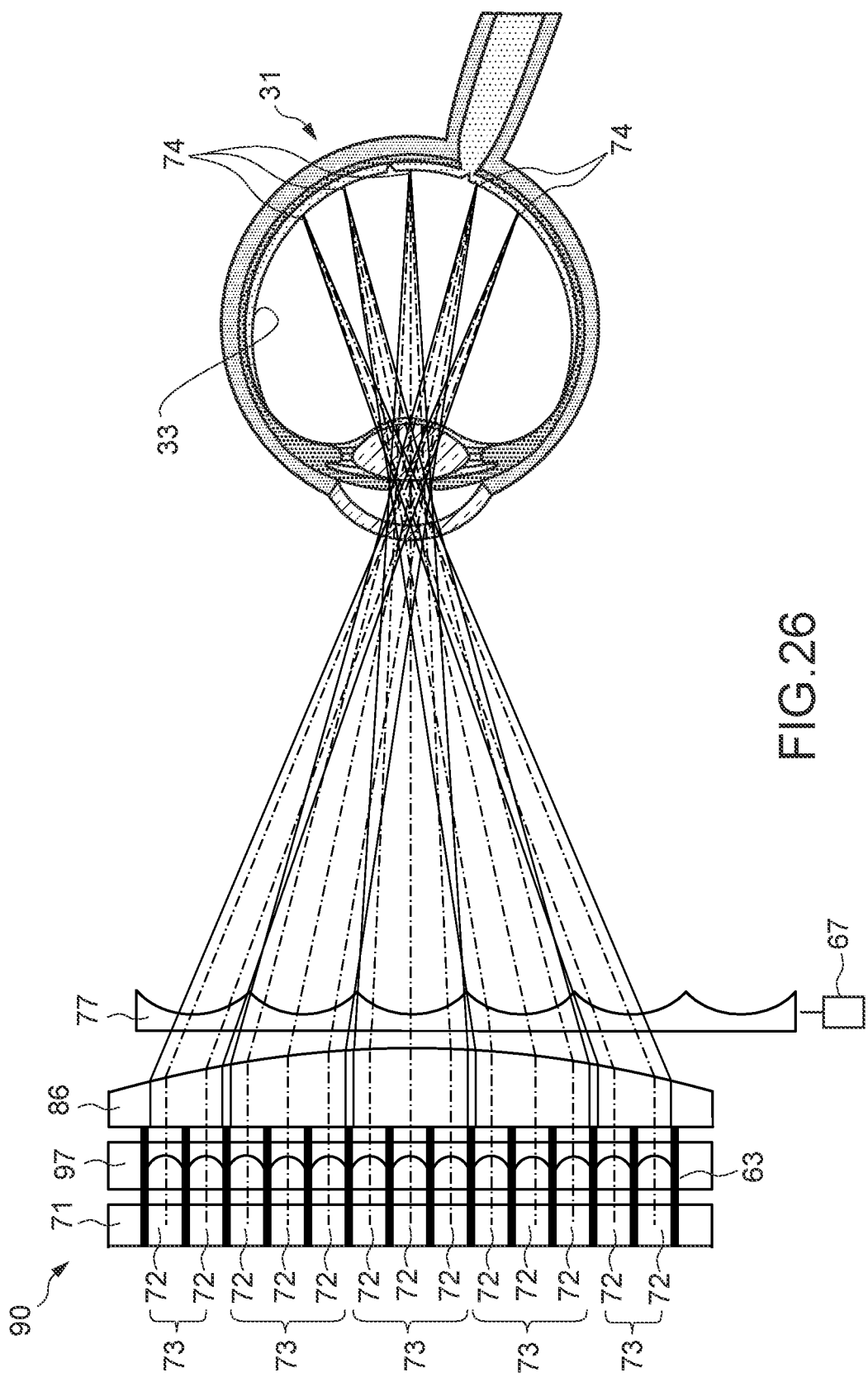
FIG. 26 A configuration diagram of a display apparatus (eyewear) according to a ninth embodiment.

FIG. 26 is a schematic configuration diagram of a display apparatus 90 applied to an eyewear according to a ninth embodiment.

As shown in FIG. 26, light rays emitted from the display apparatus 90 are projected onto the retina 33 of the eye 31, and an image is displayed on the retina 33. The display apparatus 90 is configured so that a light-emitting device 71, a collimator lens 97, a plano-convex lens 86, and a micro-lens array 77 constituted by a plurality of micro concave lenses 770 are arranged in the stated order from a position further from the retina 33 to a position closer to the retina 33. In addition, the display apparatus 90 includes an actuator 67 that mechanically scans the micro-lens array 77.

In the present embodiment, the shielding walls 63 are provided in the light-emitting device 71 and the collimator lens 97. The light-emitting device 71, the collimator lens 97, and the plano-convex lens 86 are fixed and the micro-lens array 77 is configured to be movable.

Tenth Embodiment

Figure 27:
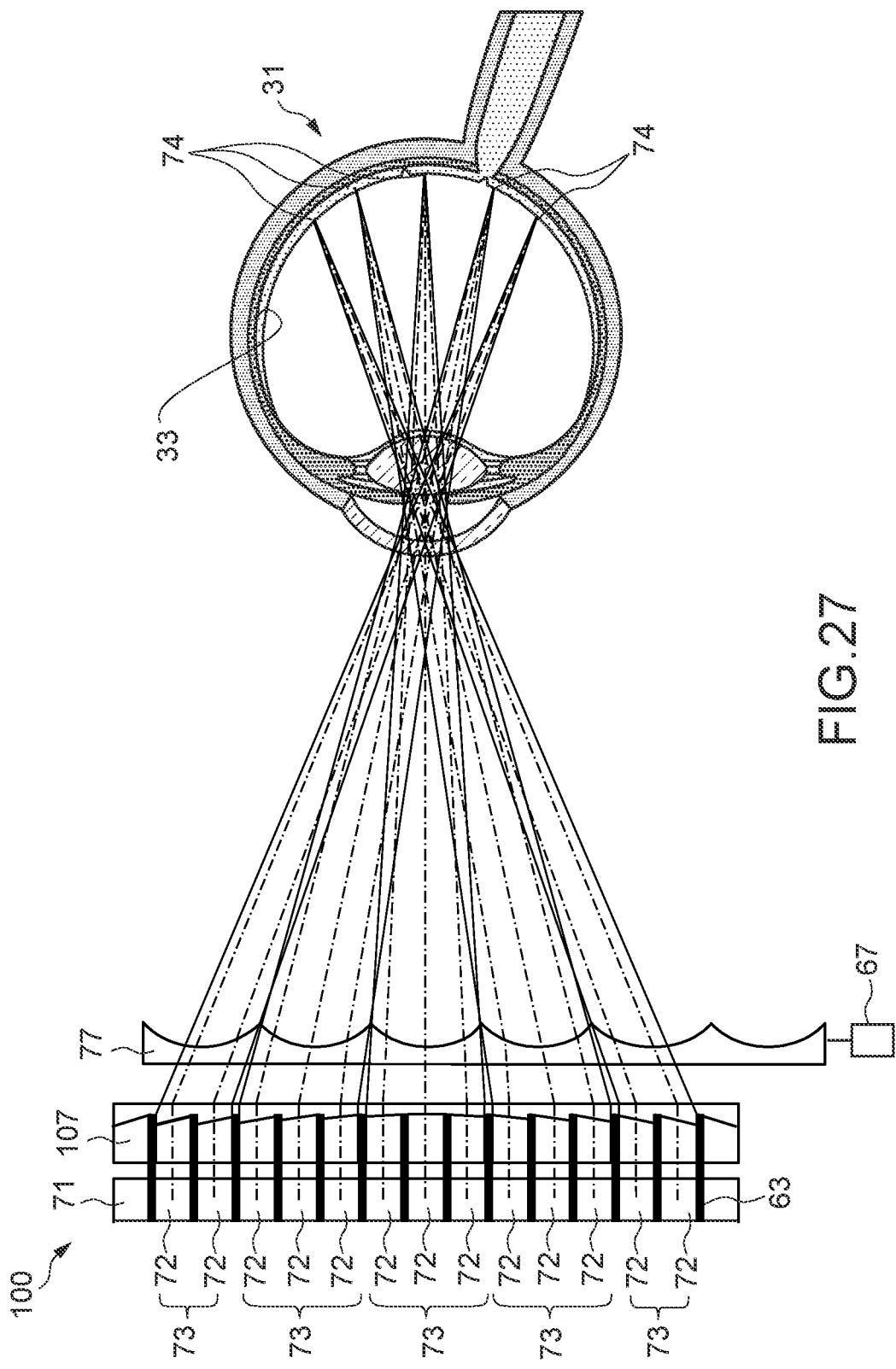
FIG. 27 A configuration diagram of a display apparatus (eyewear) according to a tenth embodiment.

FIG. 27 is a schematic configuration diagram of a display apparatus 100 applied to an eyewear according to a tenth embodiment.

As shown in FIG. 27, light rays emitted from the display apparatus 100 are projected onto the retina 33 of the eye 31, and an image is displayed on the retina 33. The display apparatus 100 is configured so that a light-emitting device 71, and a Fresnel lens 107, a micro-lens array 77 constituted by a plurality of micro concave lenses 770 are arranged in the stated order from a position further from the retina 33 to a position closer to the retina 33. In addition, the display apparatus 100 includes an actuator 67 that mechanically scans the micro-lens array 77.

In the present embodiment, the shielding walls 63 are provided in the light-emitting device 71 and the Fresnel lens 107. The light-emitting device 71 and the Fresnel lens 107 are fixed and the micro-lens array 77 is configured to be movable.

Eleventh Embodiment

Figure 28:
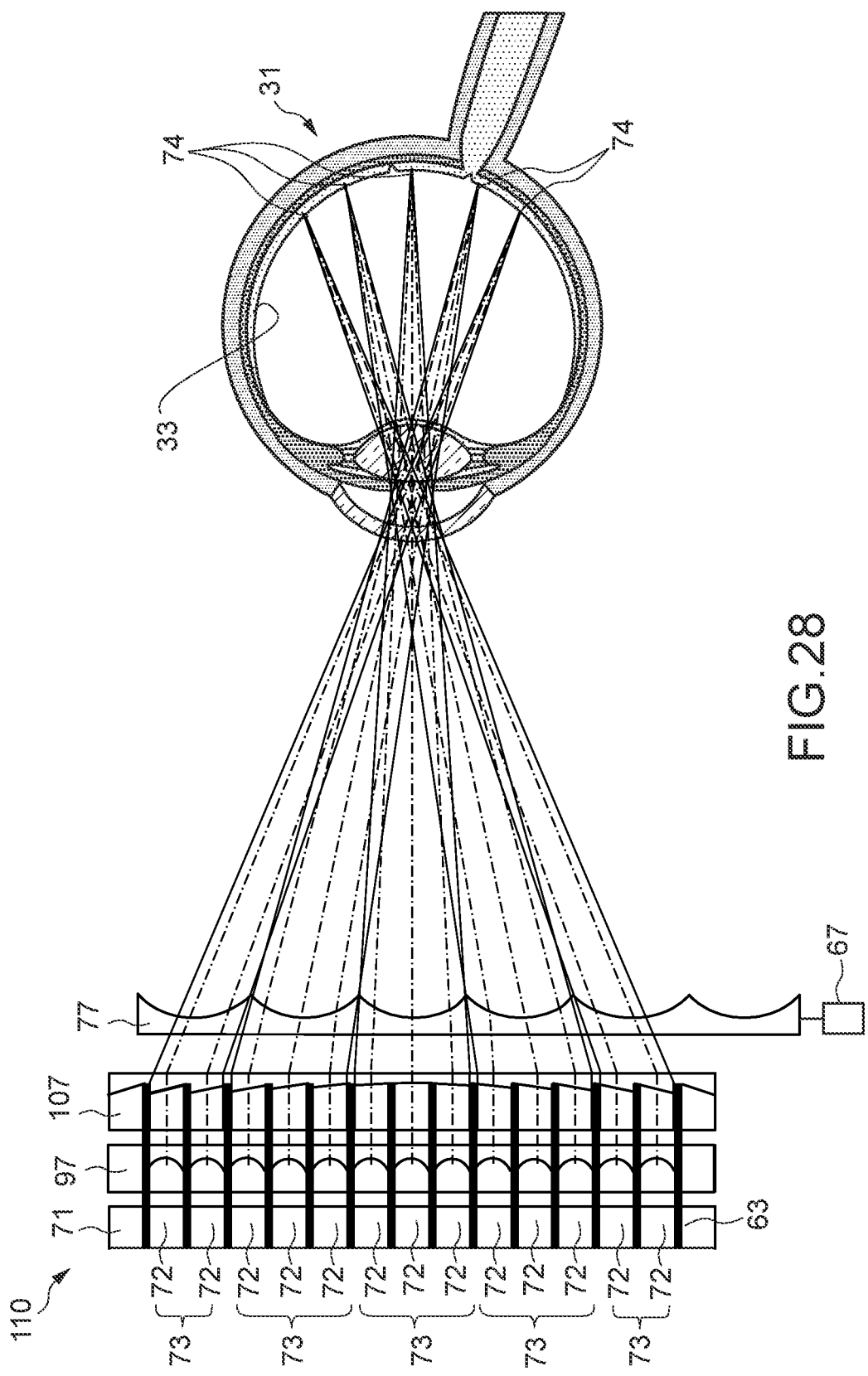
FIG. 28 A configuration diagram of a display apparatus (eyewear) according to an eleventh embodiment.

FIG. 28 is a schematic configuration diagram of a display apparatus 110 applied to an eyewear according to an eleventh embodiment.

As shown in FIG. 28, light rays emitted from the display apparatus 110 are projected onto the retina 33 of the eye 31, and an image is displayed on the retina 33. The display apparatus 110 is configured so that a light-emitting device 71, a collimator lens 97, a Fresnel lens 107, and a micro-lens array 77 constituted by a plurality of micro concave lenses 770 are arranged in the stated order from a position further from the retina 33 to a position closer to the retina 33. In addition, the display apparatus 110 includes an actuator 67 that mechanically scans the micro-lens array 77.

In the present embodiment, the shielding walls 63 are provided in the light-emitting device 71, the collimator lens 97, and the Fresnel lens 107. The light-emitting device 71, the collimator lens 97 and the Fresnel lens 107 are fixed and the micro-lens array 77 is configured to be movable.

Twelfth Embodiment

Figure 29:
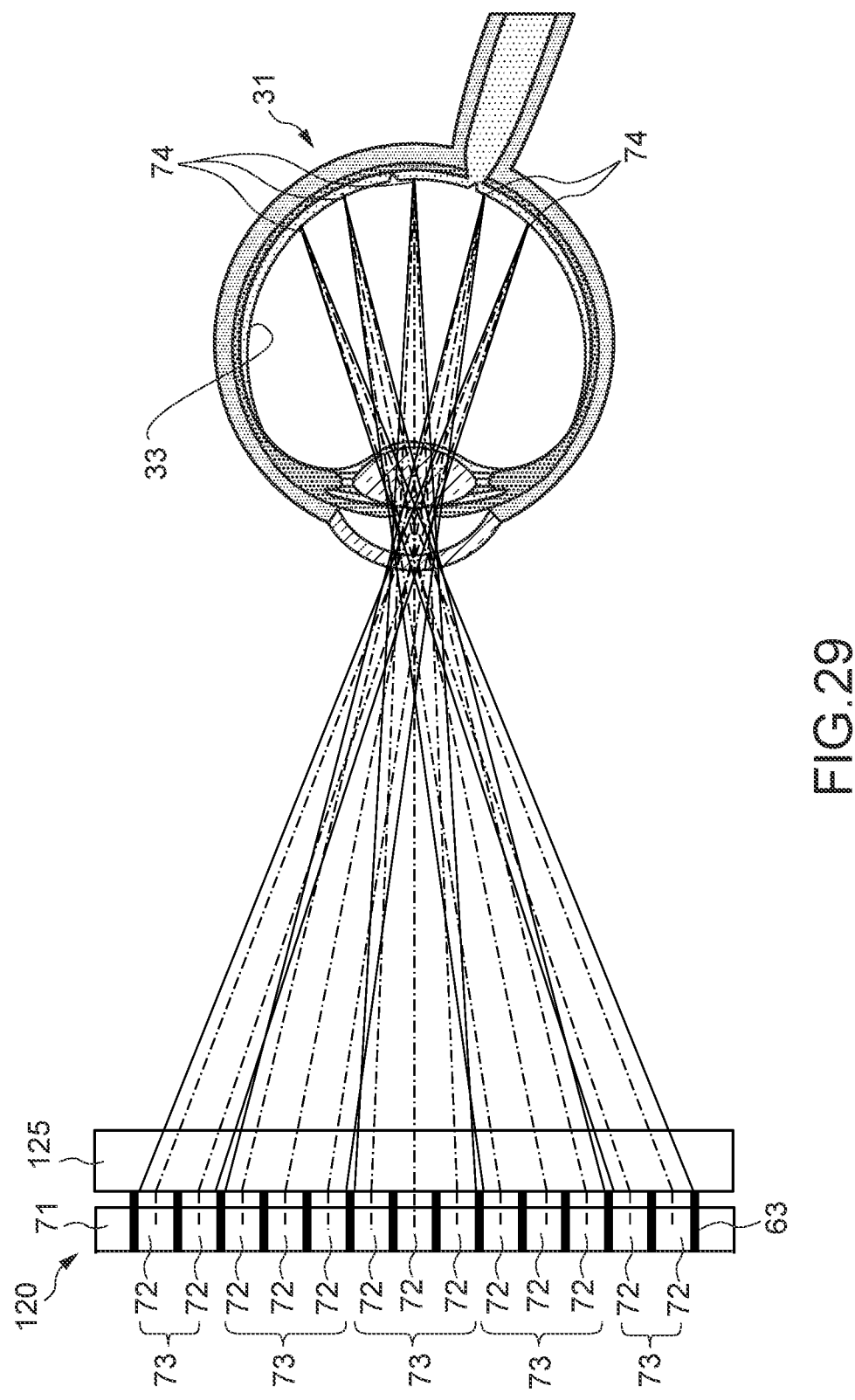
FIG. 29 A configuration diagram of a display apparatus (eyewear) according to a twelfth embodiment.

FIG. 29 is a schematic configuration diagram of a display apparatus 120 applied to an eyewear according to a twelfth embodiment.

As shown in FIG. 29, light rays emitted from the display apparatus 120 are projected onto the retina 33 of the eye 31, and an image is displayed on the retina 33. The display apparatus 120 is configured so that a light-emitting device 71 and a liquid-crystal micro-lens array 125 are arranged in the stated order from a position further from the retina 33 to a position closer to the retina 33.

The liquid-crystal micro-lens array 125 includes liquid-crystal lenses that constitute a plurality of micro convex lenses or concave lenses. The liquid-crystal micro-lens array 125 has a basic configuration similar to that the liquid-crystal micro-lens array 35 described in the above-mentioned third embodiment. The use of the liquid-crystal micro-lens array 125 can provide a function equivalent to the above-mentioned mechanical scan of the micro-lens array shown in each of the above-mentioned seventh to eleventh embodiments without physical movement. That is, the liquid-crystal micro-lens functions as the scanning mechanism and can be said to be a variable optical system. The same applies to a liquid-crystal micro-lens array in each of embodiments to be described later.

The liquid-crystal micro-lens array 125 has a function of the optical system that functions to make light rays from the light-emitting pixel group 73, which is constituted by the plurality of light-emitting pixels 72, parallel or approximately parallel and a function of refraction in the pupil direction in addition to the scan function. It should be noted that the scanning mechanism includes a mechanism that performs a scan so that light rays are made incident on the pupil in accordance with a pupil movement as described above in the seventh embodiment. The same applies to a liquid-crystal micro-lens array in each of embodiments to be described later.

In the present embodiment, the shielding walls 63 are provided in the light-emitting device 71. The light-emitting device 71 and the liquid-crystal micro-lens array 125 are fixed and both are configured not to physically move. In the present embodiment, since the liquid-crystal micro-lens array 125 can also have the functions of the collimator lens and the plano-convex lens, the number of components can be reduced and further downsizing can be achieved.

Thirteen Embodiment

Figure 30:
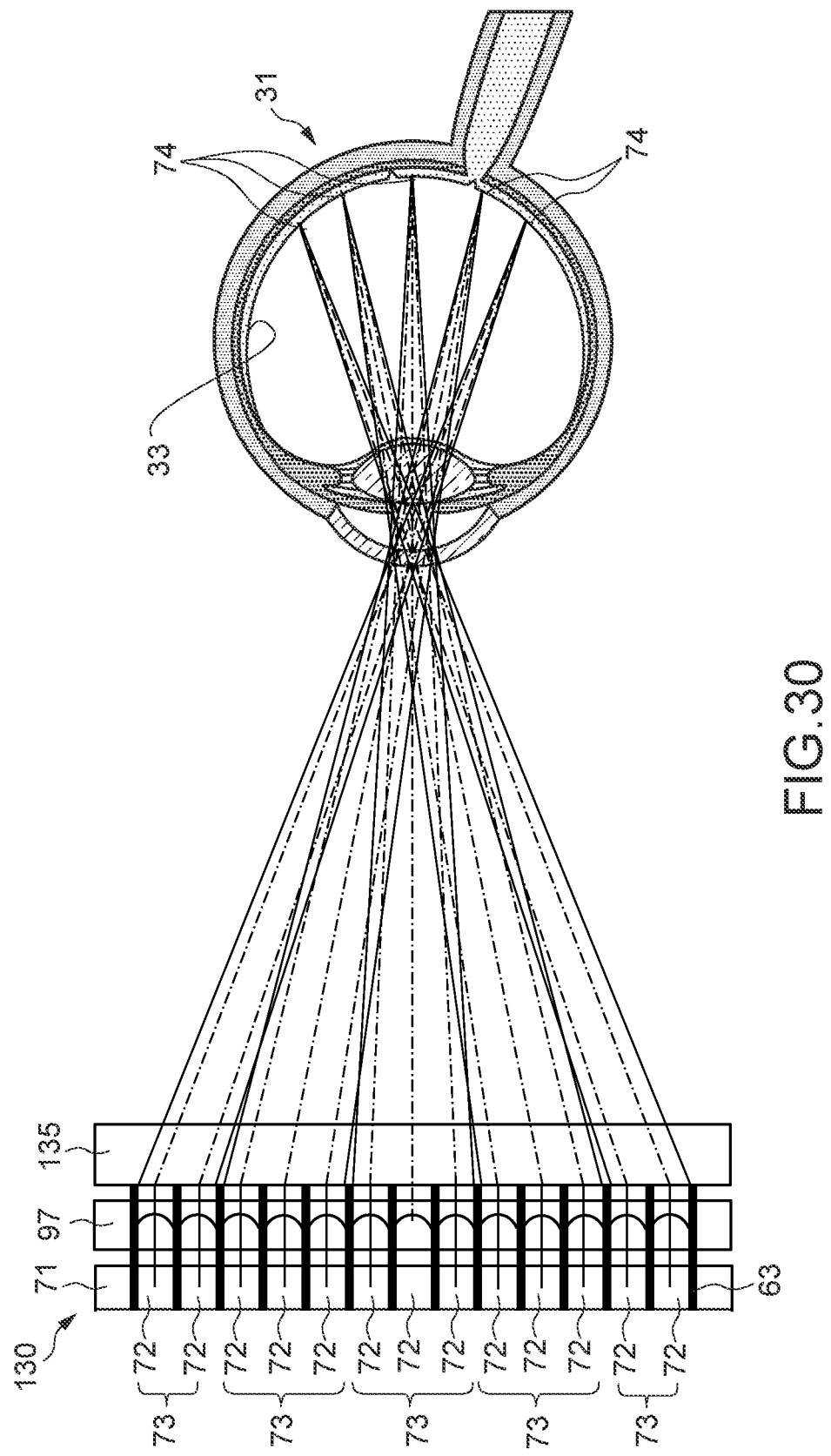
FIG. 30 A configuration diagram of a display apparatus (eyewear) according to a thirteen embodiment.

FIG. 30 is a schematic configuration diagram of a display apparatus 130 applied to an eyewear according to a thirteen embodiment. As shown in FIG. 30, light rays emitted from the display apparatus 130 are projected onto the retina 33 of the eye 31, and an image is displayed on the retina 33. The display apparatus 130 has a configuration in which a collimator lens 97 is arranged between a light-emitting device 71 and a liquid-crystal micro-lens array 135.

The liquid-crystal micro-lens array 135 functions as a scanning mechanism. In addition, the liquid-crystal micro-lens array 135 has a function of the optical system that functions to make light rays from the light-emitting pixel group 73, which is constituted by the plurality of light-emitting pixels 72, parallel or approximately parallel and a function of refraction in the pupil direction in addition to the scan function.

In the present embodiment, the shielding walls 63 are provided in the light-emitting device 71 and the collimator lens 97.

Fourteenth Embodiment

Figure 31:
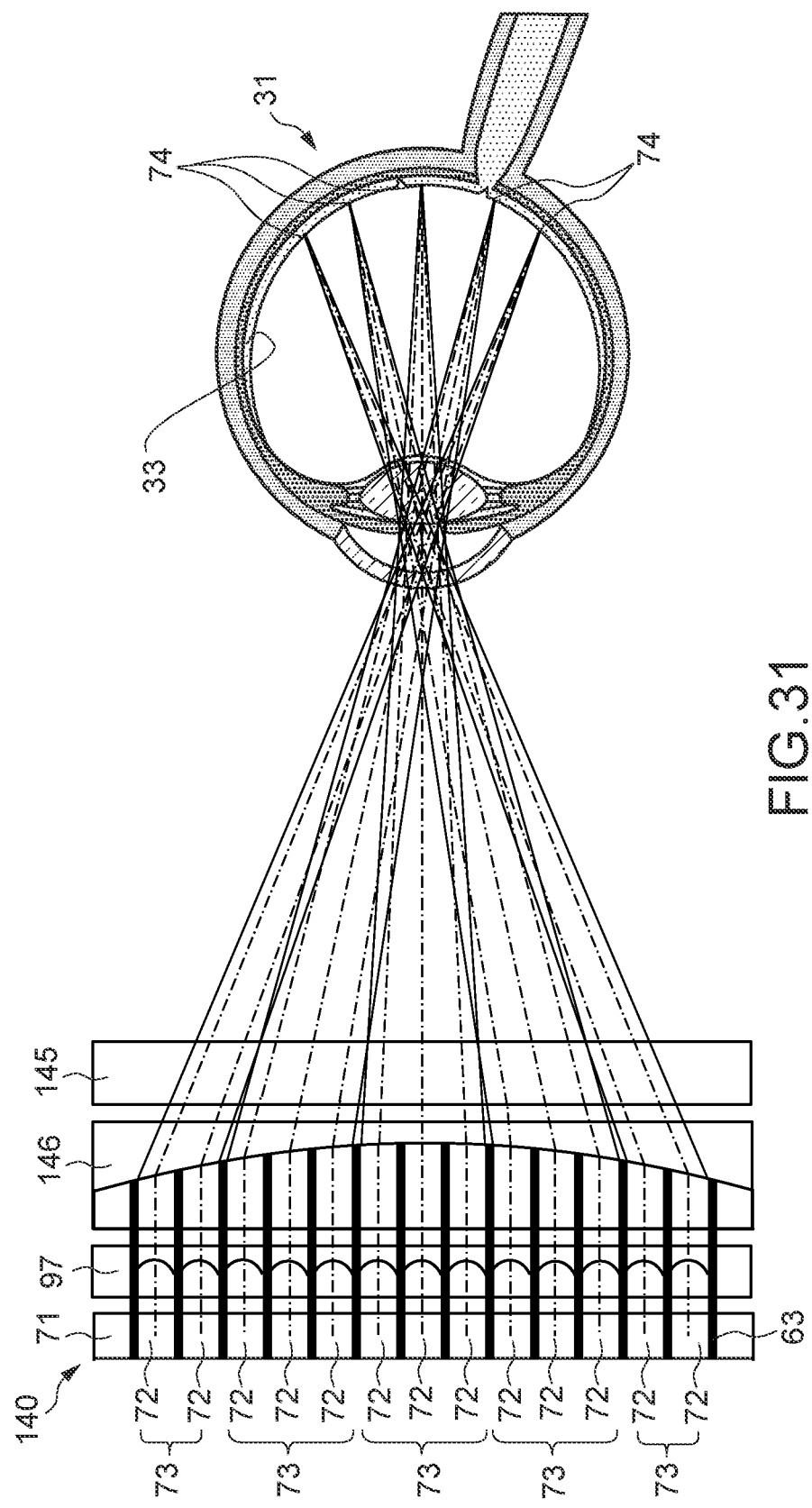
FIG. 31 A configuration diagram of a display apparatus (eyewear) according to a fourteenth embodiment.

FIG. 31 is a schematic configuration diagram of a display apparatus 140 applied to an eyewear according to a fourteenth embodiment. As shown in FIG. 31, light rays emitted from the display apparatus 140 are projected onto the retina 33 of the eye 31, and an image is displayed on the retina 33. The display apparatus 140 is configured so that a light-emitting device 71, a collimator lens 97, a lens 146, and a liquid-crystal micro-lens array 145 are arranged in the stated order from a position further from the retina 33 to a position closer to the retina 33. The lens 146 has a function of a plano-convex lens and is a lens constituted by plane faces in the outer appearance.

The lens 146 is an optical system having a function of bending light rays from the light-emitting pixels 72 in the direction of the pupil.

The liquid-crystal micro-lens array 145 has a function of the optical system that functions to make light rays from the light-emitting pixel group 73, which is constituted by the plurality of light-emitting pixels 72, parallel or approximately parallel in addition to the scanning mechanism function.

In the present embodiment, the shielding walls 63 are provided in the light-emitting device 71, the collimator lens 97, and the lens 146.

Fifteenth Embodiment

Figure 32:
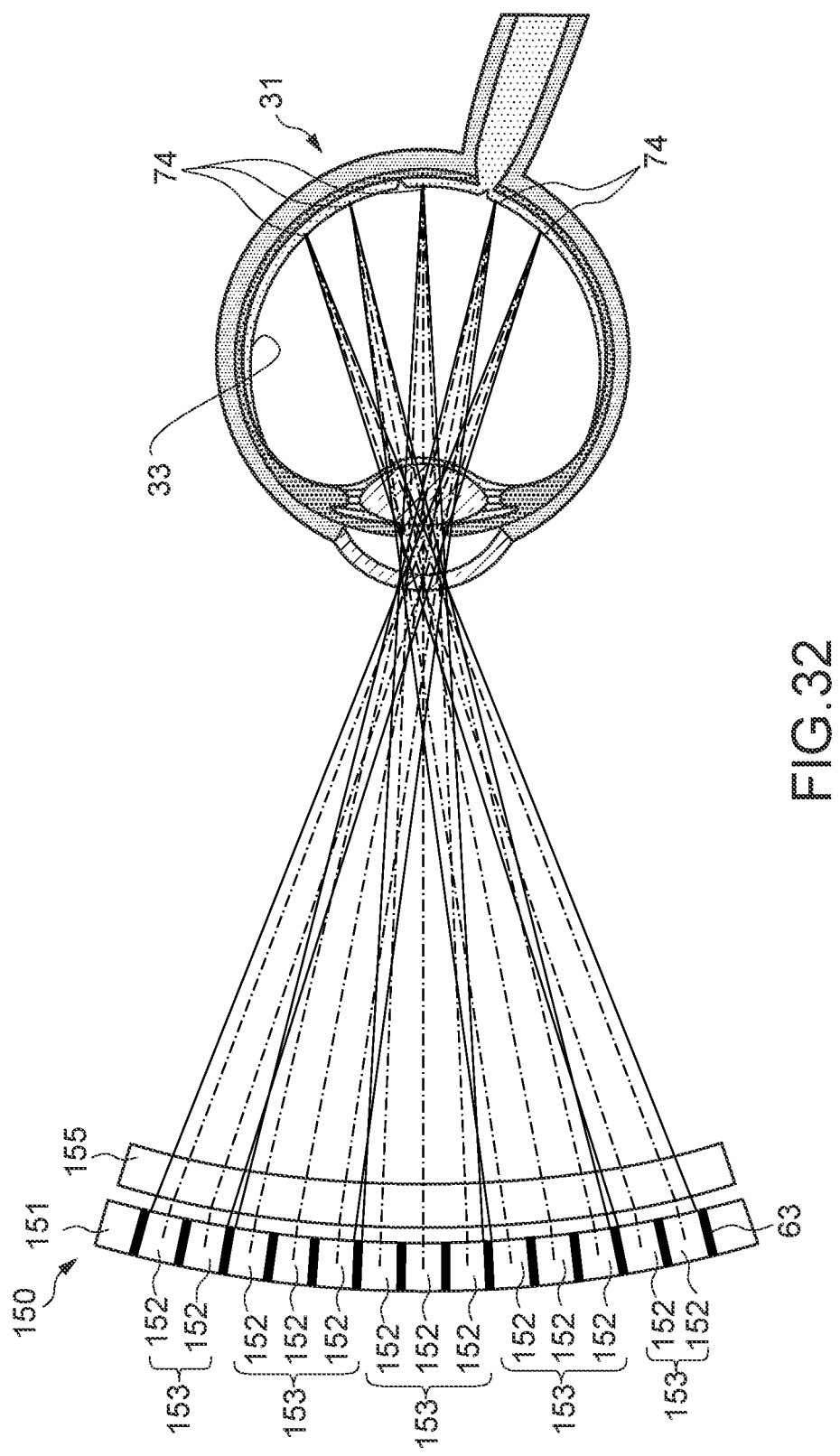
FIG. 32 A configuration diagram of a display apparatus (eyewear) according to a fifteenth embodiment.

FIG. 32 is a schematic configuration diagram of a display apparatus 150 applied to an eyewear according to a fifteenth embodiment. As shown in FIG. 32, light rays emitted from the display apparatus 150 are projected onto the retina 33 of the eye 31, and an image is displayed on the retina 33. The display apparatus 150 has a configuration in which a light-emitting device 151 having a curve face and a liquid-crystal micro-lens array 155 having a curve face are arranged in the stated order from a position further from the retina 33 to a position closer to the retina 33.

The light-emitting device 151 constitutes a plurality of light-emitting pixels 152. The light-emitting pixel group 153 is constituted by a plurality of light-emitting pixels 152 that emits light rays having identical information.

The use of the light-emitting device 151 and the liquid-crystal micro-lens array 155 having the curve faces can make distances of light rays incident on the eye 31 from the display apparatus 150 to the retina 33 substantially uniform in a plane. Accordingly, an image with a further improved quality can be displayed on the retina 33. By configuring the display apparatus 150 and the liquid-crystal micro-lens array 155 using flexible boards, the display apparatus 150 and the liquid-crystal micro-lens array 155 are deformable to have desired curve faces. For example, the display apparatus 150 and the liquid-crystal micro-lens array 155 have curve faces in a shape along a curve face of the eyeball.

The liquid-crystal micro-lens array 155 has a function of the optical system that functions to make light rays from the light-emitting pixel group 153 parallel or approximately parallel and a function of refraction in the pupil direction in addition to the scanning mechanism function.

In the present embodiment, the shielding walls 63 are provided in the light-emitting device 151.

Sixteenth Embodiment

Figure 33:
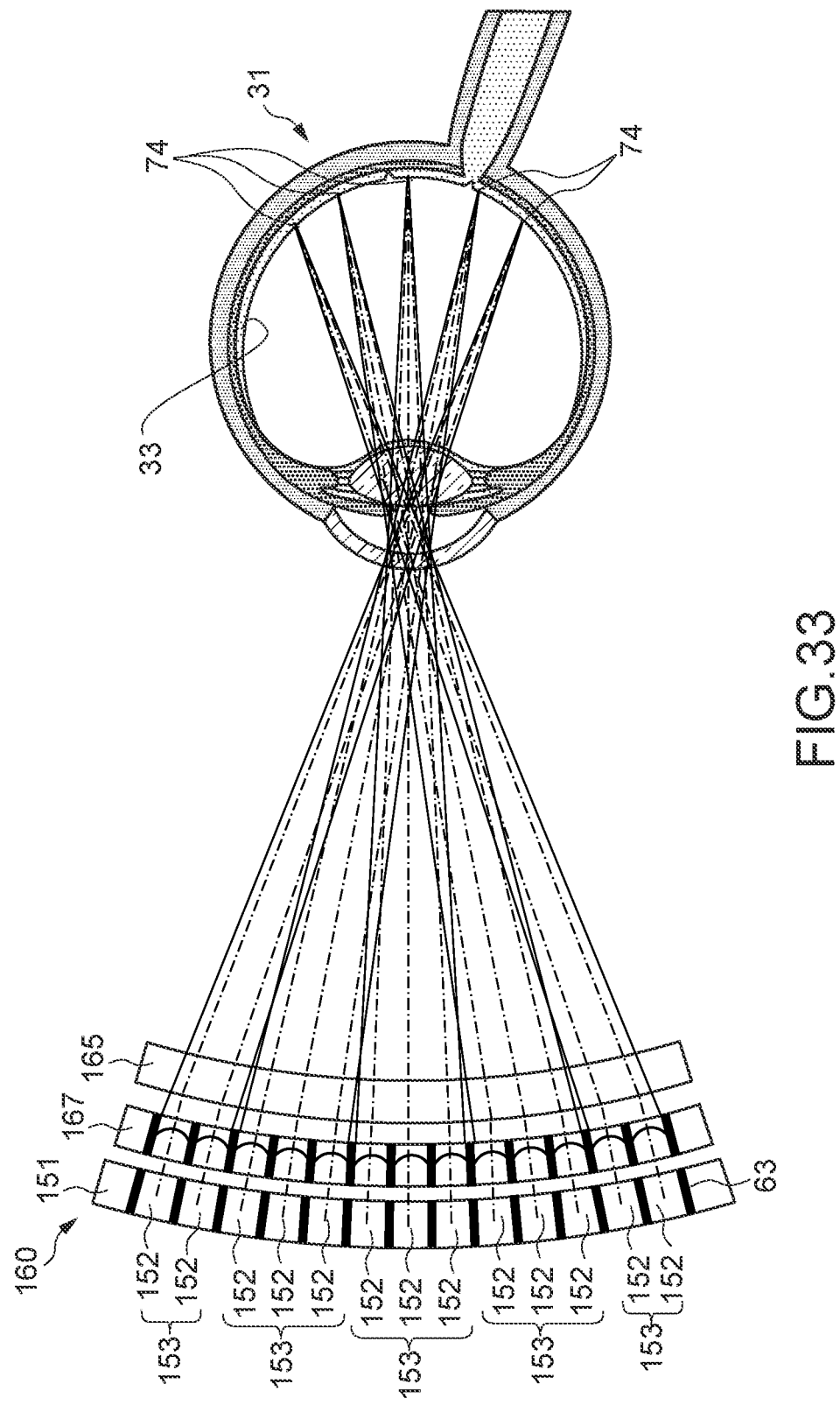
FIG. 33 A configuration diagram of a display apparatus (eyewear) according to a sixteenth embodiment.

FIG. 33 is a schematic configuration diagram of a display apparatus 160 applied to an eyewear according to a sixteenth embodiment. As shown in FIG. 33, light rays emitted from the display apparatus 160 are projected onto the retina 33 of the eye 31, and an image is displayed on the retina 33. The display apparatus 160 has a configuration in which a light-emitting device 151 having a curve face, a collimator lens 167 having a curve face, and a liquid-crystal micro-lens array 165 having a curve face are arranged in the stated order from a position further from the retina 33 to a position closer to the retina 33.

The liquid-crystal micro-lens array 165 has a function of the optical system that functions to make light rays from the light-emitting pixel group 153 parallel or approximately parallel and a function of refraction in the pupil direction in addition to the scanning mechanism function.

In the present embodiment, the shielding walls 63 are provided in the light-emitting device 151 and the collimator lens 167.

Seventeenth Embodiment

Figure 34:
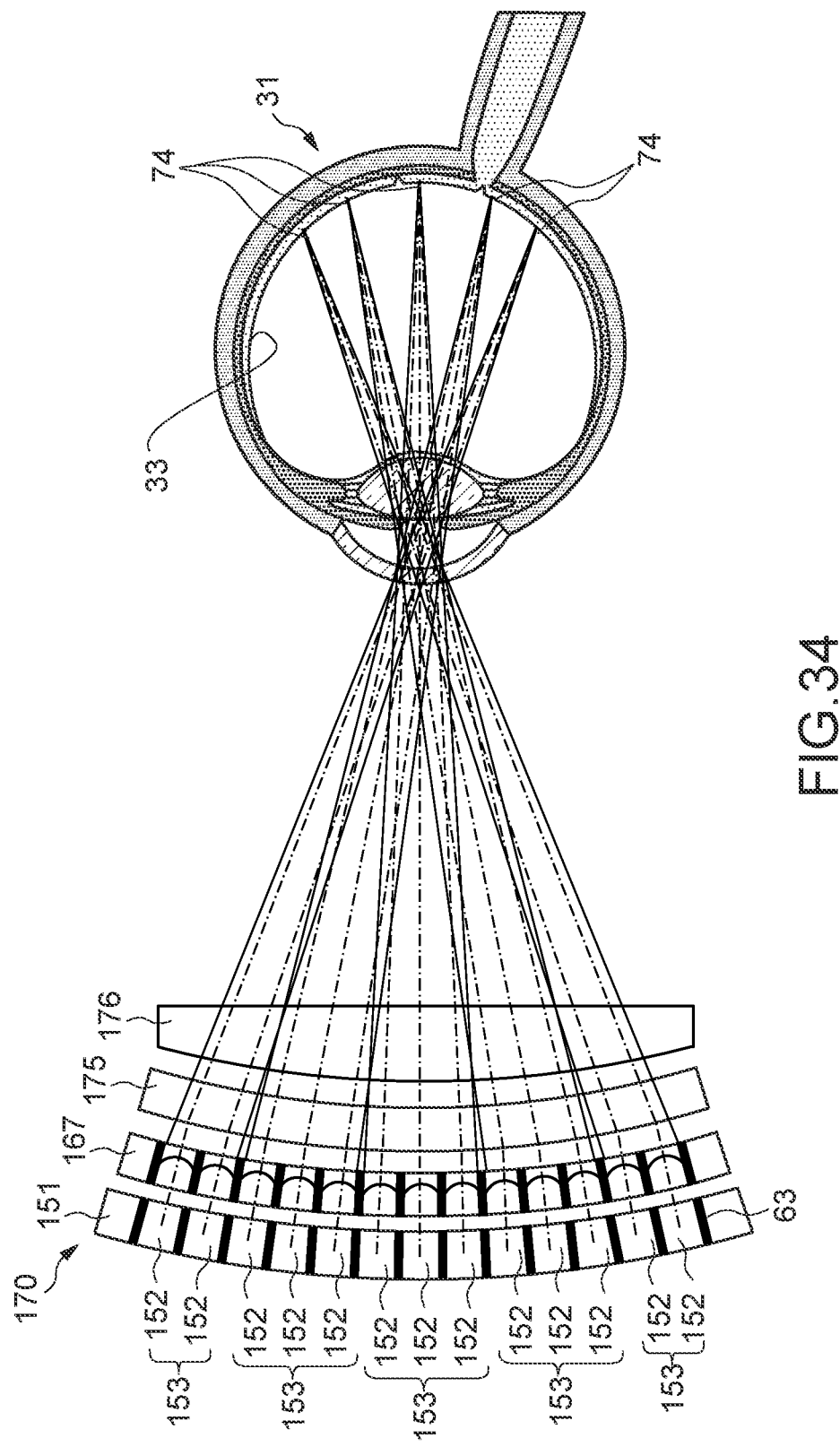
FIG. 34 A configuration diagram of a display apparatus (eyewear) according to a seventeenth embodiment.

FIG. 34 is a schematic configuration diagram of a display apparatus 170 applied to an eyewear according to a seventeenth embodiment. As shown in FIG. 34, light rays emitted from the display apparatus 170 are projected onto the retina 33 of the eye 31, and an image is displayed on the retina 33. The display apparatus 170 has a configuration in which a light-emitting device 151 having a curve face, a collimator lens 167 having a curve face, a liquid-crystal micro-lens array 165 having a curve face, and a plano-convex lens 176 are arranged in the stated order from a position further from the retina 33 to a position closer to the retina 33.

The liquid-crystal micro-lens array 175 has a function of the optical system that functions to make light rays from the light-emitting pixel group 153 parallel or approximately parallel in addition to the scanning mechanism function.

In the present embodiment, the shielding walls 63 are provided in the light-emitting device 151 and the collimator lens 167.

Additional Description

In each of the above-mentioned embodiments, the resolution, motion, and the like of an image to be projected may be controlled by controlling the light-emitting device and the optical system such as the micro-lens array to adjust desired reaching positions of projected light rays on the projection target object, a desired image size on the reaching positions, a desired image scale, or the like.

Accordingly, an image distortion, non-uniformity of the resolution, and non-uniformity of the motion in the projection target object are reduced.

The image distortion refers to a phenomenon where a trapezoidal image or the like is projected onto a screen that is a projection target object through a rectangular image should be projected, for example. It occurs when the display apparatus is positioned tilting from the screen though the display apparatus should be positioned facing the screen straightly. Output information from the light-emitting device or the optical system may be controlled to cancel such an image distortion. The image distortion can be suppressed by, for example, partially scaling the image projected onto the screen (corresponding to the above-mentioned image scale control).

In the display apparatus according to some of the above-mentioned embodiments, the example in which light rays emitted from the light-emitting pixel groups constituted by the plurality of light-emitting pixels that outputs identical information are projected in a time division manner has been described, but the light rays may be configured to be projected at the same time.

Moreover, in the above-mentioned display apparatus according to some of the above-mentioned embodiments, the example in which the number of light-emitting pixels that constitute the light-emitting pixel group does not change has been described, but the number of light-emitting pixels may be configured to change.

Moreover, the number of light-emitting pixel groups that emit light rays at the same time may be configured to temporarily change.

Moreover, the positions, shapes, and sizes of the light-emitting pixel groups in the light-emitting device may be configured to be variable by controlling light rays emitted from the light-emitting pixels or by the optical system adjacent to the light-emitting pixels.

In the above-mentioned embodiments, the light-emitting device with the light-emitting pixels arrayed two-dimensionally has been described as an example of the light-emitting device, but it may be a light-emitting device with light-emitting pixels arrayed one-dimensionally or three-dimensionally.

In the above-mentioned embodiments, one or more cameras or the like that acquire a moving image, a still image, and sound may be installed in the display apparatus. The display apparatus may display an image captured by the camera(s) on the projection target object.

The display apparatus may display an image or information acquired from an external apparatus on the projection target object.

Moreover, the display apparatus may scale and display the image acquired by the installed camera(s) or the image or information acquired from the external apparatus on the projection target object.

Moreover, the display apparatus may change the resolution of the image acquired by the installed camera(s) or the image or information acquired from the external apparatus or process, edit, or modify the contents and may display the image or information on the projection target object.

Moreover, the display apparatus may change the color tone and quality of the image acquired by the installed camera(s) or the image or information acquired from the external apparatus for each region and may display the image or information on the projection target object. Here, the phrase, "each region" refers to each of regions obtained by dividing the image projected onto the projection target object. For example, in order to emphasize and display a partial region of the image projected onto the projection target object, the color tone and quality of such a region is changed.

Moreover, in the display apparatus applied to the eyewear, a configuration to acquire biometric information, for example, estimate close/open and direction of the eye and an eye expression of the user wearing the eyewear from the image information acquired by the installed camera(s) may be employed.

Moreover, as described above, in the display apparatus applied to the eyewear, the light-emitting device and the optical system may be controlled so that light rays are reliably emitted to the pupil on the basis of a sensing result of the pupil motion that is obtained from a sensing device such as the installed camera(s).

For example, an imaging apparatus with a plurality of lenses arranged on one image sensor can be used as a camera to be installed.

As for the display apparatus applied to the eyeglass-type eyewear, for example, the region equivalent to the lens portion of the eyeglasses may be configured to be transmit external light therethrough and a superimposed image in which an image projected from the display apparatus is superimposed on the external landscape may be presented to the user. In addition, the amount of external light that transmits through a region equivalent to the lens portion of the eyeglasses may be configured to be variable manually or automatically.

As for the display apparatus applied to the eyeglass-type eyewear, for example, in a case where the display apparatus is arranged corresponding to the lens portion of the eyeglasses, a configuration in which the lens portion is flipped up may be employed. Accordingly, the user can switch between viewing the external landscape or viewing an image projected from the display apparatus for a short time. Moreover, in an eyewear having such a flip-up function, the lens portion for the left eye and the lens portion for the right eye may be independently flipped up. Accordingly, a wide variety of usages for the eyewear can be provided.

In the display apparatus applied to the eyewear, a sensing device acquires biometric information including iris recognition, a pupil condition, contraction of blood vessels of a fundus oculi, a condition of occurrence, pulse rate, brain waves, and the like of the user may be installed. Moreover, a sensing device such as a microphone that acquires external environment information such as sound may be installed in the display apparatus.

Each of the above-mentioned display apparatuses may be configured to be connectable with a network.

For example, the display apparatus applied to the eyewear may be configured so that information necessary for the user wearing the eyewear is generated using biometric information, environment information, and network information acquired from the above-mentioned sensing devices and the information is presented to the user. The information presentation to the user is not limited to the image information, and may be information about sound, vibration, and the like. The information can be configured to be sensed by the sense of sight, the sense of hearing, and the sense of touch of humans. An information presenting means such as earphones, headphones, and a speaker, for example, can be used for the information presentation associated with the sense of hearing. Vibration, pressure, temperature, or the like, for example, can be used for the information presentation associated with the sense of touch.

For example, the eyeglass-type in the display apparatus applied to the eyewear may be configured to display the user's eye or an image that simulates the eye on the lens portion of the eyeglasses so that it can be visually recognized from the outside. Then, this eye image may be configured to change in accordance with close/open and direction of the eye and an eye expression of the user wearing the eyewear.

Moreover, the display apparatus applied to the eyewear may be configured to display different two-dimensional images depending on a parallax on a display apparatus provided for the right eye and a display apparatus provided for the left eye. Accordingly, a stereoscopic image can be provided to the user. In a case where the camera(s) is installed as described above, cameras are installed for the right eye and the left eye, respectively.

The embodiments of the present technology are not limited to the above-mentioned embodiments, and a variety of modifications can be made without departing from the present technology.

For example, in some of the above-mentioned embodiments, the example in which the micro-lens array is physically scanned in order to increase the image resolution on the projection target object such as the screen and the retina has been described. On the contrary, a chip-like display apparatus in which the light-emitting device is integrated with the optical system including the micro-lens array may be provided for scanning the chip-like display apparatus. This configuration is effective in keeping the position accuracy between the optical system and the light-emitting pixel and can display a high-resolution image stably. For example, the entire chip-like display apparatus is mechanically scanned and output information to the light-emitting pixel is electrically scanned in a direction opposite to that of the mechanical scan of the entire chip-like display apparatus. Accordingly, effects equivalent to those in a case where the optical system is relatively scanned can be provided.

It should be noted that the present technology may also take the following configurations.

(1) A display apparatus, including:
   a light-emitting device including a plurality of first light-emitting pixels and a plurality of second light-emitting pixels;
   a micro-lens array including a plurality of lenses that projects the diffuse light rays emitted respectively from the first light-emitting pixel and the second light-emitting pixel, which have been made incident, to a first reaching position and a second reaching position located at desired different positions of a projection target object, respectively, the plurality of lenses being arranged at a pitch larger than a pixel pitch of the light-emitting pixels; and
   a scanning mechanism for projecting the diffuse light ray emitted from the first light-emitting pixel to the first reaching position via the micro-lens array and then projecting the diffuse light ray emitted from the second light-emitting pixel to the second reaching position via the micro-lens array.

(2) A display apparatus, including:
   a light-emitting device including a plurality of light-emitting pixels;
   a micro-lens array including a plurality of lenses that projects light rays respectively emitted from a first light-emitting pixel group and a second light-emitting pixel group constituted by a plurality of light-emitting pixels selected from the plurality of light-emitting pixels, which have been made incident, to a first reaching position and a second reaching position located at desired different positions of a projection target object, respectively, the plurality of lenses being arranged at a pitch larger than a pixel pitch of the light-emitting pixels; and
   a scanning mechanism for projecting light rays emitted from a plurality of light-emitting pixels that emits light rays of information identical to each other, which constitute the first light-emitting pixel group, to the first reaching position via the micro-lens array and projecting light rays emitted from a plurality of light-emitting pixels that emits light rays of information identical to each other, which constitute the second light-emitting pixel group, to the second reaching position via the micro-lens array.

(3) The display apparatus according to (2), in which the plurality of light-emitting pixels that constitutes the first light-emitting pixel group and the plurality of light-emitting pixels that constitutes the second light-emitting pixel group are partially different.

(4) The display apparatus according to any one of (1) to (3), in which
the micro-lens array is a micro-lens array configured with a plurality of convex or concave lenses arrayed or a liquid-crystal micro-lens array constituted by a plurality of liquid-crystal lenses.

(5) The display apparatus according to (4), in which the micro-lens array is the liquid-crystal micro-lens array, and
the liquid-crystal micro-lens array serves as the scanning mechanism.

(6) The display apparatus according to any one of (1) to (5), in which the projection target object is a screen.

(7) The display apparatus according to any one of (1) to (5), in which
the projection target object is a retina of an eye.

(8) The display apparatus according to (7), in which the light-emitting device emits light rays so that information of light rays to be projected is different at a region of a fovea centralis of the retina and a peripheral portion of the fovea centralis.

REFERENCE SIGNS LIST 1, 21, 51, 61, 71, 151 light-emitting device
2, 22, 52, 62, 72, 152 light-emitting pixel
2A, 62A first light-emitting pixel
2B, 62B second light-emitting pixel
2C, 62C third light-emitting pixel
3 screen (projection target object)
4, 24, 64, 74 reaching position
4A, 24A, 64A, 74A first reaching position
4B, 24B, 64B, 74B second reaching position
4C, 24C, 64C, 74C third reaching position
5, 65, 77 micro-lens array
10, 20, 30, 40, 50, 55 projector (display apparatus)
23, 73, 153 light-emitting pixel group
23A, 73A first light-emitting pixel group
23B, 73B second light-emitting pixel group
23C, 73C third light-emitting pixel group
23D, 73D fourth light-emitting pixel group
24D, 74D fourth reaching position
24E, 74E fifth reaching position
24F, 74F sixth reaching position
24G, 74G seventh reaching position
24H, 74I eighth reaching position
24I, 74I ninth reaching position
33 retina (projection target object)
35, 45, 125, 135, 145, 155, 165, 175 liquid-crystal micro-lens array (micro-lens array, scanning mechanism)
53, 650 convex lens (lens that constitutes micro-lens array)
54, 6 actuator (scanning mechanism)
60, 70, 80, 90, 100, 110, 120, 130, 140, 150, 160, 170 eyewear (display apparatus)
770 concave lens (lens that constitutes micro-lens array)

The invention claimed is:

1. A display apparatus, comprising:
a light-emitting device including a plurality of light-emitting pixels, wherein the plurality of light-emitting pixels comprises a plurality of first light-emitting pixels and a plurality of second light-emitting pixels;
a micro-lens array including a plurality of lenses configured to project diffuse light rays emitted respectively from the plurality of first light-emitting pixels and the plurality of second light-emitting pixels to a first reaching position and a second reaching position located at desired different positions of a projection target object, respectively, wherein
the diffuse light rays are made incident on the plurality of lenses, and
the plurality of lenses is at a pitch larger than a pixel pitch of the plurality of light-emitting pixels; and
a scanning mechanism configured to:
project, at a first time instant, the diffuse light rays emitted from the plurality of first light-emitting pixels to the first reaching position via the micro-lens array; and
project, at a second time instant, the diffuse light rays emitted from the plurality of second light-emitting pixels to the second reaching position via the micro-lens array, wherein
an amount of shift by the scanning mechanism from the plurality of first light-emitting pixels at the first time instant to the plurality of second light-emitting pixels at the second time instant corresponds to the pixel pitch of the plurality of light-emitting pixels.

2. A display apparatus, comprising:
a light-emitting device including a plurality of light-emitting pixels;
a micro-lens array including a plurality of lenses configured to project light rays respectively emitted from a first light-emitting pixel group and a second light-emitting pixel group to a first reaching position and a second reaching position located at desired different positions of a projection target object, respectively, wherein
the first light-emitting pixel group comprises a first set of light-emitting pixels selected from the plurality of light-emitting pixels,
the second light-emitting pixel group comprises a second set of light-emitting pixels selected from the plurality of light-emitting pixels,
the light rays are made incident on the plurality of lenses, and
the plurality of lenses is at a pitch larger than a pixel pitch of the plurality of light-emitting pixels; and
a scanning mechanism configured to:
project, at a first time instant, light rays emitted from the first set of light-emitting pixels, that emits the light rays of identical information, to the first reaching position via the micro-lens array; and
project, at a second time instant, the light rays emitted from the second set of light-emitting pixels, that emits the light rays of the identical information to the second reaching position via the micro-lens array, wherein
an amount of shift by the scanning mechanism from the first set of light-emitting pixels at the first time instant to the second set of light-emitting pixels at the second time instant corresponds to the pixel pitch of the plurality of light-emitting pixels.

3. The display apparatus according to claim 2, wherein the first set of light-emitting pixels that constitutes the first light-emitting pixel group is partially different from the second set of light-emitting pixels that constitutes the second light-emitting pixel group.

4. The display apparatus according to claim 1, wherein the micro-lens array comprises one of a plurality of convex lenses, a plurality of concave lenses, or a liquid-crystal micro-lens array that includes a plurality of liquid-crystal lenses.

5. The display apparatus according to claim 4, wherein
the micro-lens array includes the liquid-crystal micro-lens array, and
the liquid-crystal micro-lens array serves as the scanning mechanism.

6. The display apparatus according to claim 1, wherein the projection target object includes a screen.

7. The display apparatus according to claim 1, wherein the projection target object includes a retina of an eye.

8. The display apparatus according to claim 7, wherein the light-emitting device is configured to emit light rays such that information of the light rays to be projected is different at a region of a fovea centralis of the retina and a peripheral portion of the fovea centralis.

9. The display apparatus according to claim 1, wherein
in a case where the projection target object includes a screen, the pitch of the plurality of lenses of the micro-lens array is more than 50 times and less than 120 times the pixel pitch of the plurality of light-emitting pixels, and
in a case where the projection target object includes a retina of an eye, the pitch of the plurality of lenses of the micro-lens array is more than 240 times and less than 322 times the pixel pitch of the plurality of light-emitting pixels.

10. The display apparatus according to claim 1, further comprising:
one of a concave lens or a plano-convex lens between the micro-lens array and the projection target object; and
a plurality of shielding walls between the plurality of light-emitting pixels.

* * * * *